US011350051B2

(12) United States Patent
Shibuta

(10) Patent No.: US 11,350,051 B2
(45) Date of Patent: May 31, 2022

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventor: Hirokazu Shibuta, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 102 days.

(21) Appl. No.: 16/650,911

(22) PCT Filed: Sep. 26, 2018

(86) PCT No.: PCT/JP2018/035544
§ 371 (c)(1),
(2) Date: Mar. 26, 2020

(87) PCT Pub. No.: WO2019/069752
PCT Pub. Date: Apr. 11, 2019

(65) Prior Publication Data

US 2020/0296314 A1 Sep. 17, 2020

(30) Foreign Application Priority Data

Oct. 4, 2017 (JP) ............................ JP2017-194717

(51) Int. Cl.
*H04N 5/374* (2011.01)
*H01L 27/146* (2006.01)
(Continued)

(52) U.S. Cl.
CPC ..... *H04N 5/37455* (2013.01); *H01L 27/1462* (2013.01); *H01L 27/14612* (2013.01); *H04N 5/3696* (2013.01)

(58) Field of Classification Search
CPC .............. H04N 5/37455; H04N 5/3696; H01L 27/14612; H01L 27/1462; H01L 27/14625;
(Continued)

(56) References Cited

U.S. PATENT DOCUMENTS 6,430,325 B1 8/2002 Shimoda
2003/0026517 A1 2/2003 Shimoda
(Continued)

FOREIGN PATENT DOCUMENTS

CN 1287691 A 3/2001
CN 1519595 A 8/2004
(Continued)

OTHER PUBLICATIONS

International Search Report and Written Opinion of PCT Application No. PCT/JP2018/035544, dated Dec. 11, 2018, 12 pages of ISRWO.

*Primary Examiner* — Abdelaaziz Tissire
(74) *Attorney, Agent, or Firm* — Chip Law Group

(57) ABSTRACT

Providing a solid-state imaging element capable of improving image quality. Provided is a solid-state imaging element at least including: a first electrode, a second electrode, a third electrode, a first photoelectric conversion unit, a second photoelectric conversion unit, a first insulation layer, a second insulation layer, and an optical waveguide. The second electrode, the first photoelectric conversion unit, and the first electrode are disposed in this order. The third electrode is provided away from the first electrode, and faces the first photoelectric conversion unit through the first insulation layer. The second insulation layer is provided between the third electrode and the second photoelectric
(Continued)

conversion unit. The optical waveguide is provided between the third electrode and the second photoelectric conversion unit.

14 Claims, 21 Drawing Sheets

(51) Int. Cl.
*H04N 5/369* (2011.01)
*H04N 5/3745* (2011.01)

(58) Field of Classification Search
CPC . H01L 27/14636; H01L 27/14; H01L 27/146; H01L 27/14629; H01L 27/14627; H01L 27/14607
See application file for complete search history.

(56) References Cited

U.S. PATENT DOCUMENTS

| | | | |
|---|---|---|---|
| 2008/0135732 A1 | 6/2008 | Toumiya et al. | |
| 2009/0065818 A1* | 3/2009 | Anderson | H01L 27/14627 257/291 |
| 2010/0025571 A1 | 2/2010 | Toumiya et al. | |
| 2010/0314704 A1 | 12/2010 | Matsugai | |
| 2011/0248146 A1 | 10/2011 | Toumiya et al. | |
| 2011/0267512 A1 | 11/2011 | Toumiya et al. | |
| 2012/0199893 A1 | 8/2012 | Okabe et al. | |
| 2015/0179700 A1 | 6/2015 | Okabe et al. | |
| 2016/0037098 A1 | 2/2016 | Lee et al. | |
| 2016/0293873 A1* | 10/2016 | Yamaguchi | H04N 5/374 |
| 2018/0374903 A1* | 12/2018 | Otake | H04N 9/07 |

FOREIGN PATENT DOCUMENTS

| | | | | | |
|---|---|---|---|---|---|
| CN | 101197386 | A | | 6/2008 | |
| CN | 101924114 | A | | 12/2010 | |
| CN | 102637708 | A | | 8/2012 | |
| CN | 105244358 | A | | 1/2016 | |
| CN | 106206627 | A | | 12/2016 | |
| EP | 1043780 | A1 | | 10/2000 | |
| EP | 1569280 | A2 | | 8/2005 | |
| EP | 1930950 | A2 | | 6/2008 | |
| JP | 2000-082807 | A | | 3/2000 | |
| JP | 2003-273342 | A | | 9/2003 | |
| JP | 2008-091744 | A | | 4/2008 | |
| JP | 2008091744 | A | * | 4/2008 | |
| JP | 2008-166677 | A | | 7/2008 | |
| JP | 2008-218787 | A | | 9/2008 | |
| JP | 2008218787 | A | * | 9/2008 | |
| JP | 2009-194402 | A | | 8/2009 | |
| JP | 2010-287676 | A | | 12/2010 | |
| JP | 2012-182426 | A | | 9/2012 | |
| JP | 2014-003333 | A | | 1/2014 | |
| JP | 2014-232761 | A | | 12/2014 | |
| JP | 2016-063165 | A | | 4/2016 | |
| JP | 2016063165 | A | * | 4/2016 | |
| KR | 10-0626562 | B1 | | 9/2006 | |
| KR | 10-2008-0053193 | A | | 6/2008 | |
| KR | 10-2016-0017168 | A | | 2/2016 | |
| TW | 434899 | B | | 5/2001 | |
| TW | 200834904 | A | | 8/2008 | |
| WO | 2000/014813 | A1 | | 3/2000 | |
| WO | WO-2017110515 | A1 | * | 6/2017 | H01L 27/14645 |

* cited by examiner 1000-13

SOLID-STATE IMAGING ELEMENT AND ELECTRONIC DEVICE

CROSS REFERENCE TO RELATED APPLICATIONS

This application is a U.S. National Phase of International Patent Application No. PCT/JP2018/035544 filed on Sep. 26, 2018, which claims priority benefit of Japanese Patent Application No. JP 2017-194717 filed in the Japan Patent Office on Oct. 4, 2017. Each of the above-referenced applications is hereby incorporated herein by reference in its entirety.

TECHNICAL FIELD

The present technology relates to a solid-state imaging element and an electronic device.

BACKGROUND ART

Generally, a solid-state imaging element, such as a CMOS (Complementary Metal Oxide Semiconductor) image sensor and a CCD (Charge Coupled Device), is widely used in a digital still camera, a digital video camera, and others.

In recent years, various types of development have been promoted to achieve size reduction and improvement of image quality of a solid-state imaging element.

For example, there has been proposed an image sensor including both a structure which accumulates charges in an organic film and a structure which has a semiconductor layer lying on an insulation film (see PTL 1).

In addition, for example, there has been proposed an imaging element including both a structure which accumulates charges in an organic film and a structure which has a semiconductor layer covering an insulation film (see PTL 2).

CITATION LIST

Patent Literature

[PTL 1]
U.S. Patent Application Publication No. 2016/0037098
[PTL 2]
JP 2016-063165A

SUMMARY

Technical Problem

However, further improvement of image quality may be difficult to achieve even by using the technologies proposed in PTL 1 and PTL 2.

Accordingly, the present technology has been developed in view of the aforementioned circumstances. A primary object of the present technology is to provide a solid-state imaging element capable of improving image quality, and an electronic device including the solid-state imaging element.

Solution to Problem

As a result of intensive studies for achieving the above object, the present inventors have succeeded in dramatical improvement of image quality, and have completed the present technology.

More specifically, initially provided according to the present technology is a solid-state imaging element at least including a first electrode, a second electrode, a third electrode, a first photoelectric conversion unit, a second photoelectric conversion unit, a first insulation layer, a second insulation layer, and an optical waveguide. The second electrode, the first photoelectric conversion unit, and the first electrode are disposed in this order. The third electrode is provided away from the first electrode, and faces the first photoelectric conversion unit through the first insulation layer. The second insulation layer is provided between the third electrode and the second photoelectric conversion unit. The optical waveguide is provided between the third electrode and the second photoelectric conversion unit.

The solid-state imaging element of the present technology may further include at least one semiconductor layer. The at least one semiconductor layer may be provided between the first photoelectric conversion unit and the first insulation layer.

According to the solid-state imaging element of the present technology, the optical waveguide and the second insulation layer may be separated from each other in a substantially perpendicular direction.

The solid-state imaging element of the present technology may further include a low dielectric constant material containing layer. The low dielectric constant material containing layer may be disposed below the optical waveguide and above the second photoelectric conversion unit.

The solid-state imaging element of the present technology may further include an inner lens. The inner lens may be disposed between the first photoelectric conversion unit and the optical waveguide.

According to the solid-state imaging element of the present technology, a refractive index of the optical waveguide may be larger than a refractive index of the second insulation layer.

The optical waveguide included in the solid-state imaging element of the present technology may include SiN.

The optical waveguide included in the solid-state imaging element of the present technology may include siloxane.

The optical waveguide included in the solid-state imaging element of the present technology may include ITO.

The solid-state imaging element of the present technology may include at least one wire that connects to the third electrode. The at least one wire may include a transparent material. The at least one wire and the optical waveguide may be disposed in this order from the light entrance side.

The solid-state imaging element of the present technology may include at least one wire that connects to the third electrode. The at least one wire may include a light shielding material. The at least one wire and the optical waveguide may be separated from each other with the second insulation layer interposed between the at least one wire and the optical waveguide.

The solid-state imaging element of the present technology may further include: at least one pedestal connected to the first electrode and provided between the first electrode and the second photoelectric conversion unit; and a via that connects the first electrode and the at least one pedestal. A first distance between a center of the second photoelectric conversion unit and a center of the via at a center of an angle of view may be different from a second distance between the center of the second photoelectric conversion unit and the center of the via at an end of the angle of view.

The solid-state imaging element may further include: at least one wire connected to the third electrode and provided between the third electrode and the second photoelectric conversion unit; and a contact hole that connects the third electrode and the at least one wire. A third distance between the center of the second photoelectric conversion unit and a center of the contact hole at the center of the angle of view may be different from a fourth distance between the center of the second photoelectric conversion unit and the center of the contact hole at the end of the angle of view.

Further provided according to the present technology is an electronic device including a solid-state imaging element that at least includes a first electrode, a second electrode, a third electrode, a first photoelectric conversion unit, a second photoelectric conversion unit, a first insulation layer, a second insulation layer, and an optical waveguide. The second electrode, the first photoelectric conversion unit, and the first electrode are disposed in this order. The third electrode is provided away from the first electrode, and faces the first photoelectric conversion unit through the first insulation layer. The second insulation layer is provided between the third electrode and the second photoelectric conversion unit. The optical waveguide is provided between the third electrode and the second photoelectric conversion unit.

Advantageous Effect of Invention

According to the present technology, improvement of image quality is achievable. Note that advantageous effects to be produced are not limited to the advantageous effect described herein, but may be any advantageous effects described in the present disclosure.

DESCRIPTION OF EMBODIMENTS

Preferred embodiments for practicing the present technology will be hereinafter described. The embodiments described below are presented as an example of typical embodiments of the present technology. It is not intended, in interpretation of the present technology, that the scope of the present technology is narrowed by these embodiments.

Note that the description will be given in a following order.

1. First embodiment (Example 1 of solid-state imaging element)
2. Second embodiment (Example 2 of solid-state imaging element)
3. Third embodiment (Example 3 of solid-state imaging element)
4. Fourth embodiment (Example 4 of solid-state imaging element)
5. Fifth embodiment (Example 5 of solid-state imaging element)

6. Sixth embodiment (Example 6 of solid-state imaging element)

7. Seventh embodiment (Example of electronic device)

8. Use examples of back-illuminated type solid-state imaging element to which present technology has been applied

1. First Embodiment (Example 1 of Solid-State Imaging Element)

A solid-state imaging element according to a first embodiment of the present technology is a solid-state imaging element which includes at least a first electrode, a second electrode, a third electrode, a first photoelectric conversion unit, a second photoelectric conversion unit, a first insulation layer, a second insulation layer, and an optical waveguide. According to the solid-state imaging element of the first embodiment of the present technology, the second electrode, the first photoelectric conversion unit, and the first electrode are disposed in this order. The third electrode is provided away from the first electrode and faces the first photoelectric conversion unit through the first insulation layer. The second insulation layer is provided between the third electrode and the second photoelectric conversion unit. In addition, the optical waveguide is provided between the third electrode and the second photoelectric conversion unit.

Figure 1:
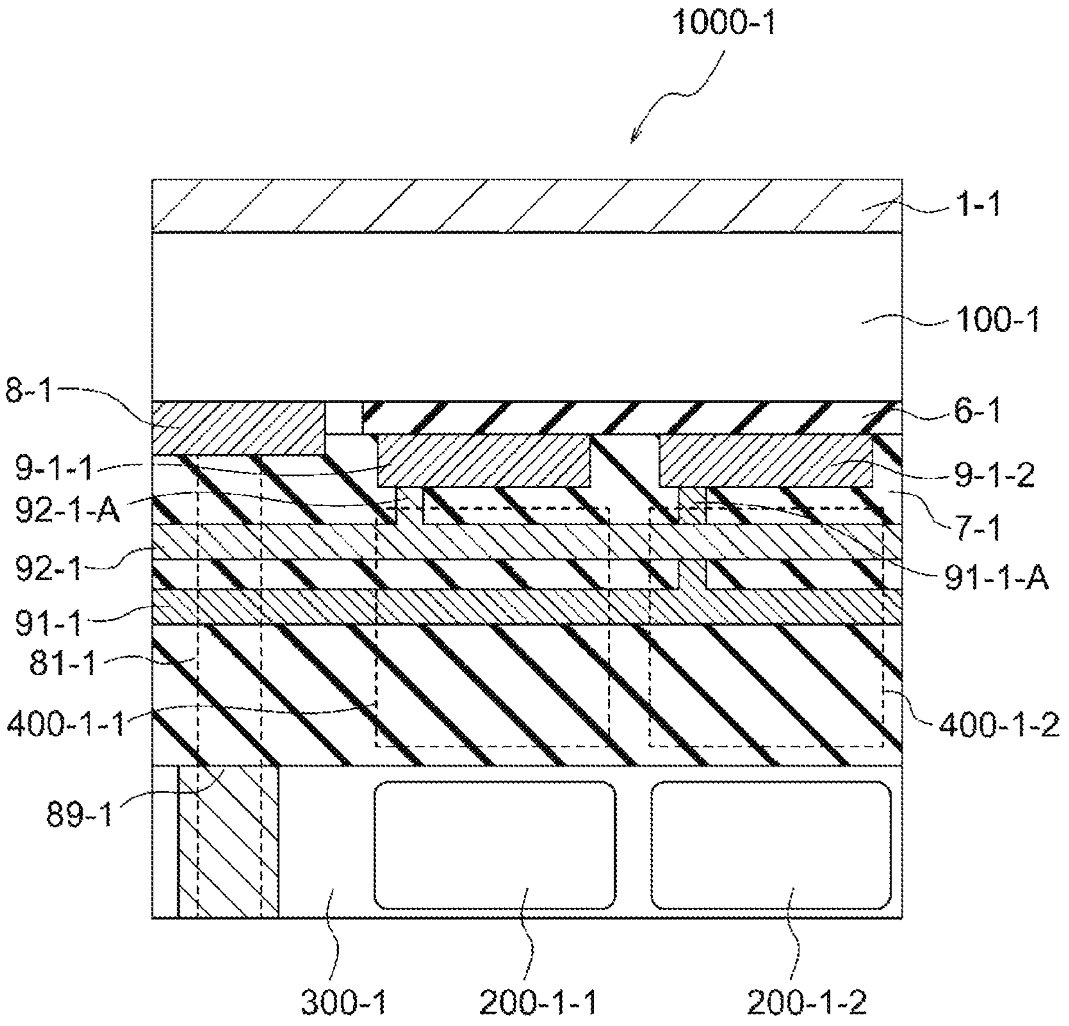
FIG. 1 is a cross-sectional diagram depicting a configuration example of a solid-state imaging element of a first embodiment to which the present technology has been applied.

FIG. 1 depicts a solid-state imaging element 1000 (1000-1 in FIG. 1) which is an example of the solid-state imaging element according to the first embodiment of the present technology. FIG. 1 is a cross-sectional diagram of the solid-state imaging element 1000-1.

The solid-state imaging element 1000-1 includes at least a first electrode 8 (first electrode 8-1 in FIG. 1), a second electrode 1 (second electrode 1-1 in FIG. 1), a third electrode 9 (two third electrodes 9-1-1 and 9-1-2 in FIG. 1), a first photoelectric conversion unit 100 (first photoelectric conversion unit 100-1 in FIG. 1), a second photoelectric conversion unit 200 (two second photoelectric conversion units 200-1-1 and 200-1-2 in FIG. 1), a first insulation layer 6 (first insulation layer 6-1 in FIG. 1), a second insulation layer 7 (second insulation layer 7-1 in FIG. 1), and an optical waveguide 400 (two optical waveguides 400-1-1 and 400-1-2 in FIG. 1).

According to the solid-state imaging element 1000-1, the second electrode 1-1, the first photoelectric conversion unit 100-1, and the first electrode 8-1 are disposed in this order from the light entrance side (the upper side in FIG. 1).

The third electrode 9-1-1 and the third electrode 9-1-2 are provided away from the first electrode 8-1, and faces the first photoelectric conversion unit 100-1 through the first insulation layer 6-1. The third electrode 9-1-1 and the third electrode 9-1-2 are charge accumulation electrodes.

The solid-state imaging element 1000-1 includes the third electrode 9-1-1 and the third electrode 9-1-2 as charge accumulation electrodes. In this case, accumulation of charges of the first photoelectric conversion unit 100-1 is achievable when light is applied to the first photoelectric conversion unit 100-1 for photoelectric conversion at the first photoelectric conversion unit 100-1. Accordingly, elimination of charges is achievable by complete depletion of a charge accumulation unit (first photoelectric conversion unit 100-1) at a start of exposure. As a result, reduction of a phenomenon of an imaging quality drop caused by deterioration of random noise with an increase in kTC noise is achievable. More specifically, when light is applied to the first photoelectric conversion unit 100-1 for photoelectric conversion at the first photoelectric conversion unit 100-1, a type of capacitor is formed by the first photoelectric conversion layer 100-1, the first insulation layer 6-1, and the third electrodes (charge accumulation electrodes) 9-1-1 and 9-1-2. This capacitor can accumulate the charges of the first photoelectric conversion unit 100-1. Accordingly, as described above, charges can be eliminated by complete depletion of the charge accumulation unit at the start of exposure. As a result, reduction of a phenomenon of an imaging quality drop caused by deterioration of random noise with an increase in kTC noise is achievable. Moreover, all pixels can be reset at a time, wherefore what is called a global shutter function can be implemented.

The second insulation layer 7-1 is provided between the third electrodes 9-1-1 and 9-1-2 and the second photoelectric conversion units 200-1-1 and 200-1-2.

The optical waveguides 400-1-1 and 400-1-2 are provided between the third electrodes 9-1-1 and 9-1-2 and the second photoelectric conversion units 200-1-1 and 200-1-2.

In FIG. 1, the first electrode 8-1 is connected to an FD 89-1 through a via 81-1, the third electrode 9-1-1 is connected to a wire 92-1 through a contact hole 92-1-A, and the third electrode 9-1-2 is connected to a wire 91-1 through a contact hole 91-1-A. The wires 91-1 and 92-1 are arranged in parallel in the up-down direction in FIG. 1. The wire 92-1 is disposed on the upper side, while the wire 91-1 is disposed on the lower side. In the present disclosure, the wire on the lower side is referred to as a first wire, while the wire on the upper side is referred to as a second wire. While the solid-state imaging element 1000-1 in FIG. 1 includes two wires of the wire 91-1 and the wire 92-1, the solid-state imaging element 1000-1 may include one wire, or three or more wires. In addition, each of the wire 92-1 and the wire 91-1 may include a transparent material, or a light shielding material.

The first photoelectric conversion unit 100-1 is provided on one surface side of the semiconductor substrate 300-1 (the light entrance side, the upper side in FIG. 1), while the second photoelectric conversion units 200-1-1 and 200-1-2 are embedded in the semiconductor substrate 300-1. In other words, the solid-state imaging element 1000-1 is configured such that the first photoelectric conversion unit 100-1, and the second photoelectric conversion units 200-1-1 and 200-1-2 are disposed in this order from the light entrance side. Accordingly, the solid-state imaging element 1000-1 is configured such that the first photoelectric change unit 100-1 absorbs a first light component (e.g., green light (light in a range of 495 to 570 nm)), and that the second photoelectric conversion units 200-1-1 and 200-1-2 within the semiconductor substrate 300-1 (Si substrate) absorb other light components (blue light (light in a range of 425 to 495 nm) and red light (light in a range of 620 to 750 nm)). Note that each of the second photoelectric conversion units 200-1-1 and 200-1-2 may have a two-layer structure. In this case, each of the second photoelectric conversion unit 200-1-1 of a first layer and the second photoelectric conversion unit 200-1-2 of a first layer may absorb blue light (light in a range of 425 to 495 nm), while the second photoelectric conversion unit 200-1-1 of a second layer and the second photoelectric conversion unit 200-1-2 of a second layer may absorb red light (light in a range of 620 to 750 nm). The first photoelectric conversion unit 100-1 may be made of an organic material, while each of the second photoelectric conversion units 200-1-1 and 200-1-2 may be made of either an organic material or an inorganic material.

Signal charges generated at pixels 2 (2-1 to 2-4) using the first photoelectric conversion unit 100-1 and the second photoelectric conversion units 200-1-1 and 200-1-2 are read by a read-out unit constituted by a plurality of pixel transistors, and processed by a signal processing unit to be output as image data.

According to the solid-state imaging element 1000-1, the optical waveguides 400-1-1 and 400-1-2 are separated from the second insulation layer 7-1 in the vertical direction (up-down direction in FIG. 1). For example, the second insulation layer 7-1 may be constituted by a dielectric having insulation properties, such as a silicon oxide film and TEOS. Note that the first insulation layer 6-1 may be constituted by a dielectric having insulation properties, such as a silicon oxide film and TEOS, similarly to the second insulation layer 7-1.

Each of the optical waveguides 400-1-1 and 400-1-2 having received light entering at various angles through imaging surfaces is capable of reflecting the light on interfaces between the optical waveguides 400-1-1 and 400-1-2 and the second insulation layer 7-1 by utilizing a refractive index difference between the optical waveguides 400-1-1 and 400-1-2 and the second insulation layer 7-1. Accordingly, the optical waveguides 400-1-1 and 400-1-2 can prevent intrusion of light to adjacent pixels.

In the configuration of the solid-state imaging element 1000-1 including the optical waveguides 400-1-1 and 400-1-2 according to the first embodiment of the present technology, intrusion of light to adjacent pixels is prevented by reflection on the interface between the optical waveguide 400-1-1 or the optical waveguide 400-1-2 and the second insulation layer 7-1 as described above. Accordingly, advantageous effects of image quality improvement, particularly improvement of sensitivity, shading, and mixture of colors, are produced.

According to an existing solid-state imaging element which includes an organic photoelectric conversion film as the first photoelectric conversion unit, mixture of colors or shading is likely to occur when the distance between a semiconductor substrate and the organic photoelectric conversion film increases in such a case where incident light obliquely enters pixels, for example. Accordingly, it is preferable that the distance between the semiconductor substrate and the organic photoelectric conversion film of the existing solid-state imaging element is short in view of reduction of mixture of colors and shading. On the other hand, when the distance between the semiconductor substrate and the organic photoelectric conversion film is reduced in the existing solid-state imaging element which includes the organic photoelectric conversion film used as the first photoelectric conversion unit, a parasitic capacitance adhering to a lower electrode as the first electrode reading signal charges from the organic photoelectric conversion film increases. When this parasitic capacitance increases, signals to be obtained when signal charges are read from the organic photoelectric conversion film decrease. As a result, a signal to noise ratio (S/N ratio) of signals read from the organic photoelectric conversion film of the existing solid-state imaging element may decrease.

On the other hand, a dedicated wire for driving the third electrode (charge accumulation electrode) is needed. This necessity increases a film thickness between the third electrode and the Si interface by the presence of the dedicated wire, wherefore optical characteristics such as mixture of colors and shading may be deteriorated.

Meanwhile, according to the solid-state imaging element 1000-1 of the first embodiment, the optical waveguides 400-1-1 and 400-1-2 are provided between the semiconductor substrate 300-1 and the first photoelectric conversion unit 100-1 (e.g., organic photoelectric conversion film or organic photoelectric conversion layer), more specifically, between the third electrodes 9-1-1 and 9-1-2 and the second photoelectric conversion units 200-1-1 and 200-1-2. In this case, advantageous effects of improvement of sensitivity, shading, and mixture of colors are produced. Accordingly, the film thickness between the semiconductor substrate 300-1 and the first photoelectric conversion unit 100-1 need not be reduced, i.e., the film thickness between the third electrodes 9-1-1 and 9-1-2 and the interface of the semiconductor substrate 300-1 of the solid-state imaging element 1000-1 of the first embodiment is allowed to increase using the wires 91-1 and 92-1 for driving the third electrodes 9-1-1 and 9-1-2. In addition, by increasing the film thickness between the semiconductor substrate 300-1 and the first photoelectric conversion unit 100-1, a capacitance between the semiconductor substrate 300-1 and the first electrode 8-1 for the first photoelectric conversion unit 100-1 can be reduced. Accordingly, a conversion efficiency drop and deterioration of random noise (RN) are avoidable.

Furthermore, by introducing the optical waveguides 400-1-1 and 400-1-2 into the solid-state imaging element 1000-1 according to the first embodiment of the present technology, the solid-state imaging element 1000-1 of the first embodiment of the present technology can offer both advantageous effects of improvement of sensitivity, shading, and mixture of colors, and advantageous effects of prevention of a conversion efficiency drop and deterioration of random noise (RN).

It is preferable that the refractive index of each of the optical waveguides 400-1-1 and 400-1-2 is larger than the refractive index of the second insulation layer 7-1. In the preferable mode, intrusion of light to adjacent pixels is further effectively prevented by reflection on the interface between the optical waveguides 400-1-1 and 400-1-2 and the second insulation layer 7-1.

It is preferable that each of the optical waveguides 400-1-1 and 400-1-2 includes SiN. The refractive index of each of the optical waveguides 400-1-1 and 400-1-2 including SiN ranges from 1.8 to 2.1. Accordingly, it is preferable that the second insulation layer 7-1 includes SiO, and that the refractive index of the second insulation layer 7-1 ranges from 1.3 to 1.5, for example. In the preferable mode, intrusion of light to adjacent pixels can be further effectively prevented by reflection on the interface between the optical waveguides 400-1-1 and 400-1-2 and the second insulation layer 7-1.

Materials of the optical waveguides 400-1-1 and 400-1-2 are not specifically limited but may be any materials. Each of the optical waveguides 400-1-1 and 400-1-2 may be made of a low dielectric constant material. Further reduction of the capacitance is achievable in a case where a low dielectric constant material is employed as the materials of the optical waveguides 400-1-1 and 400-1-2. This further reduction of the capacitance contributes to height reduction. Accordingly, the advantageous effects of improvement of sensitivity, mixture of colors, and shading are further produced. It is preferable that the refractive index of the low dielectric constant material is larger than the refractive index of the second insulation layer 7-1, and ranges from 1.6 to 1.8. The dielectric constant of the low dielectric constant material is not particularly limited. However, this constant is preferably in a range of 3.4 to 3.6.

The low dielectric constant material is not particularly limited. For example, this material may be a transparent material such as an SiOC film and an SiOCH film.

It is preferable that each of the optical waveguides 400-1-1 and 400-1-2 is made of a transparent material constituted by ITO (indium tin oxide). When each of the optical waveguides 400-1-1 and 400-1-2 is made of a transparent material constituted by ITO (indium tin oxide), the refractive index of each of the optical waveguides 400-1-1 and 400-1-2 is approximately 1.75.

The thickness between the semiconductor substrate 300-1 and the first photoelectric conversion unit 100-1 is not particularly limited but may be any thickness. However, this thickness is preferably 1.5 μm or smaller.

Each of the optical waveguides 400-1-1 and 400-1-2 may include an organic film. The refractive index of the organic film is not particularly limited. However, this refractive index is preferably in a range of 1.5 to 1.7. The dielectric constant of the organic film is not particularly limited. However, this dielectric constant is preferably in a range of 3.4 to 3.6.

Each of the optical waveguides 400-1-1 and 400-1-2 can be manufactured by a known method. For example, the optical waveguides 400-1-1 and 400-1-2 is manufactured as follows. The second insulation layer 7-1 is flattened, and subsequently portions which will become the optical waveguides 400-1-1 and 400-1-2 are excavated into hole-shaped portions (or cylindrical or frusto-conical portions). A material having a larger refractive index than the refractive index of the second insulation layer 7-1 is embedded into each of the excavated holes. The hole-shaped (or cylindrical or frusto-conical) portions into each of which the material having a large refractive index is embedded become the optical waveguides 400-1-1 and 400-1-2.

Each of the first electrode 8 (first electrode 8-1 in FIG. 1) and the third electrode 9 (two third electrodes 9-1-1 and 9-1-2 in FIG. 1) is preferably a transparent electrode made of a transparent conductive material. The first electrode 8 and the third electrode 9 may be made of either an identical material, or different materials. Each of the first electrode 8 and the third electrode 9 may be formed by sputtering, or chemical vapor deposition (CVD).

Examples of the transparent conductive material include an indium oxide, an indium tin oxide (including ITO, Indium Tim Oxide, Sn-doped $In_2O_3$, crystalline ITO, and amorphous ITO), an indium zinc oxide (IZO, Indium Zinc Oxide) which includes indium as a dopant added to zinc oxide, an indium gallium oxide (IGO) which includes indium as a dopant added to gallium oxide, an indium gallium zinc oxide (IGZO, In—$GaZnO_4$) which includes indium and gallium as dopants added to zinc oxide, an indium tin zinc oxide (ITZO) which includes indium and tin as dopants added to zinc oxide, IFO (F-doped $In_2O_3$), tin oxide ($SnO_2$), ATO (Sb-doped $SnO_2$), FTO (F-doped $SnO_2$), zinc oxide (including ZnO to which another element is doped), an aluminum zinc oxide (AZO) which includes aluminum as a dopant added to zinc oxide, a gallium zinc oxide (GZO) which includes gallium as a dopant added to zinc oxide, titanium oxide ($TiO_2$), niobium titanium oxide (TNO) which includes niobium as a dopant added to titanium oxide, antimony oxide, spinel oxide, and oxide having $YbFe_2O_4$ structure.

The second electrode 1 (second electrode 1-1 in FIG. 1) is constituted by a transparent conductive film or the like, such as an indium tin oxide film and an indium zinc oxide film.

2. Second Embodiment (Example 2 of Solid-State Imaging Element)

A solid-state imaging element according to a second embodiment of the present technology is a solid-state imaging element which includes at least a first electrode, a second electrode, a third electrode, a first photoelectric conversion unit, a second photoelectric conversion unit, a first insulation layer, a second insulation layer, an optical waveguide, and at least one semiconductor layer. According to the solid-state imaging element of the second embodiment of the present technology, the second electrode, the first photoelectric conversion unit, and the first electrode are disposed in this order. The third electrode is provided away from the first electrode and faces the first photoelectric conversion unit through the first insulation layer. The second insulation layer is provided between the third electrode and the second photoelectric conversion unit. In addition, the optical waveguide is provided between the third electrode and the second photoelectric conversion unit. Furthermore, according to the solid-state imaging element of the second embodiment of the present technology, at least one semiconductor layer is provided between the first photoelectric conversion unit and the first insulation layer.

Accordingly, the solid-state imaging element of the second embodiment of the present technology is a solid-state imaging element which includes at least one semiconductor layer added to the solid-state imaging element of the first embodiment. The at least one semiconductor layer is provided between the first photoelectric conversion unit and the first insulation layer.

Figures 4A, 4B, 4C:
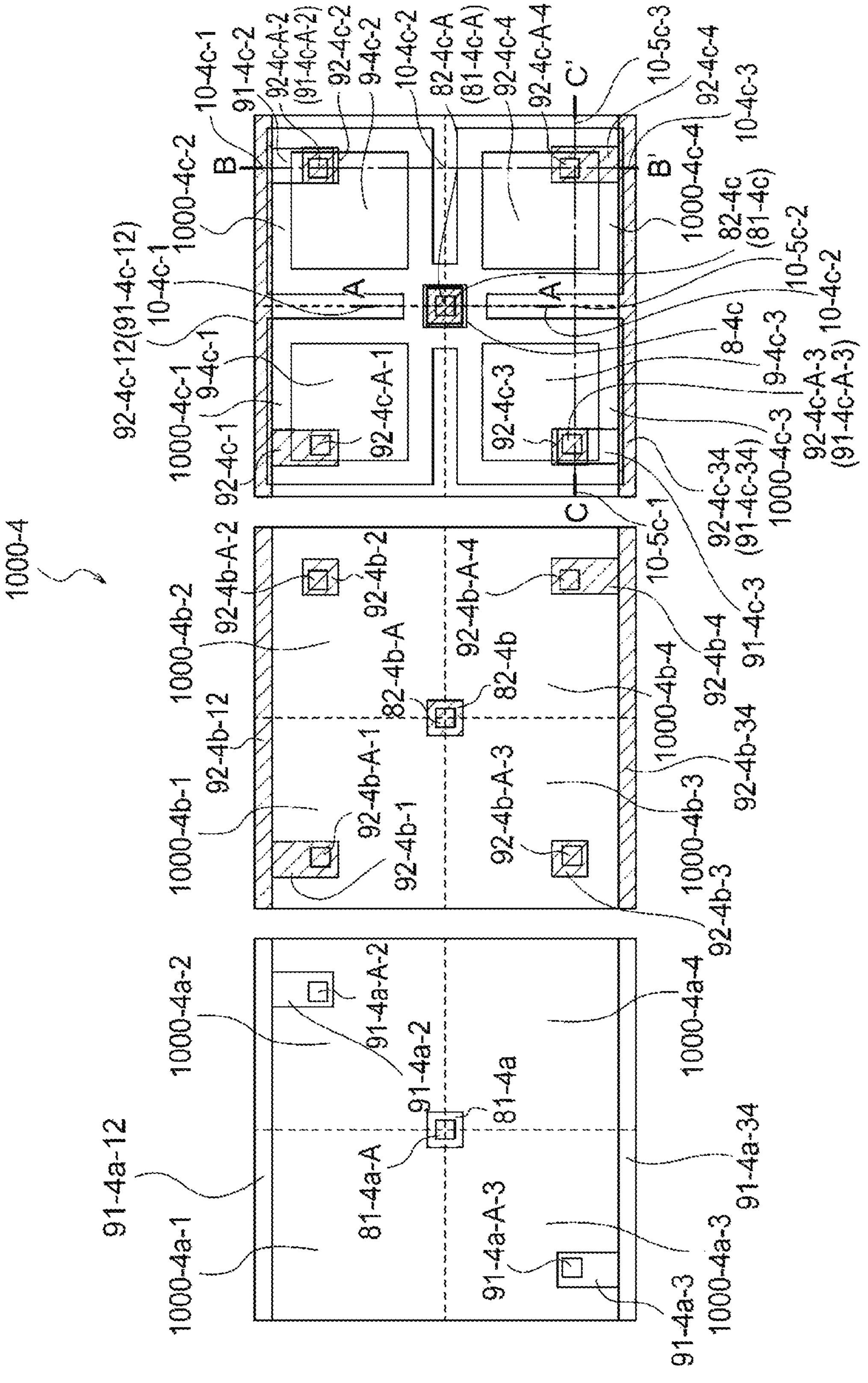
FIGS. 4A, 4B, and 4C illustrate plan diagrams depicting a configuration example of the solid-state imaging element of the second embodiment to which the present technology has been applied.
Figures 5A, 5B, 5C:
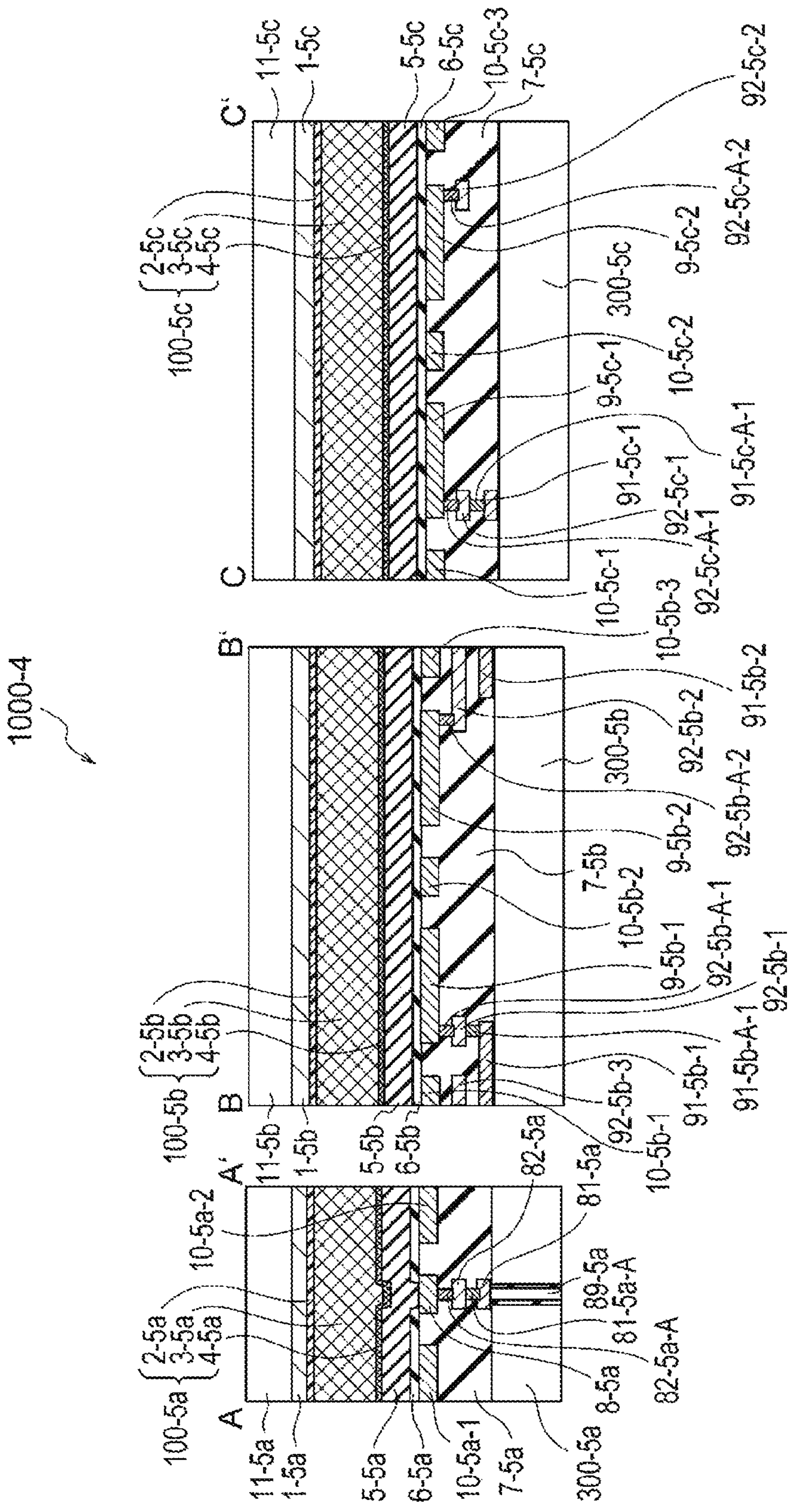
FIGS. 5A, 5B, and 5C illustrate cross-sectional diagrams depicting a configuration example of the solid-state imaging element of the second embodiment to which the present technology has been applied.
Figures 6A, 6B:
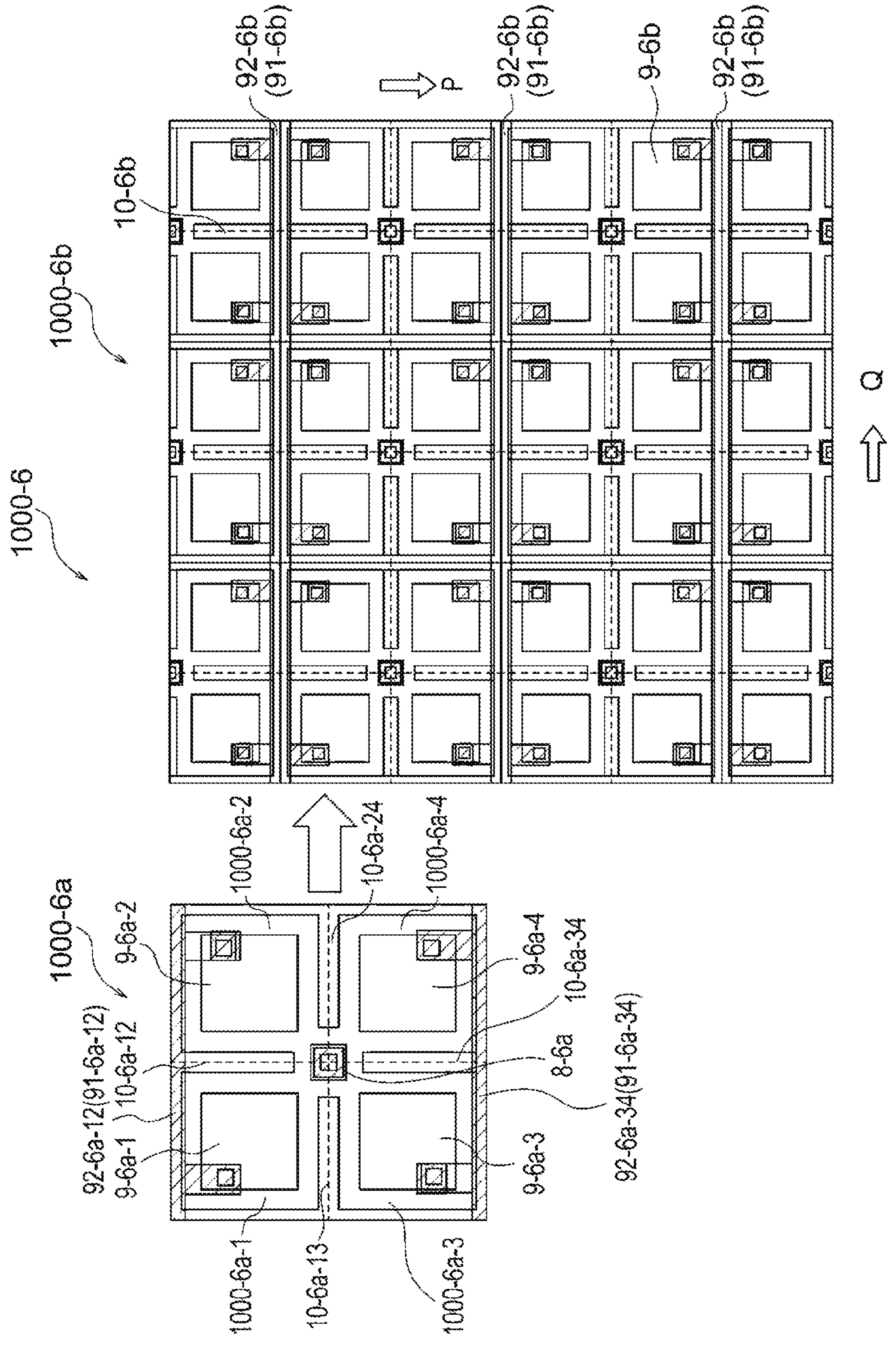
FIGS. 6A and 6B illustrate diagrams depicting array development of pixels of the solid-state imaging element to which the present technology has been applied.

FIGS. 2, 3A, 3B, 4A, 4B, 4C, 5A, 5B, 5C, 6A, 6B, 7A, 7B, 7C, 8A, 8B, and 8C depict solid-state imaging elements 1000-2 to 1000-7 each of which is an example of the solid-state imaging element according to the second embodiment of the present technology. Note that, in the respective figures, FIG. 2 depicts the solid-state imaging element 1000-2, FIGS. 3A and 3B depict the solid-state imaging element 1000-3, FIGS. 4A, 4B, 4C, 5A, 5B, and 5C depict the solid-state imaging element 1000-4, FIGS. 6A and 6B depict the solid-state imaging element 1000-6, and FIGS. 7A, 7B, 7C, 8A, 8B and 8C depict the solid-state imaging element 1000-7.

The solid-state imaging element according to the second embodiment of the present technology will be initially described with reference to FIG. 2. FIG. 2 is a cross-sectional diagram of the solid-state imaging element 1000-2. The solid-state imaging element 1000-2 includes at least a first electrode 8-2, a second electrode 1-2, two third electrodes 9-2-1 and 9-2-2, a first photoelectric conversion unit 100-2, a semiconductor layer 5 (semiconductor layer 5-2 in FIG. 2), four second photoelectric conversion units 200-2-1A, 200-2-1B, 200-2-2A, and 200-2-2B, a first insulation layer 6-2, a second insulation layer 7-2, and an optical waveguide (not depicted in FIG. 2).

Figure 2:
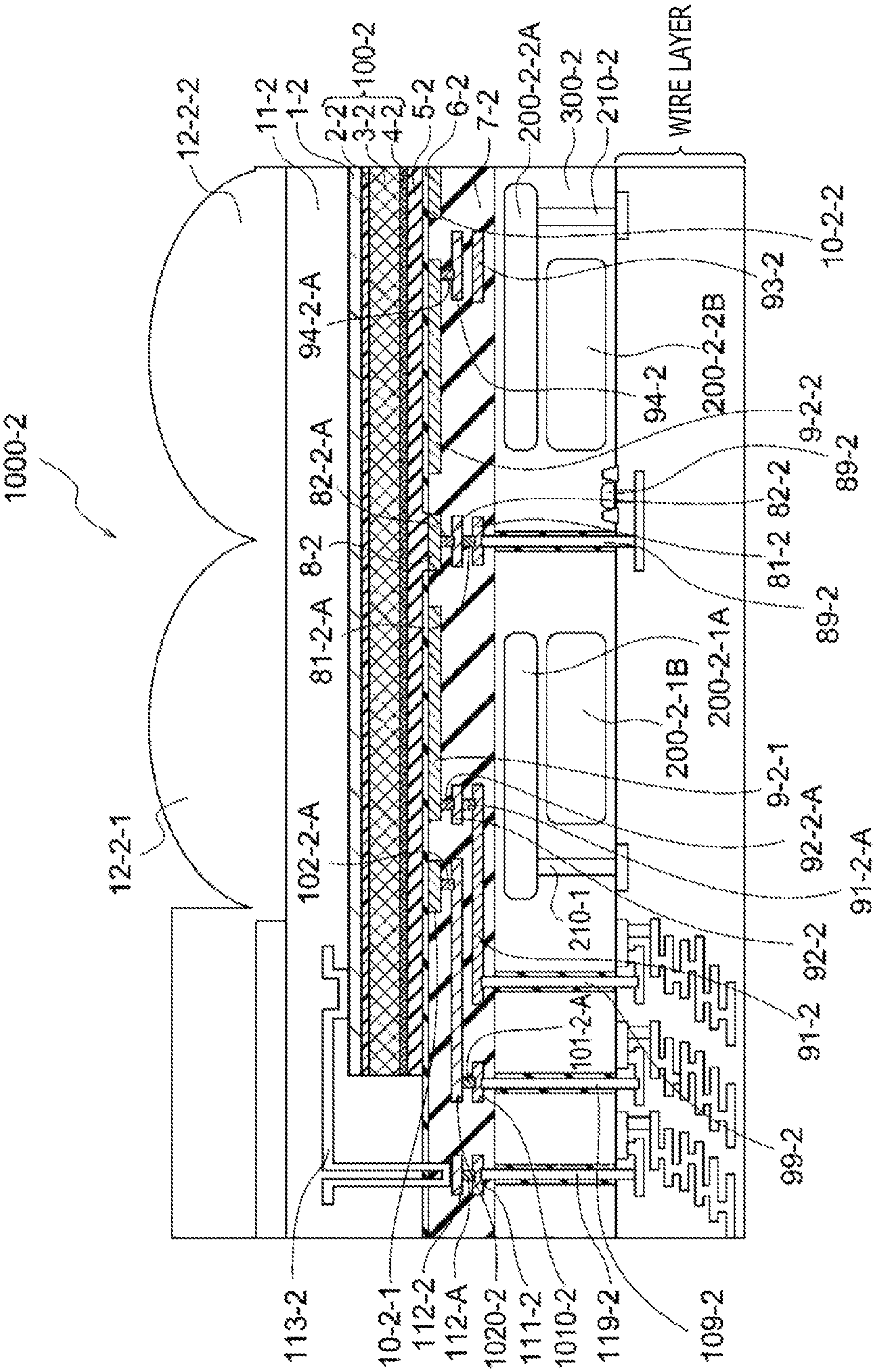
FIG. 2 is a cross-sectional diagram depicting a configuration example of a solid-state imaging element of a second embodiment to which the present technology has been applied.
Figure 3A:
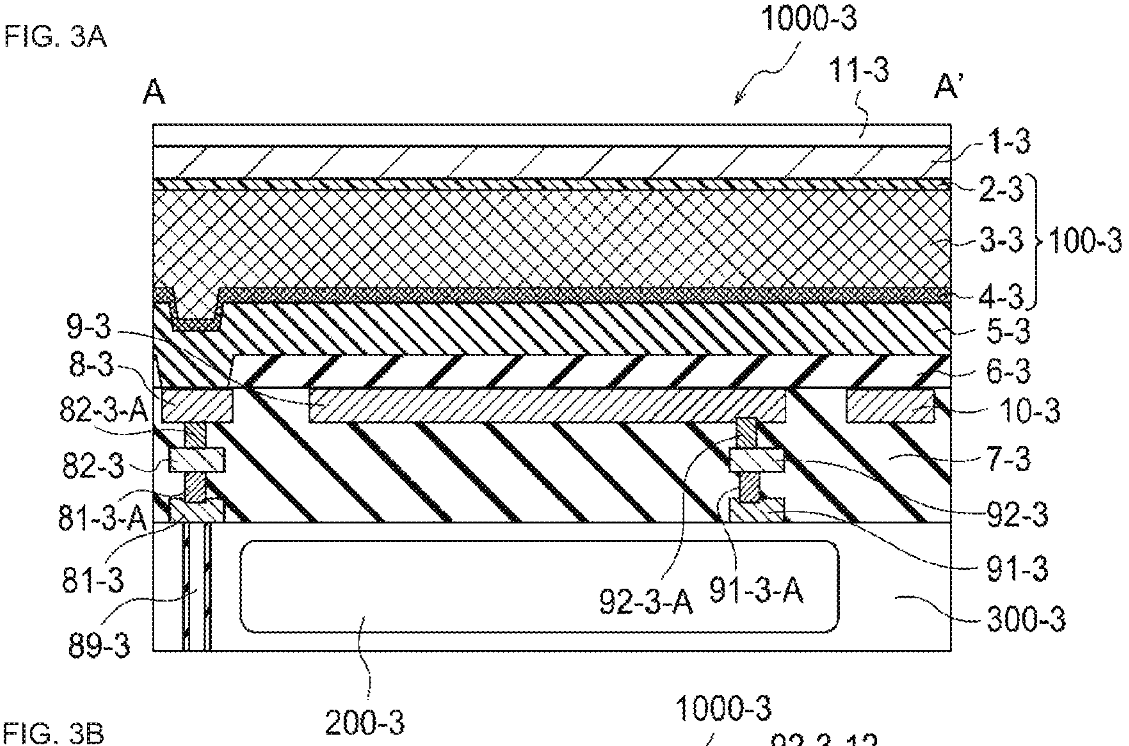
FIGS. 3A and 3B illustrate a cross-sectional diagram and a plan diagram depicting a configuration example of the solid-state imaging element of the second embodiment to which the present technology has been applied.
Figure 3B:
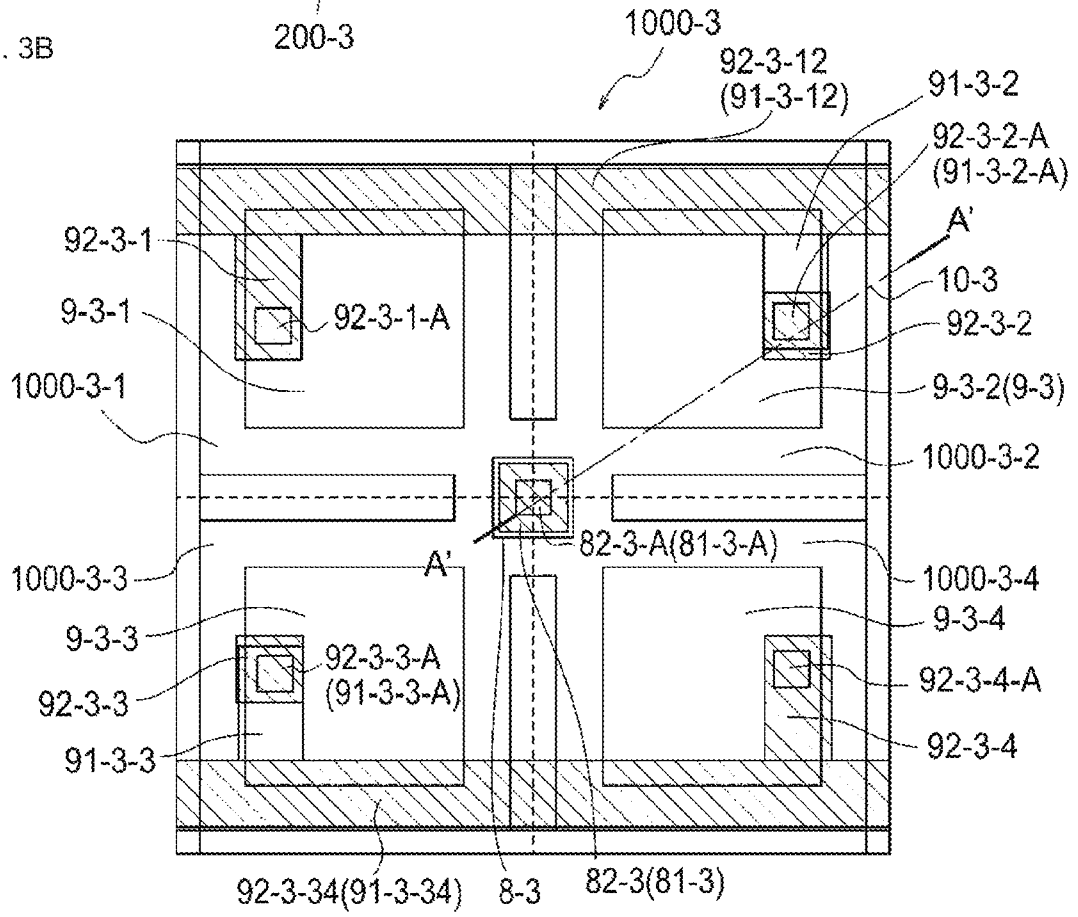

The solid-state imaging element according to the second embodiment of the present technology includes the semiconductor layer 5 (5-2 in FIG. 2). Accordingly, recombination during charge accumulation is avoidable by accumulating charges in the semiconductor layer 5. Specific examples of the material constituting the semiconductor layer include: an oxide semiconductor material such as IGZO; transition metal dichalcogenides; silicon carbide; diamond; graphene; carbon nanotube; and organic semiconductor materials such as a condensed polycyclic hydrocarbon compound and a condensed heterocyclic compound.

The solid-state imaging element 1000-2 includes on-chip lenses 12-2-1 and 12-2-2, a protection layer 11-2, the second electrode 1-2, the first photoelectric conversion unit 100-2, the semiconductor layer 5-2, and the first electrode 8-2 disposed in this order from the light entrance side (the upper side in FIG. 2).

The third electrode 9-2-1 and the third electrode 9-2-2 are provided away from the first electrode 8-2, and faces the first photoelectric conversion unit 100-2 through the first insulation layer 6-2. The third electrode 9-2-1 and the third electrode 9-2-2 are charge accumulation electrodes similarly to the third electrode 9-1-1 and the third electrode 9-1-2 in FIG. 1. The first electrode 8-2, the third electrodes 9-2-1 and 9-2-2, and shields 10-2-1 and 10-2-2 are constituted by an identical layer.

In FIG. 2, the first electrode 8-2 is connected to a second pedestal 82-2 through a via 82-2-A, and the second pedestal 82-2 is connected to a first pedestal 81-2 through a via 81-2-A. Furthermore, the first pedestal 81-2 is connected to a wire layer and an FD 89-2 through a through electrode 89-2. The third electrode 9-2-1 is connected to a second wire 92-2 through a contact hole 92-2-A. The second wire 92-2 is connected to a first wire 91-2 through a contact hole 91-2-A. The wire 91-2 is connected to the wire layer through a through electrode 99-2. The third electrode 9-2-2 is connected to a second wire 94-2 through a contact hole 94-2-A. In FIG. 2, the second wire 94-2 and a first wire 93-2 is not connected to each other.

The shield 10-2-1 is connected to the second wire 1020-2 through a contact hole 102-2-A. The second wire 1020-2 is connected to a first wire 1010-2 through a contact hole 101-2-A. The first wire 1010-2 is connected to the wire layer through the through electrode 109-2. The shield 10-2-2 is not connected to any parts in FIG. 2, but may be connected to the shield 10-2-1. The second electrode 1-2 is connected to a pedestal 112-2 through a wire 113-2. The pedestal 112-2 is connected to a pedestal 111-2 through a via 112-A. The pedestal 111-2 is connected to the wire layer through a through electrode 119-2.

The second insulation layer 7-2 is provided between the third electrodes 9-2-1 and 9-2-2 and the second photoelectric conversion units 200-2-1A and 200-2-2A.

While the optical waveguide is not depicted in FIG. 2, the optical waveguide is provided between the third electrodes 9-2-1 and 9-2-2 and the second photoelectric conversion units 200-2-1A and 200-2-2A.

The first photoelectric conversion unit 100-2 is constituted by a second carrier blocking layer 2-2, a photoelectric conversion layer (e.g., organic photoelectric conversion layer) 3-2, and a first carrier blocking layer 4-2.

The first photoelectric conversion unit 100-2 is provided on one surface side of a semiconductor substrate 300-2 (the light entrance side, the upper side in FIG. 2), while the second photoelectric conversion units 200-2-1A, 200-2-1B, 200-2-2A, and 200-2-2B are embedded in a semiconductor substrate 300-3. The second photoelectric conversion units 200-2-1A and 200-2-1B are laminated in the thickness direction of the semiconductor substrate 300-2, while the second photoelectric conversion units 200-2-2A and 200-2-2B are laminated in the thickness direction of the semiconductor substrate 300-2. In other words, the solid-state imaging element 1000-2 is configured such that the first photoelectric conversion unit 100-2, the second photoelectric conversion units 200-2-1A and 200-2-2A, and the second photoelectric conversion units 200-2-1B and 200-2-2B are disposed in this order from the light entrance side. Accordingly, the solid-state imaging element 1000-2 may be configured such that the first photoelectric change unit 100-2 absorbs light such as green light (light in a range of 495 to 570 nm), that the second photoelectric conversion units 200-2-1A and 200-2-1B absorb light such as blue light (light in a range of 425 to 495 nm), and that the second photoelectric conversion units 200-2-1B and 200-2-2B absorb red light (light in a range of 620 to 750 nm). Each of the second photoelectric conversion units 200-2-1A, 200-2-1B, 200-2-2A, and 200-2-2B is a photodiode, for example. A position of each of these four photodiodes in the depth direction can be set in accordance with a desired color. In addition, the second photoelectric conversion units 200-2-1A and 200-2-2A are connected to gate portions 210-1 and 210-2, respectively, and to the wire layer.

The solid-state imaging element according to the second embodiment of the present technology will be described with reference to FIGS. 3A and 3B. FIG. 3A is a cross-sectional diagram of the solid-state imaging element 1000-3 taken along a line A-A' in FIG. 3B, while FIG. 3B is a diagram depicting a planar layout of four pixels (1000-3-1 to 1000-3-4) of the solid-state imaging element 1000-3 as viewed from the light entrance side.

FIG. 3A will be referred to herein. The solid-state imaging element 1000-3 includes at least a first electrode 8-3, a second electrode 1-3, a third electrode 9-3, a first photoelectric conversion unit 100-3, a semiconductor layer 5-3, a second photoelectric conversion unit 203, a first insulation layer 6-3, a second insulation layer 7-3, and an optical waveguide (not depicted in FIGS. 3A and 3B). Each of the first electrode 8-3 and the third electrode 9-3 may be constituted by a transparent electrode.

The solid-state imaging element 1000-3 includes a protection layer 11-3, the second electrode 1-3, the first photoelectric conversion unit 100-3, the semiconductor layer 5-3, and the first electrode 8-3 disposed in this order from the light entrance side (the upper side in FIGS. 3A and 3B).

The third electrode 9-3 is provided away from the first electrode 8-3, and faces the first photoelectric conversion unit 100-3 through the first insulation layer 6-3. The third electrode 9-3 is a charge accumulation electrode similarly to the third electrode 9-1-1 and the third electrode 9-1-2 in FIG. 1. The first electrode 8-3, the third electrode 9-3, and a shield 10-3 are constituted by an identical layer.

In FIGS. 3A and 3B, the first electrode 8-3 is connected to a second pedestal 82-3 through a via 82-3-A, and the second pedestal 82-3 is connected to a first pedestal 81-3 through a via 81-3-A. Furthermore, the first pedestal 81-3 is connected to a through electrode 89-3. The third electrode 9-3 is connected to a second wire 92-3 through a contact hole 92-3-A. The second wire 92-3 is connected to a first wire 91-3 through a contact hole 91-3-A.

The second insulation layer 7-3 is provided between the third electrode 9-3 and the second photoelectric conversion unit 200-3.

While the optical waveguide is not depicted in FIGS. 3A and 3B, the optical waveguide is provided between the third electrode 9-3 and the second photoelectric conversion unit 200-3.

The first photoelectric conversion unit 100-3 is constituted by a second carrier blocking layer 2-3, a photoelectric conversion layer (e.g., organic photoelectric conversion layer) 3-3, and a first carrier blocking layer 4-3.

The first photoelectric conversion unit 100-3 is provided on one surface side of the semiconductor substrate 300-3 (the light entrance side, the upper side in FIGS. 3A and 3B), while the second photoelectric conversion unit 200-3 is embedded in the semiconductor substrate 300-3. In other words, the solid-state imaging element 1000-3 is configured such that the first photoelectric conversion unit 100-3 and the second photoelectric conversion unit 200-3 are disposed in this order from the light entrance side. Accordingly, the solid-state imaging element 1000-3 is configured such that the first photoelectric change unit 100-3 absorbs a first light component (e.g., green light (light in a range of 495 to 570 nm)), and that the second photoelectric conversion unit 200-3 in the semiconductor substrate 300-3 (Si substrate) absorbs other light components (blue light (light in a range of 425 to 495 nm) and red light (light in a range of 620 to 750 nm)). Note that each of the second photoelectric conversion unit 200-3 may have a two-layer structure. In this case, the second photoelectric conversion unit 200-3 of a first layer may absorb blue light (light in a range of 425 to 495 nm), while the second photoelectric conversion unit 200-3 of a second layer may absorb red light (light in a range of 620 to 750 nm).

FIG. 3B will be referred to herein. FIG. 3B depicts the four pixels 1000-3-1 to 1000-3-4 of the solid-state imaging element 1000-3.

A third electrode 9-3-1 and a second wire 92-3-1 are provided in the pixel 1000-3-1. The third electrode 9-3-1 and the second wire 92-3-1 are connected to each other through a contact hole 92-3-1-A. A third electrode 9-3-2, a first wire 91-3-2, and a second wire 92-3-2 are provided in the pixel 1000-3-2. The first wire 91-3-2 and the second wire 92-3-1 are connected to each other through a contact hole 91-3-2-A. The third electrode 9-3-2 and the second wire 92-3-2 are connected to each other through a contact hole 92-3-2-A. A third electrode 9-3-3, a first wire 91-3-3, and a second wire 92-3-3 are provided in the pixel 1000-3-3. The first wire 91-3-3 and the second wire 92-3-3 are connected to each other through a contact hole 91-3-3-A. The third electrode 9-3-3 and the second wire 92-3-3 through a contact hole 92-3-3-A. A third electrode 9-3-4 and a second wire 92-3-4 are provided in the pixel 1000-3-4. The third electrode 9-3-4 and the second wire 92-3-4 are connected to each other through a contact hole 92-3-4-A.

A second wire 92-3-12 (first wire 91-3-12) is sequentially provided from the light entrance side in upper parts of the pixel 1000-3-1 and the pixel 1000-3-2 (the upper side in FIG. 3B. The second wire 92-3-12 and the second wire 92-3-1 are connected to each other in the pixel 1000-3-1. The first wire 91-3-12 and the first wire 91-3-2 are connected to each other in the pixel 1000-3-2.

A second wire 92-3-34 (first wire 91-3-34) is sequentially provided from the light entrance side in lower parts of the pixel 1000-3-3 and the pixel 1000-3-4 (the lower side in FIG. 3B. The first wire 91-3-34 and the first wire 91-3-3 are connected to each other in the pixel 1000-3-3. The second wire 92-3-34 and the second wire 92-3-4 are connected to each other in the pixel 1000-3-4.

In this manner, the pixel 1000-3-2 can be driven by the first wire 91-3-12 and the first wire 91-3-2, while the pixel 1000-3-3 can be driven by the first wire 91-3-34 and the first wire 91-3-3. In addition, the pixel 1000-3-1 can be driven by the second wire 92-3-12 and the second wire 92-3-1, while the pixel 1000-3-4 can be driven by the second wire 92-3-34 and the second wire 91-3-4. Accordingly, the four pixels (pixel 1000-3-1 to pixel 1000-3-4) can be individually and independently driven.

The first electrode 8-3 is provided as a common component for the four pixels (1000-3-1 to 1000-3-4). The first electrode is connected to the second pedestal 82-3 through the via 82-3-A, and the second pedestal 82-3 is connected to the first pedestal 81-3 through the via 81-3-A in the order from the light entrance side.

The solid-state imaging element 1000-4 according to the second embodiment of the present technology will be described with reference to FIGS. 4A, 4B, and 4C. FIG. 4A is a diagram depicting a planar layout of a first pedestal 81-5*a*, a via 81-5*a*-A, a first wire 91-5*b*-1, a contact hole 91-5*b*-A-1 and the like constituted by an identical layer in four pixels the solid-state imaging element 1000-4 depicted in FIGS. 5A, 5B, and 5C. FIG. 4B is a diagram depicting a planar layout of a second pedestal 82-5*a*, a via 82-5*a*-A, a second wire 92-5*b*-1, a contact hole 92-5*b*-A-1 and the like constituted by an identical layer in four pixels of the solid-state imaging element 1000-4 depicted in FIGS. 5A, 5B, and 5C. FIG. 4C is a diagram depicting a planar layout of a first electrode 8-5*a*, a shield 10-5*a*-1, a third electrode 9-5*b*-1 and the like constituted by an identical layer in four pixels of the solid-state imaging element 1000-4 depicted in FIGS. 5A, 5B, and 5C.

FIG. 4A will be referred to herein. FIG. 4A depicts four pixels 1000-4*a*-1 to 1000-4*a*-4 of the solid-state imaging element 1000-4.

A first wire 91-4*a*-12 is provided on upper parts of the pixel 1000-4*a*-1 and the pixel 1000-4*a*-2 (the upper side in FIG. 4A). The first wire 91-4*a*-12 and a first wire 91-4*a*-2 are connected to each other in the pixel 1000-4*a*-2. A contact hole 91-4*a*-A-2 is connected to the first wire 91-4*a*-2.

A first wire 91-4*a*-34 is provided on lower parts of the pixel 1000-4*a*-3 and the pixel 1000-4*a*-4 (the lower side in FIG. 4A). The first wire 91-4*a*-34 and a first wire 91-4*a*-3 are connected to each other in the pixel 1000-4*a*-3. A contact hole 91-4*a*-A-3 is connected to the first wire 91-4*a*-3.

In this manner, the pixel 1000-4*a*-2 can be driven by the first wire 91-4*a*-12 and the first wire 91-4*a*-2, while the pixel 1000-4*a*-3 can be driven by the first wire 91-4*a*-34 and the first wire 91-4*a*-3. Accordingly, the two pixels (pixel 1000-4*a*-2 and pixel 1000-4*a*-3) can be individually and independently driven.

A first pedestal 81-4*a* and a via 81-4*a*-A connected to the first pedestal 81-4*a* are provided as common components for the four pixels (1000-4*a*-1 to 1000-4*a*-4).

FIG. 4B will be referred to herein. FIG. 4B depicts four pixels 1000-4*b*-1 to 1000-4*b*-4 of the solid-state imaging element 1000-4.

A second wire 92-4*b*-12 is provided on upper parts of the pixel 1000-4*b*-1 and the pixel 1000-4*b*-2 (the upper side in FIG. 4B). The second wire 92-4*b*-12 and a second wire 92-4*b*-1 are connected to each other in the pixel 1000-4*b*-1. A contact hole 92-4*b*-A-1 is connected to the second wire 92-4*b*-1. In addition, a second wire 92-4*b*-2 is connected to a first wire (not depicted) through a contact hole 92-4*b*-A-2 in the pixel 1000-4*b*-2.

A second wire 92-4*b*-34 is provided on lower parts of the pixel 1000-4*b*-3 and the pixel 1000-4*b*-4 (the lower side in FIG. 4B). The second wire 92-4*b*-34 and a second wire 92-4*b*-4 are connected to each other in the pixel 1000-4*b*-4. A contact hole 92-4*b*-A-4 is connected to the second wire 92-4*b*-4. In addition, a second wire 92-4*b*-3 is connected to the first wire (not depicted) through a contact hole 92-4*b*-A-3 in the pixel 1000-4*b*-3.

In this manner, the pixel 1000-4*b*-1 can be driven by the second wire 92-4*b*-12 and the second wire 92-4*b*-1, while the pixel 1000-4*b*-4 can be driven by the second wire 92-4*b*-34 and the second wire 92-4*b*-4. Accordingly, the two pixels (pixel 1000-4*b*-1 and pixel 1000-4*b*-4) can be individually and independently driven.

A second pedestal 82-4*b* and a via 82-4*b*-A connected to the second pedestal 82-4*b* are provided as common components for the four pixels (1000-4*b*-1 to 1000-4*b*-4).

FIG. 4C will be referred to herein. FIG. 4C depicts four pixels 1000-4*c*-1 to 1000-4*c*-4 of the solid-state imaging element 1000-4.

A third electrode 9-4*c*-1 and a second wire 92-4*c*-1 are provided in the pixel 1000-4*c*-1. The third electrode 9-4*c*-1 and a second wire 92-4c-1 are connected to each other through a •BR>Rntact hole 92-4c-1-A-1. A third electrode 9-4c-2, a first wire 91-4c-2, and a second wire 92-4c-2 are provided in the pixel 1000-4c-2. The first wire 91-4c-2 and a second wire 92-4c-1 are connected to each other through a contact hole 91-4c-A-2. The third electrode 9-4c-2 and the second wire 92-4c-2 are connected to each other through a contact hole 92-4c-A-2. A third electrode 9-4c-3, a first wire 91-4c-3, and a second wire 92-4c-3 are provided in the pixel 1000-4c-3. The first wire 91-4c-3 and the second wire 92-4c-3 are connected to each other through a contact hole 91-4c-3-A. The third electrode 9-4c-3 and the second wire 92-4c-3 are connected to each other through a contact hole 92-4c-A-3. A third electrode 9-4c-4 and a second wire 92-4c-4 are provided in the pixel 1000-4c-4. The third electrode 9-4c-4 and the second wire 92-4c-4 are connected to each other through a contact hole 92-4c-A-4.

A second wire 92-4c-12 (first wire 91-4c-12) is sequentially provided from the light entrance side in upper parts of the pixel 1000-4c-1 and the pixel 1000-4c-2 (the upper side in FIG. 4C). The second wire 92-4c-12 and the second wire 92-4c-1 are connected to each other in the pixel 1000-4c-1. The first wire 91-4c-12 and the first wire 91-4c-2 are connected to each other in the pixel 1000-4c-2.

A second wire 92-4c-34 (first wire 91-4c-34) is sequentially provided from the light entrance side in lower parts of the pixel 1000-4c-3 and the pixel 1000-4c-4 (the lower side in FIG. 4C). The first wire 91-4c-34 and the first wire 91-4c-3 are connected to each other in the pixel 1000-4c-3. The second wire 92-4c-34 and the second wire 92-4c-4 are connected to each other in the pixel 1000-4c-4.

In this manner, the pixel 1000-4c-2 can be driven by the first wire 91-4c-12 and the first wire 91-4c-2, while the pixel 1000-4c-3 can be driven by the first wire 91-4c-34 and the first wire 91-4c-3. In addition, the pixel 1000-4c-1 can be driven by the second wires 92-4c-12 and 92-4c-1, while the pixel 1000-3-4 can be driven by the second wire 92-4c-34 and the second wire 92-4c-4. Accordingly, the four pixels (pixel 1000-4c-1 to pixel 1000-4c-4) can be individually and independently driven.

A first electrode 8-4c is provided as a common component for the four pixels (1000-4c-1 to 1000-4c-4). The first electrode is connected to a second pedestal 82-4c through a via 82-4c-A, and the second pedestal 82-4c is connected to a first pedestal 81-4c through a via 81-4c-A in the order from the light entrance side.

The solid-state imaging element 1000-4 according to the second embodiment of the present technology will be described with reference to FIGS. 5A, 5B, and 5C. FIG. 5A is a cross-sectional diagram of the solid-state imaging element 1000-4 taken along a line A-A' in FIG. 4C, FIG. 5B is a cross-sectional diagram of the solid-state imaging element 1000-4 taken along a line B-B' in FIG. 4C, and FIG. 5C is a cross-sectional diagram of the solid-state imaging element 1000-4 taken along a line C-C' in FIG. 4C.

FIG. 5A will be referred to herein. In FIG. 5A, the solid-state imaging element 1000-4 includes at least a first electrode 8-5a, a second electrode 1-5a, a first photoelectric conversion unit 100-5a, a semiconductor layer 5-5a, a first insulation layer 6-5a, and a second insulation layer 7-5a. The first electrode 8-5a may be constituted by a transparent electrode.

The solid-state imaging element 1000-4 includes a protection layer 11-5a, the second electrode 1-5a, the first photoelectric conversion unit 100-5a, the semiconductor layer 5-5a, and the first electrode 8-5a disposed in this order from the light entrance side (the upper side in FIG. 5A). The first electrode 8-5a and two shields 10-5a-1 and 10-5a-2 are constituted by an identical layer.

In FIG. 5A, the first electrode 8-5a is connected to a second pedestal 82-5a through a via 82-5a-A. The second pedestal 82-5a is connected to a first pedestal 81-5a through a via 81-5a-A. Furthermore, the first pedestal 81-5a is connected to a through electrode 89-5a.

The first photoelectric conversion unit 100-5a is constituted by a second carrier blocking layer 2-5a, a photoelectric conversion layer (e.g., organic photoelectric conversion layer) 3-5a, and a first carrier blocking layer 4-5a.

The first photoelectric conversion unit 100-5a is provided on one surface side of a semiconductor substrate 300-5a (the light entrance side, the upper side in FIG. 5A).

FIG. 5B will be referred to herein. In FIG. 5B, the solid-state imaging element 1000-4 includes at least shields 10-5b-1 to 10-5b-3, a second electrode 1-5b, third electrodes 9-5b-1 and 9-5b-2, a first photoelectric conversion unit 100-5b, a semiconductor layer 5-5b, a first insulation layer 6-5b, a second insulation layer 7-5b, and an optical waveguide (not depicted in FIG. 5B). Each of the third electrodes 9-5b-1 and 9-5b-2 may be constituted by a transparent electrode.

The solid-state imaging element 1000-4 includes a protection layer 11-5b, the second electrode 1-5b, the first photoelectric conversion unit 100-5b, the semiconductor layer 5-5b, and the shields 10-5b-1 to 10-5b-3 disposed in this order from the light entrance side (the upper side in FIG. 5B).

The third electrodes 9-5b-1 and 9-5b-2 are provided away from a first electrode (not depicted), and faces the first photoelectric conversion unit 100-5b through the first insulation layer 6-5b. Each of the third electrodes 9-5b-1 and 9-5b-2 is a charge accumulation electrode similarly to the third electrodes 9-1-1 and 9-1-2 in FIG. 1. The third electrodes 9-5b-1 and 9-5b-2, and the shields 10-5b-1, 10-5b-2, and 10-5b-3 are constituted by an identical layer.

In FIG. 5B, the third electrode 9-5b-1 is connected to the second wire 92-5b-1 through the contact hole 92-5b-A-1, while the second wire 92-5b-1 is connected to the first wire 91-5b-1 through the contact hole 91-5b-A-1. The third electrode 9-5b-2 is connected to a second wire 92-5b-2 through a contact hole 92-5b-A-2. A first wire 91-5b-2 and a second wire 92-5b-3 correspond to a first wire 91-6b and a second wire 92-6b depicted in FIG. 6B, respectively, and are wires provided between two pixels adjacent to each other in the column direction (a P direction in FIG. 6B). In addition, the second wire 92-5b-1, the second wire 92-5b-2, and the second wire 92-5b-3 are constituted by an identical layer, while the first wire 91-5b-1 and the first wire 91-5b-2 are constituted by an identical layer.

The second insulation layer 7-5b is provided between the third electrodes 9-5b-1 and 9-5b-2 and a semiconductor substrate 300-5b.

While the optical waveguide is not depicted in FIG. 5B, the optical waveguide may be provided between the third electrodes 9-5b-1 and 9-5b-2 and the semiconductor substrate 300-5b.

The first photoelectric conversion unit 100-5b is constituted by a second carrier blocking layer 2-5b, a photoelectric conversion layer (e.g., organic photoelectric conversion layer) 3-5b, and a first carrier blocking layer 4-5b.

The first photoelectric conversion unit 100-5b is provided on one surface side of the semiconductor substrate 300-5b (the light entrance side, the upper side in FIG. 5B).

FIG. 5C will be referred to herein. In FIG. 5C, the solid-state imaging element 1000-4 includes at least shields

**10-5*c*-1 to 10-5*c*-3, a second electrode 1-5*c*, third electrodes 9-5*c*-1 and 9-5*c*-2, a first photoelectric conversion unit 100-5*c*, a semiconductor layer 5-5*c*, a first insulation layer 6-5*c*, a second insulation layer 7-5*c*, and an optical waveguide (not depicted in FIG. 5C). Each of the third electrodes 9-5*c*-1 and 9-5*c*-2** may be constituted by a transparent electrode.

The solid-state imaging element 1000-4 includes a protection layer **11-5*c*, the second electrode 1-5*c*, the first photoelectric conversion unit 100-5*c*, the semiconductor layer 5-5*c*, and the shields 10-5*c*-1 to 10-5*c*-3 disposed in this order from the light entrance side (the upper side in FIG. 5**C).

The third electrodes **9-5*c*-1 and 9-5*c*-2 are provided away from a first electrode (not depicted), and faces the first photoelectric conversion unit 100-5*c* through the first insulation layer 6-5*c*. Each of the third electrodes 9-5*c*-1 and 9-5*c*-2 is a charge accumulation electrode similarly to the third electrodes 9-1-1 and 9-1-2 in FIG. 1. The third electrodes 9-5*c*-1 and 9-5*c*-2, and the shields 10-5*c*-1, 10-5*c*-2, and 10-5*c*-3** are constituted by an identical layer.

In FIG. 5C, the third electrode **9-5*c*-1 is connected to a second wire 92-5*c*-1 through a contact hole 92-5*c*-A-1, while the second wire 92-5*c*-1 is connected to the first wire 91-5*c*-1 through a contact hole 91-5*c*-A-1. The third electrode 9-5*c*-2 is connected to the second wire 92-5*c*-2 through a contact hole 92-5*c*-A-2. In addition, the second wire 92-5*c*-1 and the second wire 92-5*c*-2** are constituted by an identical layer.

The second insulation layer **7-5*c* is provided between the third electrodes 9-5*c*-1 and 9-5*c*-2 and a semiconductor substrate 300-5*c***.

While the optical waveguide is not depicted in FIG. 5C, the optical waveguide may be provided between the third electrodes **9-5*c*-1 and 9-5*c*-2 and the semiconductor substrate 300-5*c***.

The first photoelectric conversion unit **100-5*c* is constituted by a second carrier blocking layer 2-5*c*, a photoelectric conversion layer (e.g., organic photoelectric conversion layer) 3-5*c*, and a first carrier blocking layer 4-5*c***.

The first photoelectric conversion unit **100-5*c* is provided on one surface side of the semiconductor substrate 300-5*c* (the light entrance side, the upper side in FIG. 5**C).

The solid-state imaging element 1000-6 according to the second embodiment of the present technology will be described with reference to FIGS. 6A and 6B. FIG. 6A is a diagram depicting a planar layout of four pixels (**1000-6*a*-1 to 1000-6*a*-4) of a solid-state imaging element 1000-6*a* as viewed from the light entrance side. FIG. 6B is a diagram depicting a solid-state imaging element 1000-6*b* in an array development state of the four pixels of the solid-state imaging element 1000-6*a***.

FIG. 6A will be referred to herein. FIG. 6A depicts the four pixels **1000-6*a*-1 to 1000-6*a*-4 of the solid-state imaging element 1000-6*a***.

The third electrode 9-3-1 is provided in the pixel 1000-3-1. The third electrode 9-3-2 is provided in the pixel 1000-3-2. The third electrode 9-3-3 is provided in the pixel 1000-3-3. The third electrode 9-3-4 is provided in the pixel 1000-3-4.

A second wire **92-6*a*-12 (first wire 91-3-12) is sequentially provided from the light entrance side in the pixel 1000-3-1 and the pixel 1000-3-2. In addition, a shield 10-6*a*-12 is provided between the pixel 1000-3-1 and the pixel 1000-3-2. Moreover, a second wire 92-3-34 (first wire 91-3-34) is sequentially provided from the light entrance side in the pixel 1000-3-3 and the pixel 1000-3-4. Furthermore, a shield 10-6*a*-34 is provided between the pixel 1000-3-3 and the pixel 1000-3-4**.

FIG. 6B will be referred to herein. The solid-state imaging element **1000-6*b* is provided as a pixel array which includes a plurality of sets of four pixels of the solid-state imaging element 1000-6*a* depicted in FIG. 6A in each of a row direction (a Q direction) and a column direction (the P direction) in a two-dimensional form, in a repetitive unit of the four pixels of the solid-state imaging element 1000-6*a* depicted in FIG. 6A. In the solid-state imaging element 1000-6*b*, the first wire 91-6*b* and the second wire 92-6*b* are routed entirely in the Q direction in such a manner as to connect to a plurality of the third electrodes 9-6*b*. In addition, a shield 10-6*b*** extends in a grid shape between a plurality of pixels.

Figures 7A, 7B, 7C:
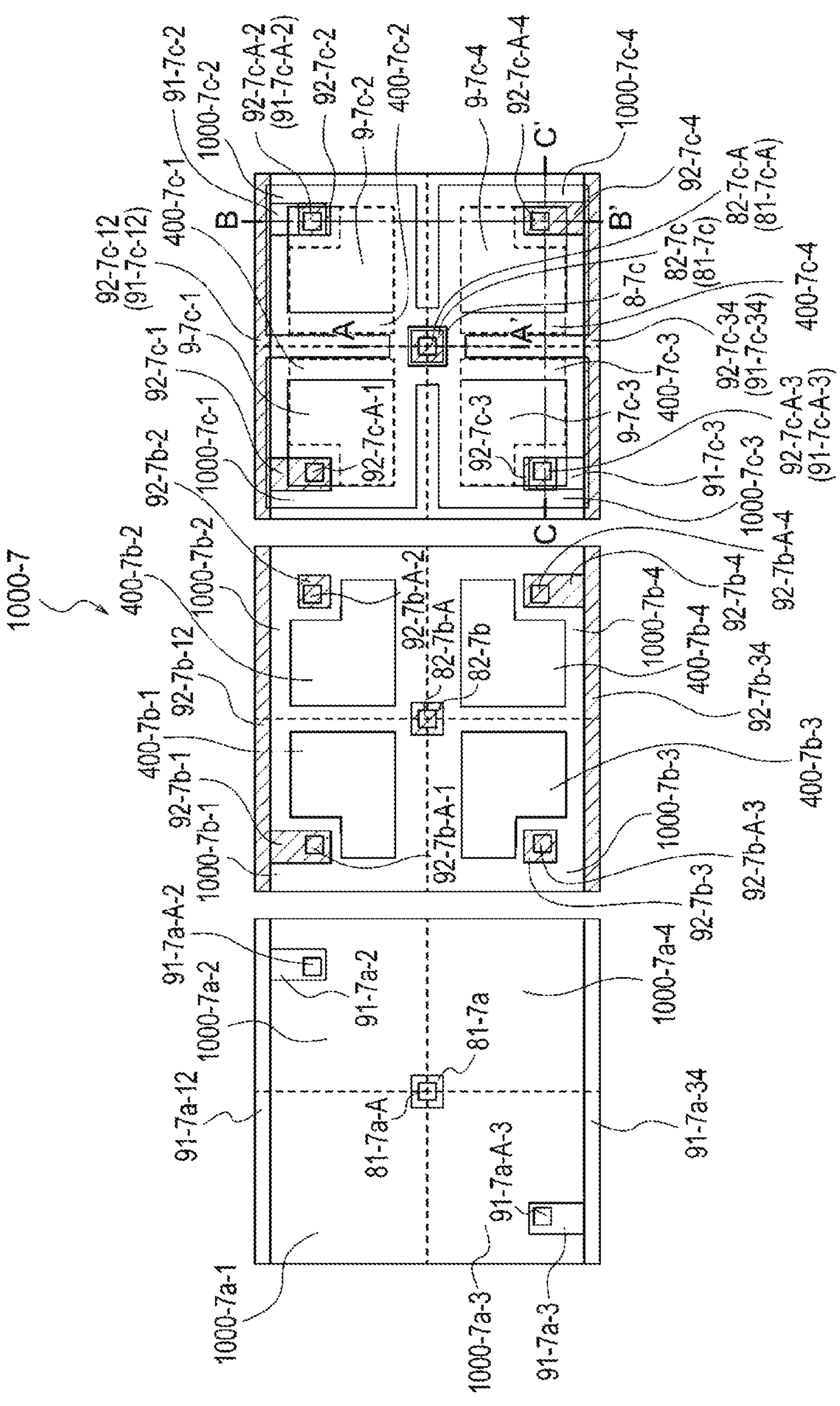
FIGS. 7A, 7B, and 7C illustrate plan diagrams depicting a configuration example of the solid-state imaging element of the second embodiment to which the present technology has been applied.

The solid-state imaging element 1000-7 according to the second embodiment of the present technology will be described with reference to FIGS. 7A, 7B, and 7C. FIG. 7A is a diagram depicting a planar layout of a first pedestal **81-8*a*, a via 81-8*a*-A, a first wire 91-8*b*-1, a contact hole 91-8*b*-A-1 and the like constituted by an identical layer in four pixels of the solid-state imaging element 1000-7 depicted in FIGS. 8A, 8B, and 8C. FIG. 7B is a diagram depicting a planar layout of a second pedestal 82-8*a*, a via 82-8*a*-A, a second wire 92-8*b*-1, a contact hole 92-8*b*-A-1 and the like constituted by an identical layer in four pixels of the solid-state imaging element 1000-7 depicted in FIGS. 8A, 8B, and 8C. FIG. 7C is a diagram depicting a planar layout of a first electrode 8-8*a*, a shield 10-8*a*-1, a third electrode 9-8*b*-1 and the like constituted by an identical layer in four pixels of the solid-state imaging element 1000-7 depicted in FIGS. 8A, 8B, and 8**C.

FIG. 7A will be referred to herein. FIG. 7A depicts four pixels **1000-7*a*-1 to 1000-7*a*-4 of the solid-state imaging element 1000-7**.

A first wire **91-7*a*-12 is provided on upper parts of the pixel 1000-7*a*-1 and the pixel 1000-7*a*-2 (the upper side in FIG. 7A). The first wire 91-7*a*-12 and a first wire 91-7*a*-2 are connected to each other in the pixel 1000-7*a*-2. A contact hole 91-7*a*-A-2 is connected to the first wire 91-7*a*-2**.

A first wire **91-7*a*-34 is provided on lower parts of the pixel 1000-7*a*-3 and the pixel 1000-7*a*-4 (the lower side in FIG. 7A). The first wire 91-7*a*-34 and a first wire 91-7*a*-3 are connected to each other in the pixel 1000-7*a*-3. A contact hole 91-7*a*-A-3 is connected to the first wire 91-7*a*-3**.

In this manner, the pixel **1000-7*a*-2 can be driven by the first wire 91-7*a*-12 and the first wire 91-7*a*-2, while the pixel 1000-7*a*-3 can be driven by the first wire 91-7*a*-34 and the first wire 91-7*a*-3. Accordingly, the two pixels (pixel 1000-7*a*-2 and pixel 1000-7*a*-3**) can be individually and independently driven.

A first pedestal **81-7*a* and a via 81-7*a*-A connected to the first pedestal 81-7*a* are provided as common components for the four pixels (1000-7*a*-1 to 1000-7*a*-4**).

FIG. 7B will be referred to herein. FIG. 7B depicts four pixels **1000-7*b*-1 to 1000-7*b*-4 of the solid-state imaging element 1000-7**.

A second wire **92-7*b*-12 is provided on upper parts of the pixel 1000-7*b*-1 and a pixel 1000-7*b*-2 (the upper side in FIG. 7B). The second wire 92-7*b*-12 and a second wire 92-7*b*-1 are connected to each other in the pixel 1000-7*b*-1. A contact hole 92-7*b*-A-1 is connected to the second wire 92-7*b*-1. In addition, a second wire 92-7*b*-2 is connected to a first wire (not depicted) through a contact hole 92-7*b*-A-2 in the pixel 1000-7*b*-2**.

A second wire **92-7*b*-34 is provided on lower parts of the pixel 1000-7*b*-3 and the pixel 1000-7*b*-4 (the lower side in FIG. 7B). The second wire 92-7_b_-34 and a second wire 92-7_b_-4 are connected to each other in the pixel 1000-7_b_-4. A contact hole 92-7_b_-A-4 is connected to the second wire 92-7_b_-4. In addition, a second wire 92-7_b_-3 is connected to a first wire (not depicted) through a contact hole 92-7_b_-A-3 in the pixel 1000-7_b_-3**.

In this manner, the pixel 1000-7_b_-1 can be driven by the second wire 92-7_b_-12 and the second wire 92-7_b_-1, while the pixel 1000-7_b_-4 can be driven by the second wire 92-7_b_-34 and the second wire 92-7_b_-4. Accordingly, the two pixels (pixel 1000-7_b_-1 and pixel 1000-7_b_-4) can be individually and independently driven.

A second pedestal 82-7_b_ and a via 82-7_b_-A connected to the second pedestal 82-7_b_ are provided as common components for the four pixels (1000-7_b_-1 to 1000-7_b_-4).

Optical waveguides 400-7_b_-1 to 400-7_b_-4 are provided for each set of the four pixels 1000-7_b_-1 to 1000-7_b_-4.

FIG. 7C will be referred to herein. FIG. 7C depicts four pixels 1000-7_c_-1 to 1000-7_c_-4 of the solid-state imaging element 1000-7. Note that FIG. 7C depicts optical waveguides 400-7_c_-1 to 400-7_c_-4 for convenience.

A third electrode 9-7_c_-1 and a second wire 92-7_c_-1 are provided in the pixel 1000-7_c_-1. The third electrode 9-7_c_-1 and the second wire 92-7_c_-1 are connected to each other through a contact hole 92-7_c_-1-A. A third electrode 9-7_c_-2, a first wire 91-7_c_-2, and a second wire 92-7_c_-2 are provided in the pixel 1000-7_c_-2. The first wire 91-7_c_-2 and the second wire 92-7_c_-1 are connected to each other through a contact hole 91-7_c_-A-2. The third electrode 9-7_c_-2 and the second wire 92-7_c_-2 are connected to each other through a contact hole 92-7_c_-A-2. A third electrode 9-7_c_-3, a first wire 91-7_c_-3, and a second wire 92-7_c_-3 are provided in the pixel 1000-7_c_-3. The first wire 91-7_c_-3 and the second wire 92-7_c_-3 are connected to each other through a contact hole 91-7_c_-A-3. The third electrode 9-7_c_-3 and the second wire 92-7_c_-3 are connected to each other through a contact hole 92-7_c_-A-3. A third electrode 9-7_c_-4 and a second wire 92-7_c_-4 are provided in the pixel 1000-7_c_-4. The third electrode 9-7_c_-4 and the second wire 92-7_c_-4 are connected to each other through a contact hole 92-7_c_-A-4.

A second wire 92-7_c_-12 (first wire 91-7_c_-12) is sequentially provided from the light entrance side in upper parts of the pixel 1000-7_c_-1 and the pixel 1000-7_c_-2 (the upper side in FIG. 7C). The second wire 92-7_c_-12 and the second wire 92-7_c_-1 are connected to each other in the pixel 1000-7_c_-1. The first wire 91-7_c_-12 and the first wire 91-7_c_-2 are connected to each other in the pixel 1000-7_c_-2.

A second wire 92-7_c_-34 (first wire 91-7_c_-34) is sequentially provided from the light entrance side in lower parts of the pixel 1000-7_c_-3 and the pixel 1000-7_c_-4 (the lower side in FIG. 7C). The first wire 91-7_c_-34 and the first wire 91-7_c_-3 are connected to each other in the pixel 1000-7_c_-3. The second wire 92-7_c_-34 and the second wire 92-7_c_-4 are connected to each other in the pixel 1000-7_c_-4.

In this manner, the pixel 1000-7_c_-2 can be driven by the first wire 91-7_c_-12 and the first wire 91-7_c_-2, while the pixel 1000-7_c_-3 can be driven by the first wire 91-7_c_-34 and the first wire 91-7_c_-3. In addition, the pixel 1000-7_c_-1 can be driven by the second wire 92-7_c_-12 and the second wire 92-7_c_-1, while the pixel 1000-3-4 can be driven by the second wire 92-7_c_-34 and the second wire 92-7_c_-4. Accordingly, the four pixels (pixel 1000-7_c_-1 to pixel 1000-7_c_-4) can be individually and independently driven.

A first electrode 8-7_c_ is provided as a common component for the four pixels (1000-7_c_-1 to 1000-7_c_-4). The first electrode is connected to a second pedestal 82-7_c_ through a via 82-7_c_-A, and the second pedestal 82-7_c_ is connected to a first pedestal 81-7_c_ through a via 81-7_c_-A in the order from the light entrance side.

Figures 8A, 8B, 8C:
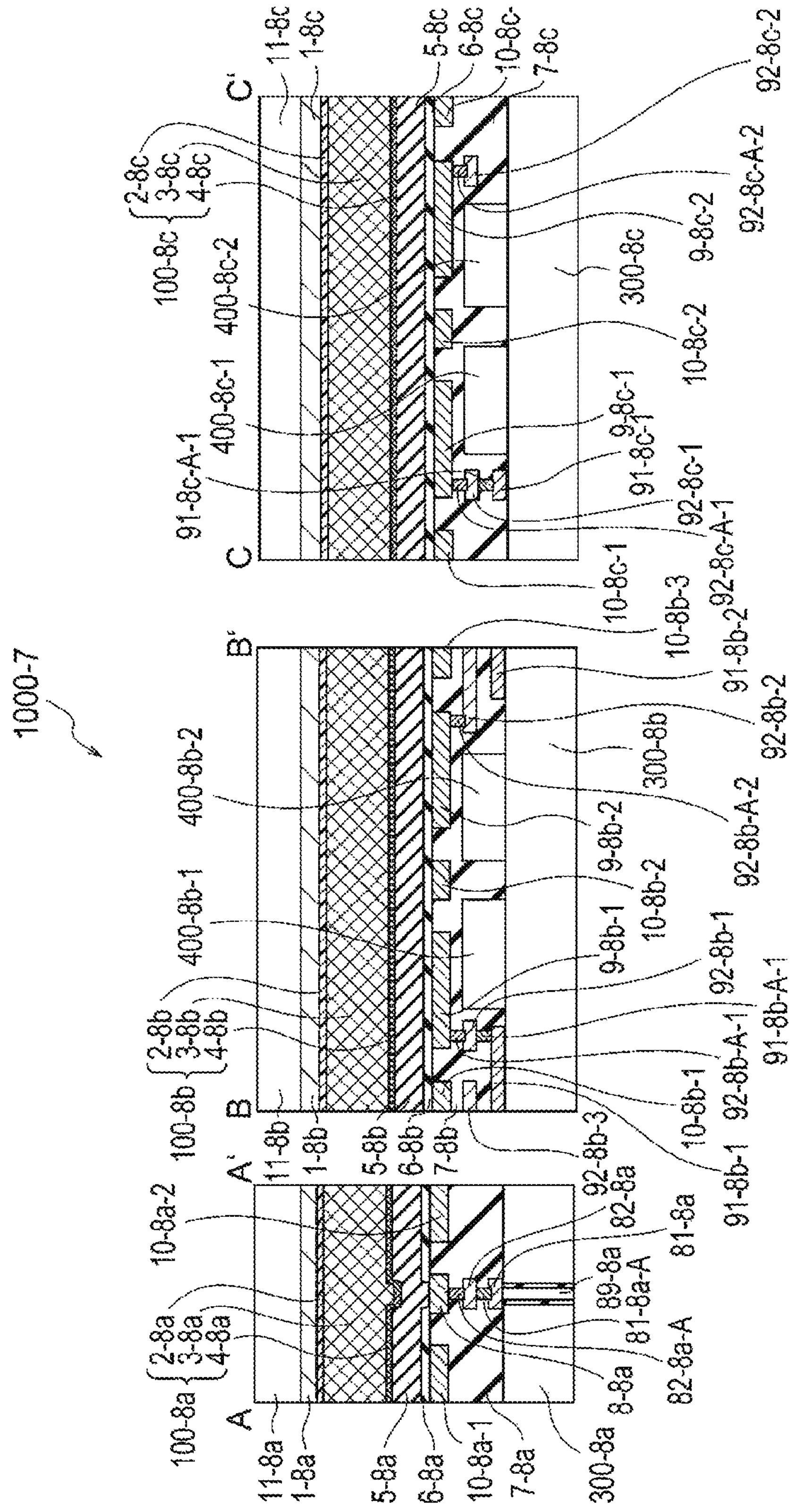
FIGS. 8A, 8B, and 8C illustrate cross-sectional diagrams depicting a configuration example of the solid-state imaging element of the second embodiment to which the present technology has been applied.

The solid-state imaging element 1000-7 according to the second embodiment of the present technology will be described with reference to FIGS. 8A, 8B, and 8C. FIG. 8A is a cross-sectional diagram of the solid-state imaging element 1000-7 taken along a line A-A' in FIG. 7C, FIG. 8B is a cross-sectional diagram of the solid-state imaging element 1000-7 taken along a line B-B' in FIG. 7C, and FIG. 8C is a cross-sectional diagram of the solid-state imaging element 1000-7 taken along a line C-C' in FIG. 7C.

FIG. 8A will be referred to herein. In FIG. 8A, the solid-state imaging element 1000-7 includes at least a first electrode 8-8_a_, a second electrode 1-8_a_, a first photoelectric conversion unit 100-8_a_, a semiconductor layer 5-8_a_, a first insulation layer 6-8_a_, and a second insulation layer 7-8_a_. The first electrode 8-8_a_ may be constituted by a transparent electrode.

The solid-state imaging element 1000-7 includes a protection layer 11-8_a_, the second electrode 1-8_a_, the first photoelectric conversion unit 100-8_a_, the semiconductor layer 5-8_a_, and the first electrode 8-8_a_ disposed in this order from the light entrance side (the upper side in FIG. 8A). The first electrode 8-8_a_ and two shields 10-8_a_-1 and 10-8_a_-2 are constituted by an identical layer.

In FIG. 8A, the first electrode 8-8_a_ is connected to the second pedestal 82-8_a_ through the via 82-8_a_-A. The second pedestal 82-8_a_ is connected to the first pedestal 81-8_a_ through the via 81-8_a_-A. Furthermore, the first pedestal 81-8_a_ is connected to a through electrode 89-8_a_.

The first photoelectric conversion unit 100-8_a_ is constituted by a second carrier blocking layer 2-8_a_, a photoelectric conversion layer (e.g., organic photoelectric conversion layer) 3-8_a_, and a first carrier blocking layer 4-8_a_.

The first photoelectric conversion unit 100-8_a_ is provided on one surface side of a semiconductor substrate 300-8_a_ (the light entrance side, the upper side in FIG. 8A).

FIG. 8B will be referred to herein. In FIG. 8B), the solid-state imaging element 1000-7 includes at least shields 10-8_b_-1 to 10-8_b_-3, a second electrode 1-8_b_, third electrodes 9-8_b_-1 and 9-8_b_-2, a first photoelectric conversion unit 100-8_b_, a semiconductor layer 5-8_b_, a first insulation layer 6-8_b_, a second insulation layer 7-8_b_, and optical waveguides 400-8_b_-1 and 400-8_b_-2. Each of the third electrodes 9-8_b_-1 and 9-8_b_-2 may be constituted by a transparent electrode.

The solid-state imaging element 1000-7 includes a protection layer 11-8_b_, the second electrode 1-8_b_, the first photoelectric conversion unit 100-8_b_, the semiconductor layer 5-8_b_, the shields 10-8_b_-1 to 10-8_b_-3, and the optical waveguides 400-8_b_-1 and 400-8_b_-2 disposed in this order from the light entrance side (the upper side in FIG. 8B).

The third electrodes 9-8_b_-1 and 9-8_b_-2 are provided away from a first electrode (not depicted), and faces the first photoelectric conversion unit 100-8_b_ through the first insulation layer 6-8_b_. Each of the third electrodes 9-8_b_-1 and 9-8_b_-2 is a charge accumulation electrode similarly to the third electrodes 9-1-1 and 9-1-2 in FIG. 1. The third electrodes 9-8_b_-1 and 9-8_b_-2, and the shields 10-8_b_-1, 10-8_b_-2, and 10-8_b_-3 are constituted by an identical layer.

In FIG. 8B, the third electrode 9-8_b_-1 is connected to the second wire 92-8_b_-1 through the contact hole 92-8_b_-A-1, while the second wire 92-8_b_-1 is connected to the wire 91-8_b_-1 through the contact hole 91-8_b_-A-1. The third electrode 9-8_b_-2 is connected to the second wire 92-8_b_-2 through a contact hole 92-8_b_-A-2. The first wire 91-8_b_-2 and the second wire 92-8_b_-3 correspond to the first wire 91-6_b_ and the second wire **92-6*b* depicted in FIG. 6B, respectively, and are wires provided between two pixels adjacent to each other in the column direction (the P direction in FIG. 6B). In addition, the second wire 92-8*b*-1, the second wire 92-8*b*-2, and the second wire 92-8*b*-3 are constituted by an identical layer, while the first wire 91-8*b*-1 and the first wire 91-8*b*-2** are constituted by an identical layer.

The second insulation layer **7-8*b* is provided between the third electrodes 9-8*b*-1 and 9-8*b*-2 and a semiconductor substrate 300-8*b***.

In FIG. 8B, the optical waveguides **400-8*b*-1 and 400-8*b*-2 are provided between the third electrodes 9-8*b*-1 and 9-8*b*-2 and the semiconductor substrate 300-8*b***.

The first photoelectric conversion unit **100-8*b* is constituted by a second carrier blocking layer 2-8*b*, a photoelectric conversion layer (e.g., organic photoelectric conversion layer) 3-8*b*, and a first carrier blocking layer 4-8*b***.

The first photoelectric conversion unit **100-8*b* is provided on one surface side of the semiconductor substrate 300-8*b* (the light entrance side, the upper side in FIG. 8**B).

FIG. 8C will be referred to herein. In FIG. 8C, the solid-state imaging element 1000-7 includes at least shields **10-8*c*-1 to 10-8*c*-3, a second electrode 1-8*c*, third electrodes 9-8*c*-1 and 9-8*c*-2, a first photoelectric conversion unit 100-8*c*, a semiconductor layer 5-8*c*, a first insulation layer 6-8*c*, a second insulation layer 7-8*c*, and optical waveguides 400-8*c*-1 and 400-8*c*-2. Each of the third electrodes 9-8*c*-1 and 9-8*c*-2** may be constituted by a transparent electrode.

The solid-state imaging element 1000-7 includes a protection layer **11-8*c*, the second electrode 1-8*c*, the first photoelectric conversion unit 100-8*c*, the semiconductor layer 5-8*c*, the shields 10-8*c*-1 to 10-8*c*-3, and the optical waveguides 400-8*c*-1 and 400-8*c*-2 disposed in this order from the light entrance side (the upper side in FIG. 8**C).

The third electrodes **9-8*c*-1 and 9-8*c*-2 are provided away from a first electrode (not depicted), and faces the first photoelectric conversion unit 100-8*c* through the first insulation layer 6-8*c*. Each of the third electrodes 9-8*c*-1 and 9-8*c*-2 is a charge accumulation electrode similarly to the third electrodes 9-1-1 and 9-1-2 in FIG. 1. The third electrodes 9-8*c*-1 and 9-8*c*-2, and the shields 10-8*c*-1, 10-8*c*-2, and 10-8*c*-3** are constituted by an identical layer.

In FIG. 8C, the third electrode **9-8*c*-1 is connected to a second wire 92-8*c*-1 through a contact hole 92-8*c*-A-1, while the second wire 92-8*c*-1 is connected to a wire 91-8*c*-1 through a contact hole 91-8*c*-A-1. The third electrode 9-8*c*-2 is connected to a second wire 92-8*c*-2 through a contact hole 92-8*c*-A-2. In addition, the second wire 92-8*c*-1 and the second wire 92-8*c*-2** are constituted by an identical layer.

The second insulation layer **7-8*c* is provided between the third electrodes 9-8*c*-1 and 9-8*c*-2 and a semiconductor substrate 300-8*c***.

In FIG. 8C, the optical waveguides **400-8*c*-1 and 400-8*c*-2 are provided between the third electrodes 9-8*c*-1 and 9-8*c*-2 and the semiconductor substrate 300-8*c***.

The first photoelectric conversion unit **100-8*c* is constituted by a second carrier blocking layer 2-8*c*, a photoelectric conversion layer (e.g., organic photoelectric conversion layer) 3-8*c*, and a first carrier blocking layer 4-8*c***.

The first photoelectric conversion unit **100-8*c* is provided on one surface side of the semiconductor substrate 300-8*c* (the light entrance side, the upper side in FIG. 8**C).

3. Third Embodiment (Example 3 of Solid-State Imaging Element)

A solid-state imaging element according to a third embodiment of the present technology is a solid-state imaging element which includes at least a first electrode, a second electrode, a third electrode, a first photoelectric conversion unit, a second photoelectric conversion unit, a first insulation layer, a second insulation layer, an optical waveguide, and a low dielectric constant material containing layer. According to the solid-state imaging element of the third embodiment of the present technology, the second electrode, the first photoelectric conversion unit, and the first electrode are disposed in this order. The third electrode is provided away from the first electrode and faces the first photoelectric conversion unit through the first insulation layer. The second insulation layer is provided between the third electrode and the second photoelectric conversion unit. In addition, the optical waveguide is provided between the third electrode and the second photoelectric conversion unit. According to the solid-state imaging element of the third embodiment of the present technology, the low dielectric constant material containing layer is disposed below the optical waveguide and above the second photoelectric conversion unit.

Accordingly, the solid-state imaging element of the third embodiment of the present technology is a solid-state imaging element which includes the low dielectric constant material containing layer added to the solid-state imaging element of the first embodiment of the present technology, and is disposed below the optical waveguide and above the second photoelectric conversion unit.

The capacitance can be further reduced by providing the low dielectric constant material containing layer below the optical waveguide and above the second photoelectric conversion unit. This further reduction of the capacitance contributes to height reduction. Accordingly, advantageous effects of further improvement of image quality, particularly advantageous effects of improvement of sensitivity, mixture of colors, and shading are further produced.

The low dielectric constant material containing layer may be a layer containing a low dielectric constant material, or a layer constituted by a dielectric constant material. The refractive index of the low dielectric constant material is not particularly limited. However, this index preferably ranges from 1.6 to 1.8. The dielectric constant of the low dielectric constant material is not particularly limited. However, this constant preferably ranges from 3.4 to 3.6.

The low dielectric constant material is not particularly limited. For example, this material may be a transparent material such as an SiOC film and an SiOCH film.

Figures 9A, 9B, 9C:
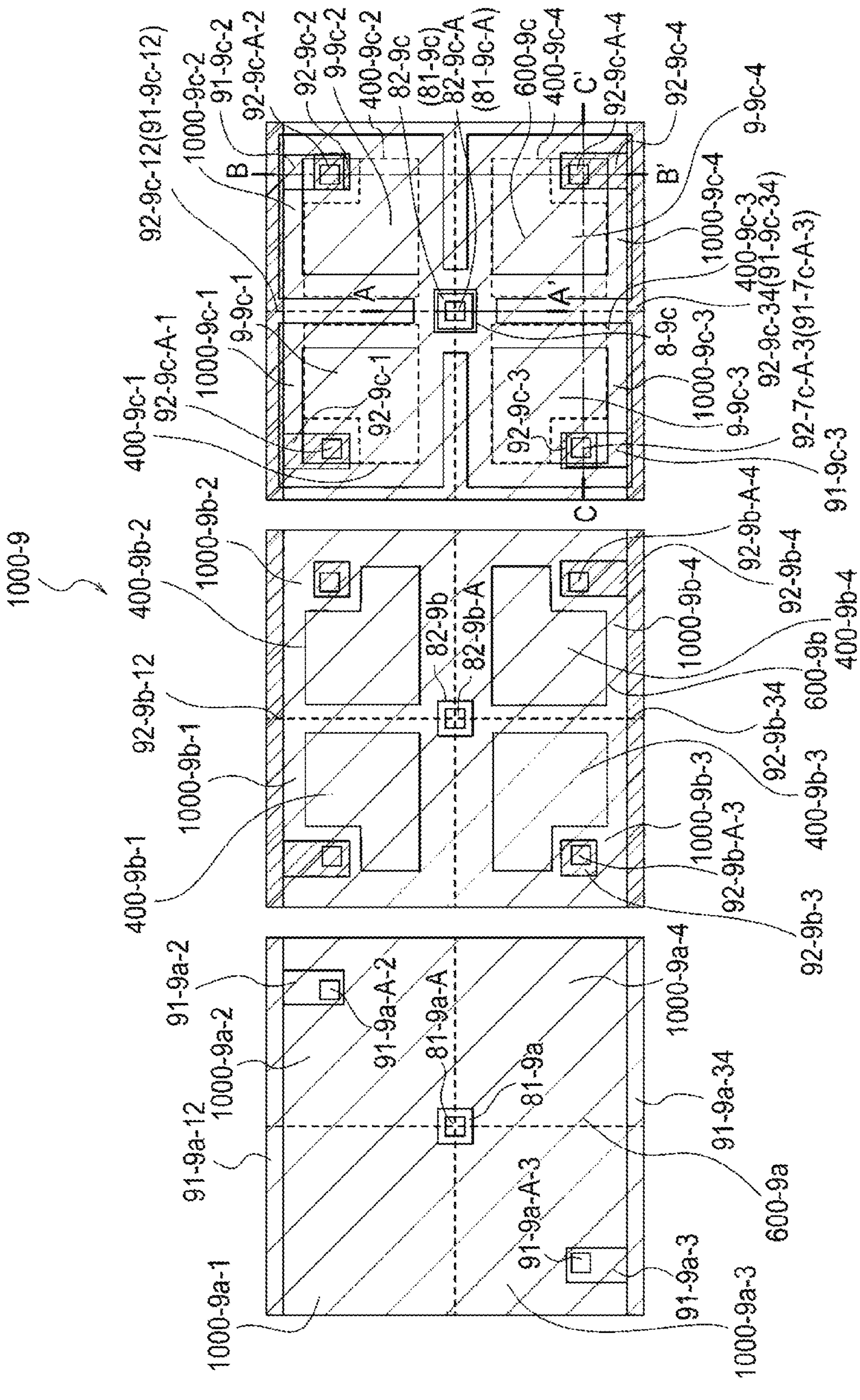
FIGS. 9A, 9B, and 9C illustrate plan diagrams depicting a configuration example of a solid-state imaging element of a third embodiment to which the present technology has been applied.

A solid-state imaging element 1000-9 according to the third embodiment of the present technology will be next described with reference to FIGS. 9A, 9B, and 9C. FIG. 9A is a diagram depicting a planar layout of a first pedestal **81-10*a*, a via 81-10*a*-A, a first wire 91-10*b*-1, a contact hole 91-10*b*-A-1 and the like constituted by an identical layer in four pixels of the solid-state imaging element 1000-9 depicted in FIGS. 10A, 10B, and 10C. FIG. 9B is a diagram depicting a planar layout of a second pedestal 82-10*a*, a via 82-10*a*-A, a second wire 92-10*b*-1, a contact hole 92-10*b*-A-1 and the like constituted by an identical layer in four pixels of the solid-state imaging element 1000-9 depicted in FIGS. 10A, 10B, and 10C. FIG. 9C is a diagram depicting a planar layout of a first electrode 8-10*a*, a shield 10-10*a*-1, a third electrode 9-10*b*-1 and the like constituted by an identical layer in four pixels of the solid-state imaging element 1000-9 depicted in FIGS. 10A, 10B, and 10**C.

FIG. 9A will be referred to herein. FIG. 9A depicts four pixels **1000-9*a*-1 to 1000-9*a*-4 of the solid-state imaging element 1000-9. Note that FIG. 9A depicts a low dielectric constant material containing layer 600-9*a*** for convenience.

A first wire **91-9*a*-12 is provided on upper parts of the pixel 1000-9*a*-1 and the pixel 1000-9*a*-2 (the upper side in FIG. 9A). The first wire 91-9*a*-12 and a first wire 91-9*a*-2 are connected to each other in the pixel 1000-9*a*-2. A contact hole 91-9*a*-A-2 is connected to the first wire 91-9*a*-2**.

A first wire **91-9*a*-34 is provided on lower parts of the pixel 1000-9*a*-3 and the pixel 1000-9*a*-4 (the lower side in FIG. 9A). The first wire 91-9*a*-34 and a first wire 91-9*a*-3 are connected to each other in the pixel 1000-9*a*-3. A contact hole 91-9*a*-A-3 is connected to the first wire 91-9*a*-3**.

In this manner, the pixel **1000-9*a*-2 can be driven by the first wire 91-9*a*-12 and the first wire 91-9*a*-2, while the pixel 1000-9*a*-3 can be driven by the first wire 91-9*a*-34 and the first wire 91-9*a*-3. Accordingly, the two pixels (pixel 1000-9*a*-2 and pixel 1000-9*a*-3**) can be individually and independently driven.

A first pedestal **81-9*a* and a via 81-9*a*-A connected to the first pedestal 81-9*a* are provided as common components for the four pixels (1000-9*a*-1 to 1000-9*a*-4**).

FIG. 9B will be referred to herein. FIG. 9B depicts four pixels **1000-9*b*-1 to 1000-9*b*-4 of the solid-state imaging element 1000-9. Note that FIG. 9B depicts the low dielectric constant material containing layer 600-9*a*** for convenience.

A second wire **92-9*b*-12 is provided on upper parts of the pixel 1000-9*b*-1 and the pixel 1000-9*b*-2 (the upper side in FIG. 7B). The second wire 92-9*b*-12 and a second wire 92-9*b*-1 are connected to each other in the pixel 1000-9*b*-1. A contact hole 92-9*b*-A-1 is connected to the second wire 92-9*b*-1. In addition, a second wire 92-9*b*-2 is connected to a first wire (not depicted) through a contact hole 92-9*b*-A-2 in the pixel 1000-9*b*-2**.

A second wire **92-9*b*-34 is provided on lower parts of the pixel 1000-9*b*-3 and the pixel 1000-9*b*-4 (the lower side in FIG. 7B). The second wire 92-9*b*-34 and a second wire 92-9*b*-4 are connected to each other in the pixel 1000-9*b*-4. A contact hole 92-9*b*-A-4 is connected to the second wire 92-9*b*-4. In addition, a second wire 92-9*b*-3 is connected to a first wire (not depicted) through a contact hole 92-9*b*-A-3 in the pixel 1000-9*b*-3**.

In this manner, the pixel **1000-9*b*-1 can be driven by the second wire 92-9*b*-12 and the second wire 92-9*b*-1, while the pixel 1000-9*b*-4 can be driven by the second wire 92-9*b*-34 and the second wire 92-9*b*-4. Accordingly, the two pixels (pixel 1000-9*b*-1 and pixel 1000-9*b*-4**) can be individually and independently driven.

A second pedestal **82-9*b* and a via 82-9*b*-A connected to the second pedestal 82-9*b* are provided as common components for the four pixels (1000-9*b*-1 to 1000-9*b*-4**).

FIG. 9C will be referred to herein. FIG. 9C depicts four pixels **1000-9*c*-1 to 1000-9*c*-4 of the solid-state imaging element 1000-9. Note that FIG. 9C depicts optical waveguides 400-9*c*-1 to 400-9*c*-4 for convenience. Similarly, FIG. 9C also depicts a low dielectric constant material containing layer 600-9*c***.

A third electrode **9-9*c*-1 and a second wire 92-9*c*-1 are provided in the pixel 1000-9*c*-1. The third electrode 9-9*c*-1 and the second wire 92-9*c*-1 are connected to each other through a contact hole 92-9*c*-1-A. A third electrode 9-9*c*-2, a first wire 91-9*c*-2, and a second wire 92-9*c*-2 are provided in the pixel 1000-9*c*-2. The first wire 91-9*c*-2 and the second wire 92-9*c*-1 are connected to each other through a contact hole 91-9*c*-A-2. The third electrode 9-9*c*-2 and the second wire 92-9*c*-2 are connected to each other through a contact hole 92-9*c*-A-2. A third electrode 9-9*c*-3, a first wire 91-9*c*-3, and a second wire 92-9*c*-3 are provided in the pixel 1000-9*c*-3. The first wire 91-9*c*-3 and the second wire 92-9*c*-3 are connected to each other through a contact hole 91-9*c*-A-3. The third electrode 9-9*c*-3 and the second wire 92-9*c*-3 are connected to each other through a contact hole 92-9*c*-A-3. A third electrode 9-9*c*-4 and a second wire 92-9*c*-4 are provided in the pixel 1000-9*c*-4. The third electrode 9-9*c*-4 and the second wire 92-9*c*-4 are connected to each other through a contact hole 92-9*c*-A-4**.

A second wire **92-9*c*-12 (first wire 91-9*c*-12) is sequentially provided from the light entrance side in upper parts of the pixel 1000-9*c*-1 and the pixel 1000-9*c*-2 (the upper side in FIG. 9C). The second wire 92-9*c*-12 and the second wire 92-9*c*-1 are connected to each other in the pixel 1000-9*c*-1. The first wire 91-9*c*-12 and the first wire 91-9*c*-2 are connected to each other in the pixel 1000-9*c*-2**.

A second wire **92-9*c*-34 (first wire 91-9*c*-34) is sequentially provided from the light entrance side in lower parts of the pixel 1000-9*c*-3 and the pixel 1000-9*c*-4 (the lower side in FIG. 9C). The first wire 91-9*c*-34 and the first wire 91-9*c*-3 are connected to each other in the pixel 1000-9*c*-3. The second wire 92-9*c*-34 and the second wire 92-9*c*-4 are connected to each other in the pixel 1000-9*c*-4**.

In this manner, the pixel **1000-9*c*-2 can be driven by the first wire 91-9*c*-12 and the first wire 91-9*c*-2, while the pixel 1000-9*c*-3 can be driven by the first wire 91-9*c*-34 and the first wire 91-9*c*-3. In addition, the pixel 1000-9*c*-1 can be driven by the second wire 92-9*c*-12 and the second wire 92-9*c*-1, while the pixel 1000-3-4 can be driven by the second wire 92-9*c*-34 and the second wire 92-9*c*-4. Accordingly, the four pixels (pixel 1000-9*c*-1 to pixel 1000-9*c*-4**) can be individually and independently driven.

A first electrode **8-9*c* is provided as a common component for the four pixels (1000-9*c*-1 to 1000-9*c*-4). The first electrode is connected to a second pedestal 82-9*c* through a via 82-9*c*-A, and the second pedestal 82-9*c* is connected to a first pedestal 81-9*c* through a via 81-9*c***-A in the order from the light entrance side.

Figures 10A, 10B, 10C:
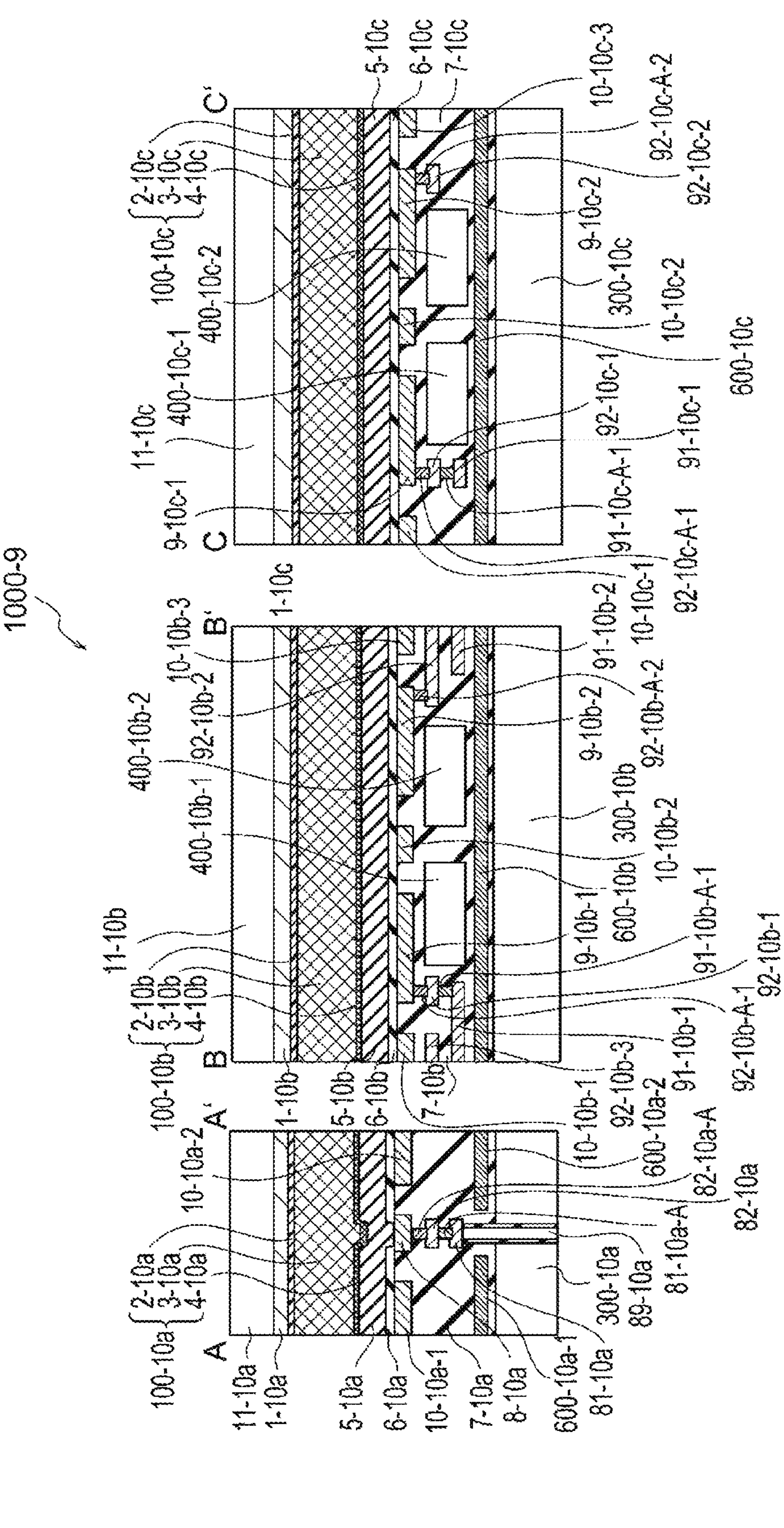
FIGS. 10A, 10B, and 10C illustrate cross-sectional diagrams depicting a configuration example of the solid-state imaging element of the third embodiment to which the present technology has been applied.

The solid-state imaging element 1000-9 according to the third embodiment of the present technology will be described with reference to FIGS. 10A 10B, and 10C. FIG. 10A is a cross-sectional diagram of the solid-state imaging element 1000-9 taken along a line A-A' in FIG. 9C, FIG. 10B is a cross-sectional diagram of the solid-state imaging element 1000-9 taken along a line B-B' in FIG. 9C, and FIG. 10C is a cross-sectional diagram of the solid-state imaging element 1000-9 taken along a line C-C' in FIG. 9C.

FIG. 10A will be referred to herein. In FIG. 10A, the solid-state imaging element 1000-9 includes at least a first electrode **8-10*a*, a second electrode 1-10*a*, a first photoelectric conversion unit 100-10*a*, a semiconductor layer 5-10*a*, a first insulation layer 6-10*a*, a second insulation layer 7-10*a*, and low dielectric constant material containing layers 600-10*a*-1 and 600-10*a*-2. The first electrode 8-10*a*** may be constituted by a transparent electrode.

The solid-state imaging element 1000-7 includes a protection layer **11-10*a*, the second electrode 1-10*a*, the first photoelectric conversion unit 100-10*a*, the semiconductor layer 5-10*a*, the first electrode 8-10*a*, and the low dielectric constant material containing layers 600-10*a*-1 and 600-10*a*-2 disposed in this order from the light entrance side (the upper side in FIG. 10A). The first electrode 8-10*a* and two shields 10-10*a*-1 and 10-10*a*-2** are constituted by an identical layer.

In FIG. 10A, the first electrode **8-10*a* is connected to the second pedestal 82-10*a* through the via 82-10*a*-A. The second pedestal 82-10*a* is connected to the first pedestal 81-10*a* through the via 81-10*a*-A. Furthermore, the first pedestal 81-10*a* is connected to a through electrode 89-10*a***.

Each of the low dielectric constant material containing layers 600-10*a*-1 and 600-10*a*-2 extends around the through electrode 89-10*a*.

The first photoelectric conversion unit 100-10*a* is constituted by a second carrier blocking layer 2-10*a*, a photoelectric conversion layer (e.g., organic photoelectric conversion layer) 3-10*a*, and a first carrier blocking layer 4-10*a*.

The first photoelectric conversion unit 100-10*a* is provided on one surface side of a semiconductor substrate 300-10*a* (the light entrance side, the upper side in FIG. 10A).

FIG. 10B will be referred to herein. In FIG. 10B, the solid-state imaging element 1000-9 includes at least shields 10-10*b*-1 to 10-10*b*-3, a second electrode 1-10*b*, third electrodes 9-10*b*-1 and 9-10*b*-2, a first photoelectric conversion unit 100-10*b*, a semiconductor layer 5-10*b*, a first insulation layer 6-10*b*, a second insulation layer 7-10*b*, optical waveguides 400-10*b*-1 and 400-10*b*-2, and a low dielectric constant material containing layer 600-10*b*. Each of the third electrodes 9-10*b*-1 and 9-10*b*-2 may be constituted by a transparent electrode.

The solid-state imaging element 1000-9 includes a protection layer 11-10*b*, the second electrode 1-10*b*, the first photoelectric conversion unit 100-10*b*, the semiconductor layer 5-10*b*, the shields 10-10*b*-1 to 10-10*b*-3, the optical waveguides 400-10*b*-1 and 400-10*b*-2, and the low dielectric constant material containing layer 600-10*b* disposed in this order from the light entrance side (the upper side in FIG. 10B).

The third electrodes 9-10*b*-1 and 9-10*b*-2 are provided away from a first electrode (not depicted), and faces the first photoelectric conversion unit 100-10*b* through the first insulation layer 6-10*b*. Each of the third electrodes 9-10*b*-1 and 9-10*b*-2 is a charge accumulation electrode similarly to the third electrodes 9-1-1 and 9-1-2 in FIG. 1. The first electrode 8-10*b*, the third electrodes 9-10*b*-1 and 9-10*b*-2, and the shields 10-10*b*-1, 10-10*b*-2, and 10-10*b*-3 are constituted by an identical layer.

In FIG. 10B, the third electrode 9-10*b*-1 is connected to the second wire 92-10*b*-1 through the contact hole 92-10*b*-A-1, while the second wire 92-10*b*-1 is connected to the wire 91-10*b*-1 through the contact hole 91-10*b*-A-1. The third electrode 9-10*b*-2 is connected to the second wire 92-10*b*-2 through a contact hole 92-10*b*-A-2. The first wire 91-10*b*-2 and the second wire 92-10*b*-3 correspond to the first wire 91-6*b* and the second wire 92-6*b* depicted in FIG. 6B, respectively, and are wires provided between two pixels adjacent to each other in the column direction (the P direction in FIG. 6B). In addition, the second wire 92-10*b*-1, the second wire 92-10*b*-2, and the second wire 92-10*b*-3 are constituted by an identical layer, while the first wire 91-10*b*-1 and the first wire 91-10*b*-2 are constituted by an identical layer.

The second insulation layer 7-10*b* is provided between the third electrodes 9-10*b*-1 and 9-10*b*-2 and a semiconductor substrate 300-10*b*.

In FIG. 10B, the optical waveguides 400-10*b*-1 and 400-10*b*-2 are provided between the third electrodes 9-10*b*-1 and 9-10*b*-2 and the semiconductor substrate 300-10*b*.

In FIG. 10B, the low dielectric constant material containing layer 600-10*b* is provided between the optical waveguides 400-10*b*-1 and 400-10*b*-2 and the semiconductor substrate 300-10*b*.

The first photoelectric conversion unit 100-10*b* is constituted by a second carrier blocking layer 2-10*b*, a photoelectric conversion layer (e.g., organic photoelectric conversion layer) 3-10*b*, and a first carrier blocking layer 4-10*b*.

The first photoelectric conversion unit 100-10*b* is provided on one surface side of the semiconductor substrate 300-10*b* (the light entrance side, the upper side in FIG. 10B).

FIG. 10C will be referred to herein. In FIG. 10C, the solid-state imaging element 1000-9 includes at least shields 10-10*c*-1 to 10-10*c*-3, a second electrode 1-10*c*, third electrodes 9-10*c*-1 and 9-10*c*-2, a first photoelectric conversion unit 100-10*c*, a semiconductor layer 5-10*c*, a first insulation layer 6-10*c*, a second insulation layer 7-10*c*, optical waveguides 400-10*c*-1 and 400-10*c*-2, and a low dielectric constant material containing layer 600-10*c*. Each of the third electrodes 9-10*c*-1 and 9-10*c*-2 may be constituted by a transparent electrode.

The solid-state imaging element 1000-9 includes a protection layer 11-10*c*, the second electrode 1-10*c*, the first photoelectric conversion unit 100-10*c*, the semiconductor layer 5-10*c*, the shields 10-10*c*-1 to 10-10*c*-3, the optical waveguides 400-10*c*-1 and 400-10*c*-2, and the low dielectric constant material containing layer 600-10*c* disposed in this order from the light entrance side (the upper side in FIG. 10C).

The third electrodes 9-10*c*-1 and 9-10*c*-2 are provided away from a first electrode (not depicted), and faces the first photoelectric conversion unit 100-10*c* through the first insulation layer 6-10*c*. Each of the third electrodes 9-10*c*-1 and 9-10*c*-2 is a charge accumulation electrode similarly to the third electrodes 9-1-1 and 9-1-2 in FIG. 1. The first electrode 8-10*c*, the third electrodes 9-10*c*-1 and 9-10*c*-2, and the shields 10-10*c*-1, 10-10*c*-2, and 10-10*c*-3 are constituted by an identical layer.

In FIG. 10C, the third electrode 9-10*c*-1 is connected to a second wire 92-10*c*-1 through a contact hole 92-10*c*-A-1, while the second wire 92-10*c*-1 is connected to a wire 91-10*c*-1 through a contact hole 91-10*c*-A-1. The third electrode 9-10*c*-2 is connected to a second wire 92-10*c*-2 through a contact hole 92-10*c*-A-2. In addition, the second wire 92-10*c*-1 and the second wire 92-10*c*-2 are constituted by an identical layer.

The second insulation layer 7-10*c* is provided between the third electrodes 9-10*c*-1 and 9-10*c*-2 and a semiconductor substrate 300-10*c*.

In FIG. 10C, the optical waveguides 400-10*c*-1 and 400-10*c*-2 are provided between the third electrodes 9-10*c*-1 and 9-10*c*-2 and the semiconductor substrate 300-10*c*.

In FIG. 10C, the low dielectric constant material containing layer 600-10*c* is provided between the optical waveguides 400-10*c*-1 and 400-10*c*-2 and the semiconductor substrate 300-10*c*.

The first photoelectric conversion unit 100-10*c* is constituted by a second carrier blocking layer 2-10*c*, a photoelectric conversion layer (e.g., organic photoelectric conversion layer) 3-10*c*, and a first carrier blocking layer 4-10*c*.

The first photoelectric conversion unit 100-10*c* is provided on one surface side of the semiconductor substrate 300-10*c* (the light entrance side, the upper side in FIG. 10C).

4. Fourth Embodiment (Example 4 of Solid-State Imaging Element)

A solid-state imaging element according to a fourth embodiment of the present technology is a solid-state imaging element which includes at least a first electrode, a second electrode, a third electrode, a first photoelectric conversion unit, a second photoelectric conversion unit, a first insulation layer, a second insulation layer, an optical waveguide, and an inner lens. According to the solid-state imaging element of the fourth embodiment of the present technology, the second electrode, the first photoelectric conversion unit, and the first electrode are disposed in this order. The third electrode is provided away from the first electrode and faces the first photoelectric conversion unit through the first insulation layer. The second insulation layer is provided between the third electrode and the second photoelectric conversion unit. In addition, the optical waveguide is provided between the third electrode and the second photoelectric conversion unit. In addition, according to the solid-state imaging element of the fourth embodiment of the present technology, the inner lens is provided between the first photoelectric conversion unit and the optical waveguide.

Accordingly, the solid-state imaging element according to the fourth embodiment of the present technology is a solid-state imaging element which adds the inner lens to the solid-state imaging element of the first embodiment of the present technology. This inner lens is disposed between the first photoelectric conversion unit and the optical waveguide.

Light from the on-chip lens is more efficiently condensed for each pixel of a plurality of pixels by inserting the inner lens between the first photoelectric conversion unit and the optical waveguide. Accordingly, a synergistic effect of improvement of mixture of colors of adjacent pixels is produced by providing both the optical waveguide and the inner lens on the solid-state imaging element. In addition, in the configuration producing the synergistic effect of improvement of mixture of colors of adjacent pixels by the inserted inner lens as described above, the thickness of the second insulation layer is allowed to further increase. In this case, the film thickness between the semiconductor substrate and the first photoelectric conversion unit can be increased. This increase in the film thickness can reduce the capacitance between the semiconductor substrate and the first electrode for the first photoelectric conversion unit. Accordingly, a conversion efficiency drop and deterioration of random noise (RN) may be prevented. In addition, particularly advantageous effects of improvement of sensitivity, shading, and mixture of colors, and advantageous effects of a conversion efficiency drop and deterioration of random noise (RN) may be both achieved.

For example, the inner lens can be produced from plasma silicon nitride (P-SiN, refractive index: approximately 1.9 to 2.0) or the like. The inner lens may have any shapes such as a semispherical shape, or other shapes. In addition, the inner lens may have a rectangular shape, for example.

Figures 11A, 11B, 11C:
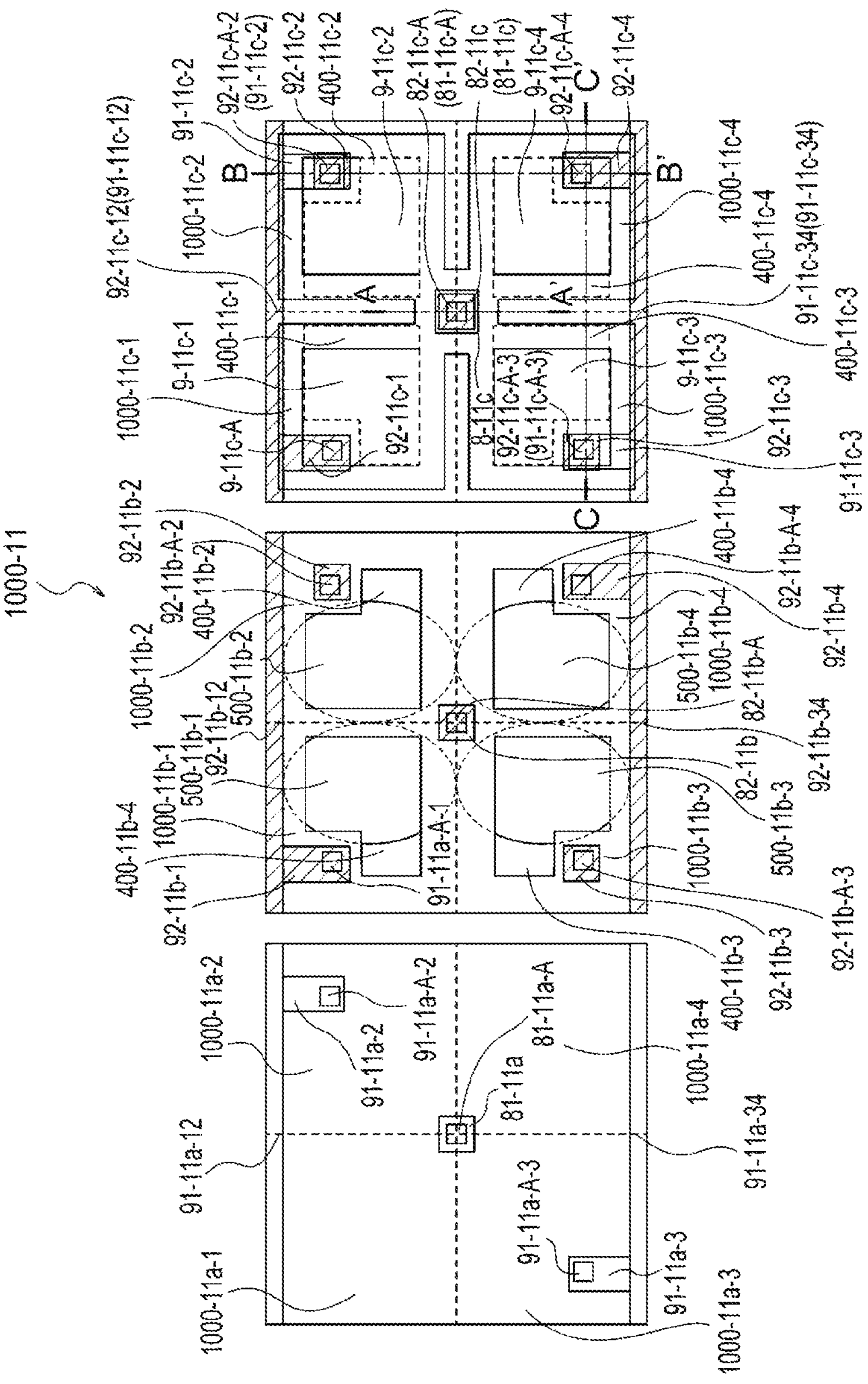
FIGS. 11A, 11B, and 11C illustrate plan diagrams depicting a configuration example of a solid-state imaging element of a fourth embodiment to which the present technology has been applied.

A solid-state imaging element 1000-11 according to the fourth embodiment of the present technology will be next described with reference to FIGS. 11A, 11B, and 11C. FIG. 11A is a diagram depicting a planar layout of a first pedestal 81-12*a*, a via 81-12*a*-A, a first wire 91-12*b*-1, a contact hole 91-12*b*-A-1 and the like constituted by an identical layer in four pixels of the solid-state imaging element 1000-11 depicted in FIGS. 12A, 12B, and 12C. FIG. 11B is a diagram depicting a planar layout of a second pedestal 82-12*a*, a via 82-12*a*-A, a second wire 92-12*b*-1, a contact hole 92-12*b*-A-1 and the like constituted by an identical layer in four pixels of the solid-state imaging element 1000-11 depicted in FIGS. 12A, 12B, and 12C. FIG. 11C is a diagram depicting a planar layout of a first electrode 8-12*a*, a shield 10-12*a*-1, a third electrode 9-12*b*-1 and the like constituted by an identical layer in four pixels of the solid-state imaging element 1000-11 depicted in FIGS. 12A 12B and 12C.

FIG. 11A will be referred to herein. FIG. 11A depicts four pixels 1000-11*a*-1 to 1000-11*a*-4 of the solid-state imaging element 1000-11.

A first wire 91-11*a*-12 is provided on upper parts of the pixel 1000-11*a*-1 and the pixel 1000-11*a*-2 (the upper side in FIG. 11A). The first wire 91-11*a*-12 and a first wire 91-11*a*-2 are connected to each other in the pixel 1000-11*a*-2. A contact hole 91-11*a*-A-2 is connected to the first wire 91-11*a*-2.

A first wire 91-11*a*-34 is provided on lower parts of the pixel 1000-11*a*-3 and the pixel 1000-11*a*-4 (the lower side in FIG. 11A). The first wire 91-11*a*-34 and a first wire 91-11*a*-3 are connected to each other in the pixel 1000-11*a*-3. A contact hole 91-11*a*-A-3 is connected to the first wire 91-11*a*-3.

In this manner, the pixel 1000-11*a*-2 can be driven by the first wire 91-11*a*-12 and the first wire 91-11*a*-2, while the pixel 1000-11*a*-3 can be driven by the first wire 91-11*a*-34 and the first wire 91-11*a*-3. Accordingly, the two pixels (pixel 1000-11*a*-2 and pixel 1000-11*a*-3) can be individually and independently driven.

A first pedestal 81-11*a* and a via 81-11*a*-A connected to the first pedestal 81-11*a* are provided as common components for the four pixels (1000-11*a*-1 to 1000-11*a*-4).

FIG. 11B will be referred to herein. FIG. 11B depicts four pixels 1000-11*b*-1 to 1000-11*b*-4 of the solid-state imaging element 1000-11.

A second wire 92-11*b*-12 is provided on upper parts of the pixel 1000-11*b*-1 and the pixel 1000-11*b*-2 (the upper side in FIG. 11B). The second wire 92-11*b*-12 and a second wire 92-11*b*-1 are connected to each other in the pixel 1000-11*b*-1. A contact hole 92-11*b*-A-1 is connected to the second wire 92-11*b*-1. In addition, a second wire 92-11*b*-2 is connected to a first wire (not depicted) through a contact hole 92-11*b*-A-2 in the pixel 1000-11*b*-2.

A second wire 92-11*b*-34 is provided on lower parts of the pixel 1000-11*b*-3 and the pixel 1000-11*b*-4 (the lower side in FIG. 11B). The second wire 92-11*b*-34 and a second wire 92-11*b*-4 are connected to each other in the pixel 1000-11*b*-4. A contact hole 92-11*b*-A-4 is connected to the second wire 92-11*b*-4. In addition, a second wire 92-11*b*-3 is connected to the first wire (not depicted) through a contact hole 92-11*b*-A-3 in the pixel 1000-11*b*-3.

In this manner, the pixel 1000-11*b*-1 can be driven by the second wire 92-11*b*-12 and the second wire 92-11*b*-1, while the pixel 1000-11*b*-4 can be driven by the second wire 92-11*b*-34 and the second wire 92-11*b*-4. Accordingly, the two pixels (pixel 1000-11*b*-1 and pixel 1000-11*b*-4) can be individually and independently driven.

A second pedestal 82-11*b* and a via 82-11*b*-A connected to the second pedestal 82-11*b* are provided as common components for the four pixels (1000-11*b*-1 to 1000-11*b*-4).

Optical waveguides 400-11*b*-1 to 400-11*b*-4, and inner lenses 500-11*b*-1 to 500-11*b*-4 are provided for each set of the four pixels 1000-11*b*-1 to 1000-11*b*-4.

FIG. 11C will be referred to herein. FIG. 11C depicts four pixels 1000-11*c*-1 to 1000-11*c*-4 of the solid-state imaging element 1000-11. Note that FIG. 11C depicts optical waveguides 400-11*c*-1 to 400-11*c*-4 for convenience.

A third electrode 9-11*c*-1 and a second wire 92-11*c*-1 are provided in the pixel 1000-11*c*-1. The third electrode 9-11*c*-1 and the second wire 92-11*c*-1 are connected to each other through a contact hole 92-11*c*-1-A. A third electrode 9-11*c*-2, a first wire 91-11*c*-2, and a second wire 92-11*c*-2 are provided in the pixel 1000-11*c*-2. The first wire 91-11*c*-2 and the second wire 92-11*c*-1 are connected to each other through a contact hole 91-11*c*-A-2. The third electrode 9-11*c*-2 and the second wire 92-11*c*-2 are connected to each other through a contact hole 92-11*c*-A-2. A third electrode 9-11*c*-3, a first wire 91-11*c*-3, and a second wire 92-11*c*-3 are provided in the pixel 1000-11c-3. The first wire 91-11c-3 and the second wire 92-11c-3 are connected to each other through a contact hole 91-11c-A-3. The third electrode 9-11c-3 and the second wire 92-11c-3 are connected to each other through a contact hole 92-11c-A-3. A third electrode 9-11c-4 and a second wire 92-11c-4 are provided in the pixel 1000-11c-4. The third electrode 9-11c-4 and the second wire 92-11c-4 are connected to each other through a contact hole 92-11c-A-4.

A second wire 92-11c-12 (first wire 91-11c-12) is sequentially provided from the light entrance side in upper parts of the pixel 1000-11c-1 and the pixel 1000-11c-2 (the upper side in FIG. 11C). The second wire 92-11c-12 and the second wire 92-11c-1 are connected to each other in the pixel 1000-11c-1. The first wire 91-11c-12 and the first wire 91-11c-2 are connected to each other in the pixel 1000-11c-2.

A second wire 92-9c-34 (first wire 91-11c-34) is sequentially provided from the light entrance side in lower parts of the pixel 1000-11c-3 and the pixel 1000-11c-4 (the lower side in FIG. 11C). The first wire 91-11c-34 and the first wire 91-11c-3 are connected to each other in the pixel 1000-11c-3. The second wire 92-11c-34 and the second wire 92-11c-4 are connected to each other in the pixel 1000-11c-4.

In this manner, the pixel 1000-11c-2 can be driven by the first wire 91-11c-12 and the first wire 91-11c-2, while the pixel 1000-11c-3 can be driven by the first wire 91-11c-34 and the first wire 91-11c-3. In addition, the pixel 1000-11c-1 can be driven by the second wire 92-11c-12 and the second wire 92-11c-1, while the pixel 1000-3-4 can be driven by the second wire 92-11c-34 and the second wire 92-11c-4. Accordingly, the four pixels (pixel 1000-11c-1 to pixel 1000-11c-4) can be individually and independently driven.

A first electrode 8-11c is provided as a common component for the four pixels (1000-11c-1 to 1000-11c-4). The first electrode is connected to a second pedestal 82-11c through a via 82-11c-A, and the second pedestal 82-11c is connected to a first pedestal 81-11c through a via 81-11c-A in the order from the light entrance side.

Figures 12A, 12B, 12C:
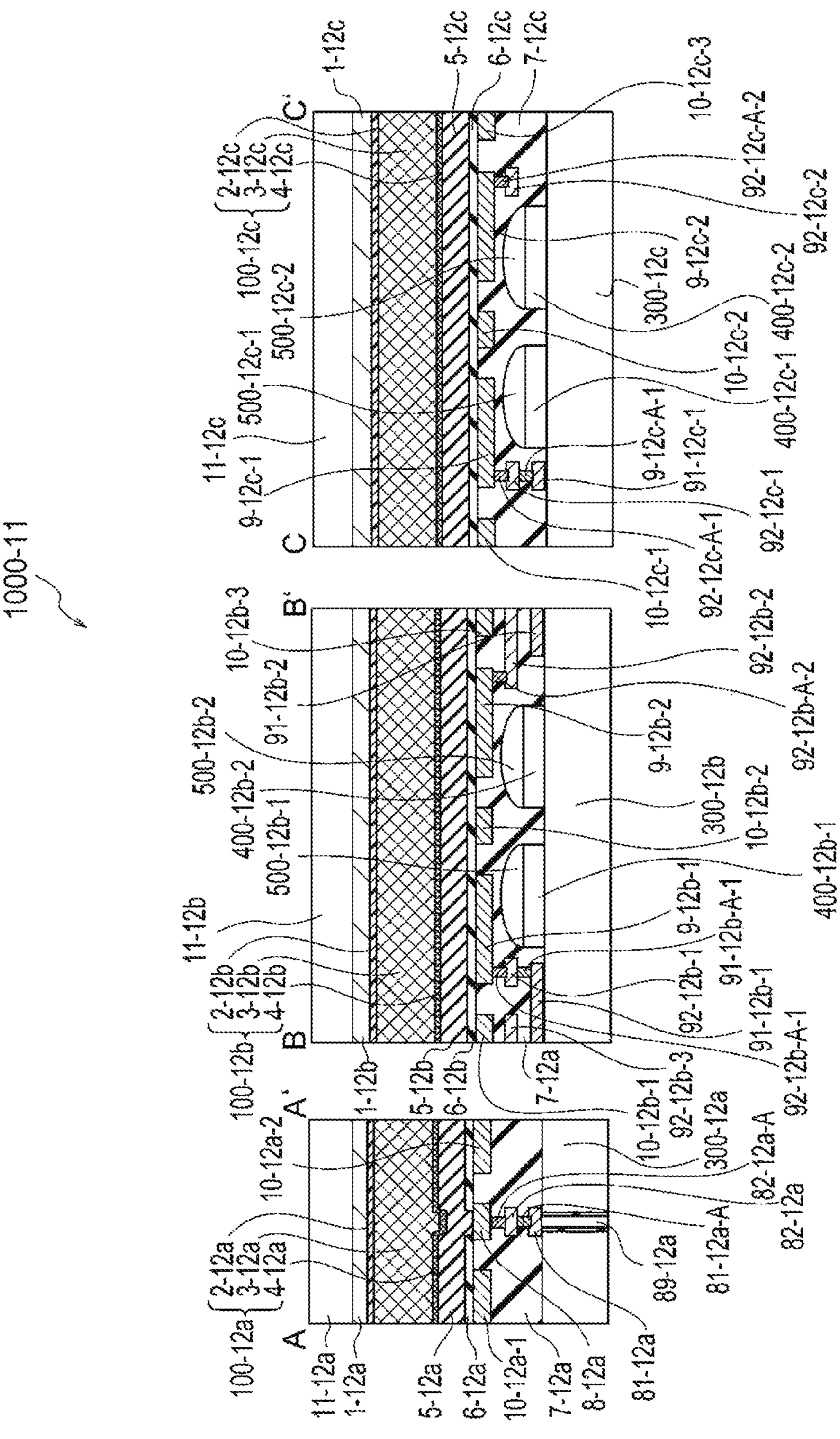
FIGS. 12A, 12B, and 12C illustrate cross-sectional diagrams depicting a configuration example of the solid-state imaging element of the fourth embodiment to which the present technology has been applied.

The solid-state imaging element 1000-11 according to the fourth embodiment of the present technology will be described with reference to FIGS. 12A 12B, and 12C. FIG. 12A is a cross-sectional diagram of the solid-state imaging element 1000-11 taken along a line A-A' in FIG. 11C, FIG. 12B is a cross-sectional diagram of the solid-state imaging element 1000-11 taken along a line B-B' in FIG. 11C, and FIG. 12C is a cross-sectional diagram of the solid-state imaging element 1000-11 taken along a line C-C' in FIG. 11C.

FIG. 12A will be referred to herein. In FIG. 12A, the solid-state imaging element 1000-11 includes at least a first electrode 8-12a, a second electrode 1-12a, a first photoelectric conversion unit 100-12a, a semiconductor layer 5-12a, a first insulation layer 6-12a, and a second insulation layer 7-12a. The first electrode 8-12a may be constituted by a transparent electrode.

The solid-state imaging element 1000-11 includes a protection layer 11-12a, the second electrode 1-12a, the first photoelectric conversion unit 100-12a, the semiconductor layer 5-12a, and the first electrode 8-12a disposed in this order from the light entrance side (the upper side in FIG. 12A). The first electrode 8-12a and two shields 10-12a-1 and 10-12a-2 are constituted by an identical layer.

In FIG. 12A, the first electrode 8-12a is connected to the second pedestal 82-12a through the via 82-12a-A. The second pedestal 82-12a is connected to the first pedestal 81-12a through the via 81-12a-A. Furthermore, the first pedestal 81-12a is connected to a through electrode 89-12a.

The first photoelectric conversion unit 100-12a is constituted by a second carrier blocking layer 2-12a, a photoelectric conversion layer (e.g., organic photoelectric conversion layer) 3-12a, and a first carrier blocking layer 4-12a.

The first photoelectric conversion unit 100-12a is provided on one surface side of a semiconductor substrate 300-12a (the light entrance side, the upper side in FIG. 12A).

FIG. 12B will be referred to herein. In FIG. 12B, the solid-state imaging element 1000-11 includes at least shields 10-12b-1 to 10-12b-3, a second electrode 1-12b, third electrodes 9-12b-1 and 9-12b-2, a first photoelectric conversion unit 100-12b, a semiconductor layer 5-12b, a first insulation layer 6-12b, a second insulation layer 7-12b, optical waveguides 400-12b-1 and 400-12b-2, and inner lenses 500-12b-1 and 500-12b-2. Each of the third electrodes 9-12b-1 and 9-12b-2 may be constituted by a transparent electrode.

The solid-state imaging element 1000-11 includes a protection layer 11-12b, the second electrode 1-12b, the first photoelectric conversion unit 100-12b, the semiconductor layer 5-12b, the shields 10-12b-1 to 10-12b-3, the inner lenses 500-12b-1 and 500-12b-2, and the optical waveguides 400-12b-1 and 400-12b-2 disposed in this order from the light entrance side (upper side in FIG. 12B).

The third electrodes 9-12b-1 and 9-12b-2 are provided away from a first electrode (not depicted), and faces the first photoelectric conversion unit 100-12b through the first insulation layer 6-12b. Each of the third electrodes 9-12b-1 and 9-12b-2 is a charge accumulation electrode similarly to the third electrodes 9-1-1 and 9-1-2 in FIG. 1. The first electrode 8-12b, the third electrodes 9-12b-1 and 9-12b-2, and the shields 10-12b-1, 10-12b-2, and 10-12b-3 are constituted by an identical layer.

In FIG. 12B, the third electrode 9-12b-1 is connected to the second wire 92-12b-1 through the contact hole 92-12b-A-1, while the second wire 92-12b-1 is connected to the first wire 91-12b-1 through the contact hole 91-12b-A-1. The third electrode 9-12b-2 is connected to the second wire 92-12b-2 through a contact hole 92-12b-A-2. The first wire 91-12b-2 and the second wire 92-12b-3 correspond to the first wire 91-6b and the second wire 92-6b depicted in FIG. 6B, respectively, and are wires provided between two pixels adjacent to each other in the column direction (the P direction in FIG. 6B). In addition, the second wire 92-12b-1, the second wire 92-12b-2, and the second wire 92-12b-3 are constituted by an identical layer, while the first wire 91-12b-1 and the first wire 91-12b-2 are constituted by an identical layer.

The second insulation layer 7-12b is provided between the third electrodes 9-12b-1 and 9-12b-2 and a semiconductor substrate 300-12b.

In FIG. 12B, the optical waveguides 400-12b-1 and 400-12b-2 are provided between the third electrodes 9-12b-1 and 9-12b-2 and the semiconductor substrate 300-12b.

In FIG. 12B, the inner lenses 500-12b-1 and 500-12b-2 are provided between the optical waveguides 400-12b-1 and 400-12b-2 and the third electrodes 9-12b-1 and 9-12b-2.

The first photoelectric conversion unit 100-12b is constituted by a second carrier blocking layer 2-12b, a photoelectric conversion layer (e.g., organic photoelectric conversion layer) 3-12b, and a first carrier blocking layer 4-12b.

The first photoelectric conversion unit 100-12b is provided on one surface side of the semiconductor substrate 300-12b (the light entrance side, the upper side in FIG. 12B).

FIG. 12C will be referred to herein. In FIG. 12C, the solid-state imaging element 1000-11 includes at least shields 10-12*c*-1 to 10-12*c*-3, a second electrode 1-12*c*, third electrodes 9-12*c*-1 and 9-12*c*-2, a first photoelectric conversion unit 100-12*c*, a semiconductor layer 5-12*c*, a first insulation layer 6-12*c*, a second insulation layer 7-12*c*, optical waveguides 400-12*c*-1 and 400-12*c*-2, and inner lenses 500-12*c*-1 and 500-12*c*-2. Each of the third electrodes 9-12*a*-1 and 9-12*c*-2 may be constituted by a transparent electrode.

The solid-state imaging element 1000-11 includes a protection layer 11-12*c*, the second electrode 1-12*c*, the first photoelectric conversion unit 100-12*c*, the semiconductor layer 5-12*c*, the shields 10-12*c*-1 to 10-12*c*-3, the inner lenses 500-12*c*-1 and 500-12*c*-2, and the optical waveguides 400-12*c*-1 and 400-12*c*-2 disposed in this order from the light entrance side (upper side in FIG. 12C).

The third electrodes 9-12*c*-1 and 9-12*c*-2 are provided away from a first electrode (not depicted), and faces the first photoelectric conversion unit 100-12*c* through the first insulation layer 6-12*c*. Each of the third electrodes 9-12*c*-1 and 9-12*c*-2 is a charge accumulation electrode similarly to the third electrodes 9-1-1 and 9-1-2 in FIG. 1. The first electrode 8-12*c*, the third electrodes 9-12*c*-1 and 9-12*c*-2, and the shields 10-12*c*-1, 10-12*c*-2, and 10-12*c*-3 are constituted by an identical layer.

In FIG. 12C, the third electrode 9-12*c*-1 is connected to a second wire 92-12*c*-1 through a contact hole 92-12*c*-A-1, while the second wire 92-12*c*-1 is connected to a wire 91-12*c*-1 through a contact hole 91-12*c*-A-1. The third electrode 9-12*c*-2 is connected to the second wire 92-12*c*-2 through a contact hole 92-12*c*-A-2. In addition, the second wire 92-12*c*-1 and the second wire 92-12*c*-2 are constituted by an identical layer.

The second insulation layer 7-12*c* is provided between the third electrodes 9-12*c*-1 and 9-12*c*-2 and a semiconductor substrate 300-12*c*.

In FIG. 12C, the optical waveguides 400-12*c*-1 and 400-12*c*-2 are provided between the third electrodes 9-12*c*-1 and 9-12*c*-2 and the semiconductor substrate 300-12*c*.

In FIG. 12C, the inner lenses 500-12*c*-1 and 500-12*c*-2 are provided between the optical waveguides 400-12*c*-1 and 400-12*c*-2 and the third electrodes 9-12*c*-1 and 9-12*c*-2.

The first photoelectric conversion unit 100-12*c* is constituted by a second carrier blocking layer 2-12*c*, a photoelectric conversion layer (e.g., organic photoelectric conversion layer) 3-12*c*, and a first carrier blocking layer 4-12*c*.

The first photoelectric conversion unit 100-12*c* is provided on one surface side of the semiconductor substrate 300-12*c* (the light entrance side, the upper side in FIG. 12C).

5. Fifth Embodiment (Example 5 of Solid-State Imaging Element)

A solid-state imaging element according to a fifth embodiment of the present technology is a solid-state imaging element which includes at least a first electrode, a second electrode, a third electrode, a first photoelectric conversion unit, a second photoelectric conversion unit, a first insulation layer, a second insulation layer, an optical waveguide, and at least one wire connecting to the third electrode. According to the solid-state imaging element of the fifth embodiment of the present technology, the second electrode, the first photoelectric conversion unit, and the first electrode are disposed in this order. The third electrode is provided away from the first electrode and faces the first photoelectric conversion unit through the first insulation layer. The second insulation layer is provided between the third electrode and the second photoelectric conversion unit. In addition, the optical waveguide is provided between the third electrode and the second photoelectric conversion unit. Furthermore, according to the solid-state imaging element of the fifth embodiment of the present technology, the at least one wire connecting to the third electrode includes a transparent material. The at least one wire and the optical waveguide are disposed in this order from the light entrance side.

Accordingly, the solid-state imaging element of the fifth embodiment of the present technology includes the at least one wire including a transparent material and added to the solid-state imaging element of the first embodiment. The at least one wire and the optical waveguide are disposed in this order from the light entrance side.

Figures 13A, 13B, 13C:
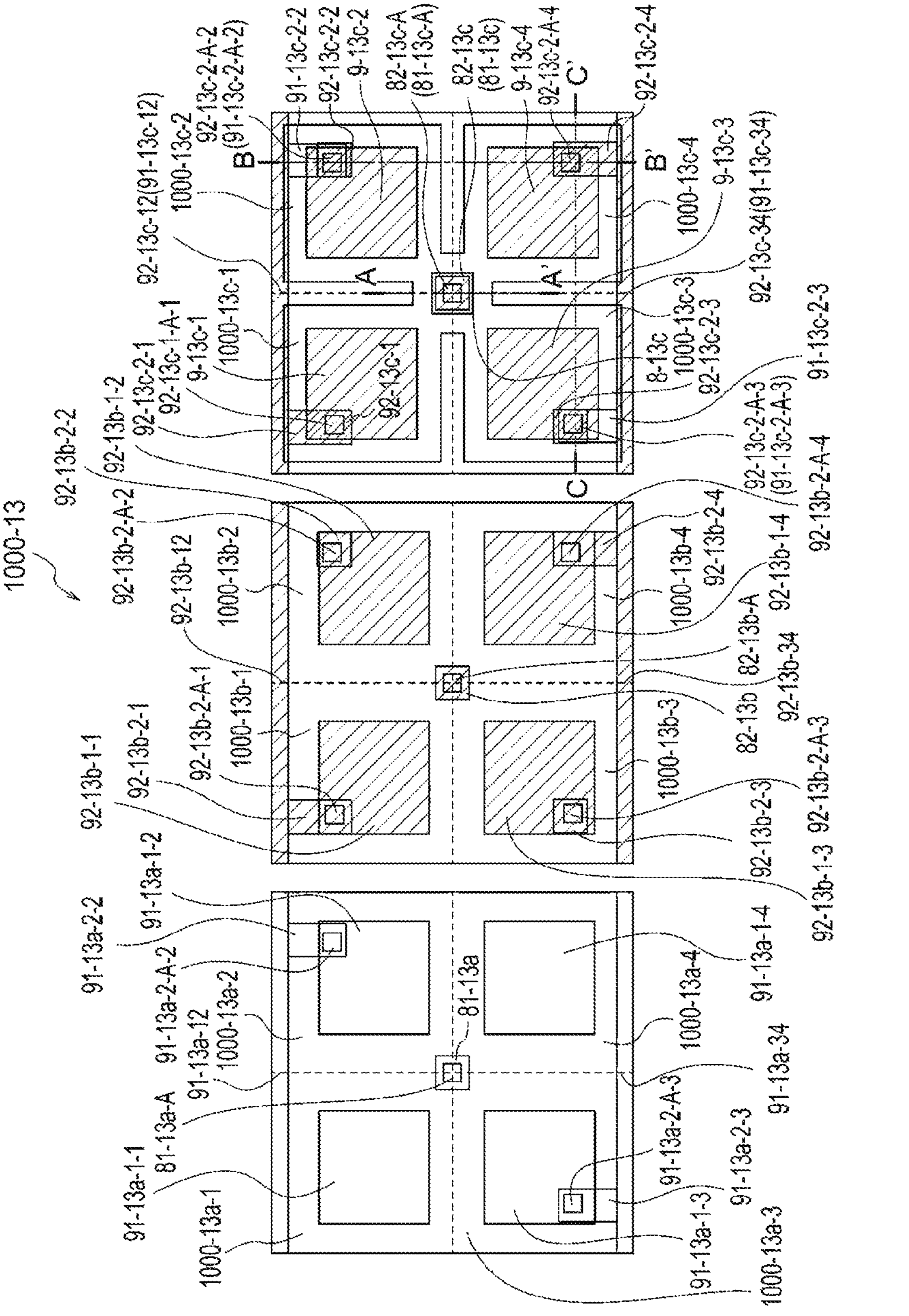
FIGS. 13A, 13B, and 13C illustrate plan diagrams for explaining a solid-state imaging element of a fifth embodiment to which the present technology has been applied.

A solid-state imaging element 1000-13 according to the fifth embodiment of the present technology will be described with reference to FIGS. 13A 13B, and 13C. FIG. 13A is a diagram depicting a planar layout of a first pedestal 81-14*a*, a via 81-14*a*-A, a first wire 91-14*b*-1, a contact hole 91-14*b*-A-1 and the like constituted by an identical layer in four pixels of the solid-state imaging element 1000-13 depicted in FIGS. 14A, 14B, and 14C. FIG. 13B is a diagram depicting a planar layout of a second pedestal 82-14*a*, a via 82-14*a*-A, a second wire 92-14*b*-1, a contact hole 92-14*b*-A-1 and the like constituted by an identical layer in four pixels of the solid-state imaging element 1000-13 depicted in FIGS. 14A, 14B, and 14C. FIG. 13C is a diagram depicting a planar layout of a first electrode 8-14*a*, a shield 10-14*a*-1, a third electrode 9-14*b*-1 and the like constituted by an identical layer in four pixels of the solid-state imaging element 1000-13 depicted in FIGS. 14A, 14B, and 14C.

FIG. 13A will be referred to herein. FIG. 13A depicts four pixels 1000-13*a*-1 to 1000-13*a*-4 of the solid-state imaging element 1000-13.

A first transparent wire 91-13*a*-12 is provided on upper parts of the pixel 1000-13*a*-1 and the pixel 1000-13*a*-2 (the upper side in FIG. 13A). The first transparent wire 91-13*a*-12 (hereinafter simply referred to first wire 91-13*a*-12 in some cases), and a first transparent wire 91-13*a*-2-2 (hereinafter simply referred to as first wire 91-13*a*-2-2 in some cases) are connected to each other in the pixel 1000-13*a*-2. A contact hole 91-13*a*-2-A-2 is connected to the first transparent wire 91-13*a*-2-2.

A first transparent wire 91-13*a*-34 (hereinafter simply referred to as first wire 91-13*a*-34 in some cases) is provided in lower parts of the pixel 1000-13*a*-3 and the pixel 1000-13*a*-4 (the lower side in FIG. 13A). The first transparent wire 91-13*a*-34 and a first transparent wire 91-13*a*-2-3 (hereinafter simply referred to as first wire 91-13*a*-2-3 in some cases) are connected to each other in the pixel 1000-13*a*-3. A contact hole 91-13*a*-2-A-3 is connected to the first transparent wire 91-13*a*-2-3.

In addition, the first transparent wire 91-13*a*-1-1 to the first transparent wire 91-13*a*-1-4 are provided for each of the four pixels 1000-13*a*-1 to 1000-13*a*-4. The first transparent wire 91-13*a*-1-2 is connected to the first transparent wire 91-13*a*-2-2, while the first transparent wire 91-13*a*-1-3 is connected to the first transparent wire 91-13*a*-2-3. The transparent wire does not shield light. Accordingly, the transparent wire 91-13*a*-1-1 to the transparent wire 91-13*a*-1-4 can be routed throughout the pixel for each of the four pixels 1000-13*a*-1 to 1000-13*a*-4.

In this manner, the pixel 1000-13*a*-2 can be driven by the first transparent wire 91-13*a*-12 and the first transparent wire 91-13*a*-2-2, while the pixel 1000-13*a*-3 can be driven by the first transparent wire 91-13*a*-34 and the first wire 91-13*a*-

2-3. Accordingly, the two pixels (pixel 1000-13*a*-2 and pixel 1000-13*a*-3) can be individually and independently driven.

A first pedestal 81-13*a* and a via 81-13*a*-A connected to the first pedestal 81-13*a* are provided as common components for the four pixels (1000-13*a*-1 to 1000-13*a*-4).

FIG. 13B will be referred to herein. FIG. 13B depicts four pixels 1000-13*b*-1 to 1000-13*b*-4 of the solid-state imaging element 1000-13.

A second transparent wire 92-13*b*-12 is provided on upper parts of the pixel 1000-13*b*-1 and the pixel 1000-13*b*-2 (the upper side in FIG. 13B). The second transparent wire 92-13*b*-12 and a second transparent wire 92-13*b*-2-1 are connected to each other in the pixel 1000-13*b*-1. A contact hole 92-13*b*-2-A-1 is connected to the second transparent wire 92-13*b*-2-1.

A second transparent wire 92-13*b*-34 is provided on lower parts of the pixel 1000-13*b*-3 and the pixel 1000-13*b*-4 (the lower side in FIG. 13B). The second transparent wire 92-13*b*-34 and a second transparent wire 92-13*b*-2-4 are connected to each other in the pixel 1000-13*b*-4. A contact hole 92-13*b*-2-A-4 is connected to the second transparent wire 92-13*b*-2-4.

In addition, the second transparent wire 92-13*b*-1-1 to the second transparent wire 92-13*b*-1-4 are provided for each of the four pixels 1000-13*b*-1 to 1000-13*b*-4. The second transparent wire 91-13*b*-1-1 is connected to the second transparent wire 92-13*b*-2-1, while the second transparent wire 91-13*b*-1-4 is connected to the second transparent wire 92-13*b*-2-4. The transparent wire does not shield light. Accordingly, the transparent wire 91-13*b*-1-1 to the transparent wire 91-13*b*-1-4 can be routed throughout the pixel for each of the four pixels 1000-13*b*-1 to 1000-13*b*-4.

In this manner, the pixel 1000-13*b*-1 can be driven by the second transparent wire 92-13*b*-12 and the second transparent wire 92-13*b*-2-1, while the pixel 1000-13*b*-4 can be driven by the second transparent wire 92-13*b*-34 and the second transparent wire 92-13*b*-2-4. Accordingly, the two pixels (pixel 1000-13*b*-2 and pixel 1000-13*b*-4) can be individually and independently driven.

A second pedestal 82-13*b* and a via 82-13*b*-A connected to the second pedestal 82-13*b* are provided as common components for the four pixels (1000-13*b*-1 to 1000-13*b*-4).

FIG. 13C will be referred to herein. FIG. 13C depicts four pixels 1000-13*c*-1 to 1000-13*c*-4 of the solid-state imaging element 1000-13. Note that FIG. 13C depicts optical waveguides 400-13*c*-1 to 400-13*c*-4 for convenience.

A third electrode 9-13*c*-1 and a second transparent wire 92-13*c*-2-1 are provided in the pixel 1000-13*c*-1. The third electrode 9-13*c*-1 and the second transparent wire 92-13*c*-2-1 are connected to each other through a contact hole 92-13*c*-1-A-1. A third electrode 9-13*c*-2, a first transparent wire 91-13*c*-2-2, and a second transparent wire 92-13*c*-2-2 are provided in the pixel 1000-13*c*-2. The first transparent wire 91-13*c*-2-2 and the second transparent wire 92-13*c*-2-2 are connected to each other through a contact hole 91-13*c*-2-A-2. The third electrode 9-13*c*-2 and the second transparent wire 92-13*c*-2-2 are connected to each other through a contact hole 92-13*c*-2-A-2. A third electrode 9-13*c*-3, a first transparent wire 91-13*c*-2-3, and a second transparent wire 92-13*c*-2-3 are provided in the pixel 1000-13*c*-3. The first transparent wire 91-13*c*-2-3 and the second transparent wire 92-13*c*-2-3 are connected to each other through a contact hole 91-13*c*-2-A-3. The third electrode 9-13*c*-3 and the second transparent wire 92-13*c*-2-3 are connected to each other through a contact hole 92-13*c*-2-A-3. A third electrode 9-13*c*-4 and a second transparent wire 92-13*c*-2-4 are provided in the pixel 1000-13*c*-4. The third electrode 9-13*c*-4 and the second transparent wire 92-13*c*-2-4 are connected to each other through a contact hole 92-13*c*-2-A-4.

A second transparent wire 92-13*c*-12 (first transparent wire 91-13*c*-12) is sequentially provided from the light entrance side in upper parts of the pixel 1000-13*c*-1 and the pixel 1000-13*c*-2 (the upper side in FIG. 13C). The second transparent wire 92-13*c*-12 and the second transparent wire 92-13*c*-1 are connected to each other in the pixel 1000-13*c*-1. The first transparent wire 91-13*c*-12 and the first transparent wire 91-13*c*-2 are connected to each other in the pixel 1000-13*c*-2.

A second transparent wire 92-13*c*-34 (first transparent wire 91-13*c*-34) is sequentially provided from the light entrance side in lower parts of the pixel 1000-13*c*-3 and the pixel 1000-13*c*-4 (the lower side in FIG. 13C). The first transparent wire 91-13*c*-34 and the first transparent wire 91-13*c*-3 are connected to each other in the pixel 1000-13*c*-3. The second transparent wire 92-13*c*-34 and the second transparent wire 92-13*c*-4 are connected to each other in the pixel 1000-13*c*-4.

In this manner, the pixel 1000-13*c*-2 can be driven by the first transparent wire 91-13*c*-12 and the first transparent wire 91-13*c*-2-2, while the pixel 1000-13*c*-3 can be driven by the first transparent wire 91-13*c*-34 and the first transparent wire 91-13*c*-2-3. In addition, the pixel 1000-13*c*-1 can be driven by the second transparent wires 92-13*c*-12 and 92-13*c*-2-1, while the pixel 1000-3-4 can be driven by the second transparent wire 92-13*c*-34 and the second transparent wire 92-13*c*-2-4. Accordingly, the four pixels (pixel 1000-13*c*-1 to pixel 1000-13*c*-4) can be individually and independently driven.

A first electrode 8-13*c* is provided as a common component for the four pixels (1000-13*c*-1 to 1000-13*c*-4). The first electrode is connected to a second pedestal 82-13*c* through a via 82-13*c*-A, and the second pedestal 82-13*c* is connected to a first pedestal 81-13*c* through a via 81-13*c*-A in the order from the light entrance side.

Figures 14A, 14B, 14C:
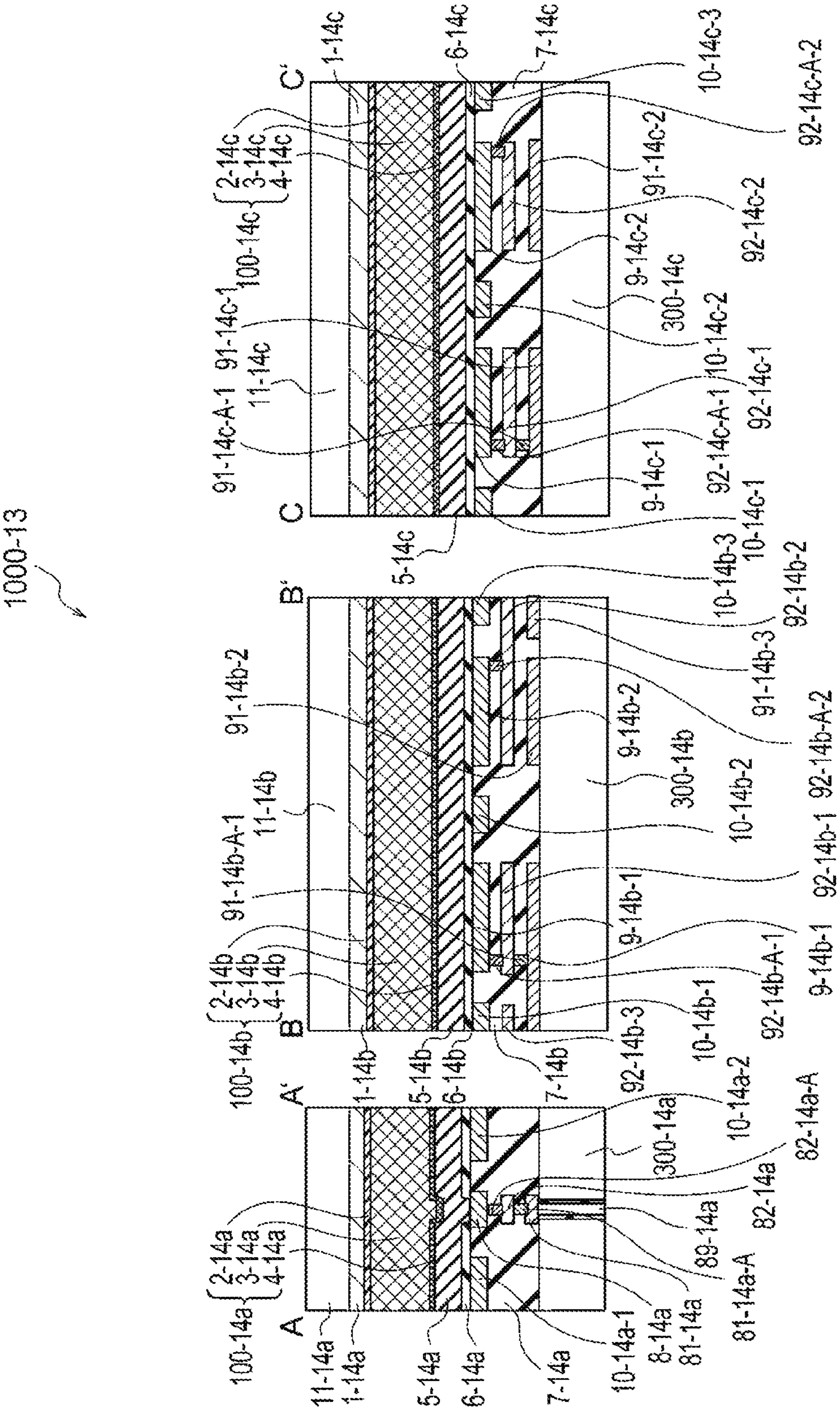
FIGS. 14A, 14B, and 14C illustrate cross-sectional diagrams for explaining the solid-state imaging element of the fifth embodiment to which the present technology has been applied.

The solid-state imaging element 1000-13 according to the fifth embodiment of the present technology will be described with reference to FIGS. 14A 14B, and 14C. FIG. 14A is a cross-sectional diagram of the solid-state imaging element 1000-13 taken along a line A-A' in FIG. 13C, FIG. 14B is a cross-sectional diagram of the solid-state imaging element 1000-13 taken along a line B-B' in FIG. 13C, and FIG. 14C is a cross-sectional diagram of the solid-state imaging element 1000-13 taken along a line C-C' in FIG. 13C.

FIG. 14A will be referred to herein. In FIG. 14A, the solid-state imaging element 1000-13 includes at least a first electrode 8-14*a*, a second electrode 1-14*a*, a first photoelectric conversion unit 100-14*a*, a semiconductor layer 5-14*a*, a first insulation layer 6-14*a*, and a second insulation layer 7-14*a*. The first electrode 8-14*a* may be constituted by a transparent electrode.

The solid-state imaging element 1000-13 includes a protection layer 11-14*a*, the second electrode 1-14*a*, the first photoelectric conversion unit 100-14*a*, the semiconductor layer 5-14*a*, and the first electrode 8-14*a* disposed in this order from the light entrance side (the upper side in FIG. 14A). The first electrode 8-14*a* and two shields 10-14*a*-1 and 10-14*a*-2 are constituted by an identical layer.

In FIG. 14A, the first electrode 8-14*a* is connected to the second pedestal 82-14*a* through the via 82-14*a*-A. The second pedestal 82-14*a* is connected to the first pedestal 81-14*a* through the via 81-14*a*-A. Furthermore, the first pedestal 81-14*a* is connected to a through electrode 89-14*a*.

The first photoelectric conversion unit 100-14*a* is constituted by a second carrier blocking layer 2-14*a*, a photoelectric conversion layer (e.g., organic photoelectric conversion layer) 3-14*a*, and a first carrier blocking layer 4-14*a*.

The first photoelectric conversion unit 100-14*a* is provided on one surface side of a semiconductor substrate 300-14*a* (the light entrance side, the upper side in FIG. 14A).

FIG. 14B will be referred to herein. In FIG. 14B, the solid-state imaging element 1000-13 includes at least shields 10-14*b*-1 to 10-14*b*-3, a second electrode 1-14*b*, third electrodes 9-14*b*-1 and 9-14*b*-2, a first photoelectric conversion unit 100-14*b*, a semiconductor layer 5-14*b*, a first insulation layer 6-14*b*, and a second insulation layer 7-14*b*. Each of the third electrodes 9-14*b*-1 and 9-14*b*-2 may be constituted by a transparent electrode.

The solid-state imaging element 1000-13 includes a protection layer 11-14*b*, the second electrode 1-14*b*, the first photoelectric conversion unit 100-14*b*, the semiconductor layer 5-14*b*, and the shields 10-14*b*-1 to 10-14*b*-3 disposed in this order from the light entrance side (the upper side in FIG. 14B).

The third electrodes 9-14*b*-1 and 9-14*b*-2 are provided away from a first electrode (not depicted), and faces the first photoelectric conversion unit 100-14*b* through the first insulation layer 6-14*b*. Each of the third electrodes 9-14*b*-1 and 9-14*b*-2 is a charge accumulation electrode similarly to the third electrodes 9-1-1 and 9-1-2 in FIG. 1. The third electrodes 9-14*b*-1 and 9-14*b*-2, and the shields 10-14*b*-1, 10-14*b*-2, and 10-14*b*-3 are constituted by an identical layer.

In FIG. 14B, the third electrode 9-14*b*-1 is connected to the second wire 92-14*b*-1 through the contact hole 92-14*b*-A-1, while the second wire 92-14*b*-1 is connected to the first wire 91-14*b*-1 through the contact hole 91-14*b*-A-1. The third electrode 9-14*b*-2 is connected to the second wire 92-14*b*-2 through a contact hole 92-14*b*-A-2. The first wire 91-14*b*-3 and the second wire 92-14*b*-3 correspond to the first wire 91-6*b* and the second wire 92-6*b* depicted in FIG. 6B, respectively, and are wires provided between two pixels adjacent to each other in the column direction (the P direction in FIG. 6B). In addition, the second wire 92-14*b*-1, the second wire 92-14*b*-2, and the second wire 92-14*b*-3 are constituted by an identical layer, while the first wire 91-14*b*-1, the first wire 91-14*b*-2, and the first wire 91-14*b*-3 are constituted by an identical layer. Each of the second wire 92-14*b*-1 and the second wire 92-14*b*-2, and the first wire 91-14*b*-1 and the first wire 91-14*b*-2 is a transparent wire and does not shield light. Accordingly, the wire area can be enlarged by providing the wires throughout the pixels, for example.

The second insulation layer 7-14*b* is provided between the third electrodes 9-14*b*-1 and 9-14*b*-2 and a semiconductor substrate 300-14*b*.

The first photoelectric conversion unit 100-14*b* is constituted by a second carrier blocking layer 2-14*b*, a photoelectric conversion layer (e.g., organic photoelectric conversion layer) 3-14*b*, and a first carrier blocking layer 4-14*b*.

The first photoelectric conversion unit 100-14*b* is provided on one surface side of a semiconductor substrate 300-14*b* (the light entrance side, the upper side in FIG. 14B).

FIG. 14C will be referred to herein. In FIG. 14C, the solid-state imaging element 1000-13 includes at least shields 10-14*c*-1 to 10-14*c*-3, a second electrode 1-14*c*, third electrodes 9-14*c*-1 and 9-14*c*-2, a first photoelectric conversion unit 100-14*c*, a semiconductor layer 5-14*c*, a first insulation layer 6-14*c*, and a second insulation layer 7-14*c*. Each of the third electrodes 9-14*c*-1 and 9-14*c*-2 may be constituted by a transparent electrode.

The solid-state imaging element 1000-13 includes a protection layer 11-14*c*, the second electrode 1-14*c*, the first photoelectric conversion unit 100-14*c*, the semiconductor layer 5-14*c*, and the shields 10-14*c*-1 to 10-14*c*-3 disposed in this order from the light entrance side (the upper side in FIG. 14C).

The third electrodes 9-14*c*-1 and 9-14*c*-2 are provided away from a first electrode (not depicted), and faces the first photoelectric conversion unit 100-14*c* through the first insulation layer 6-14*c*. Each of the third electrodes 9-14*c*-1 and 9-14*c*-2 is a charge accumulation electrode similarly to the third electrodes 9-1-1 and 9-1-2 in FIG. 1. The third electrodes 9-14*c*-1 and 9-14*c*-2, and the shields 10-14*c*-1, 10-14*c*-2, and 10-14*c*-3 are constituted by an identical layer.

In FIG. 14C, the third electrode 9-14*c*-1 is connected to the second wire 92-14*c*-1 through a contact hole 92-14*c*-A-1, while the second wire 92-14*c*-1 is connected to the first wire 91-14*c*-1 through a contact hole 91-14*c*-A-1. The third electrode 9-14*c*-2 is connected to the second wire 92-14*c*-2 through a contact hole 92-14*c*-A-2. In addition, the second wire 92-14*c*-1 and the second wire 92-14*c*-2 are constituted by an identical layer, while the first wire 91-14*c*-1 and the first wire 91-14*c*-2 are constituted by an identical layer. Each of the second wire 92-14*c*-1 and the second wire 92-14*c*-2, and the first wire 91-14*c*-1 and the first wire 91-14*c*-2 is a transparent wire and does not shield light. Accordingly, the wire area can be enlarged by providing the wires throughout the pixels, for example.

The second insulation layer 7-14*c* is provided between the third electrodes 9-14*c*-1 and 9-14*c*-2 and a semiconductor substrate 300-14*c*.

The first photoelectric conversion unit 100-14*c* is constituted by a second carrier blocking layer 2-14*c*, a photoelectric conversion layer (e.g., organic photoelectric conversion layer) 3-14*c*, and a first carrier blocking layer 4-14*c*.

The first photoelectric conversion unit 100-14*c* is provided on one surface side of the semiconductor substrate 300-14*c* (the light entrance side, the upper side in FIG. 14C).

Figures 15A, 15B, 15C:
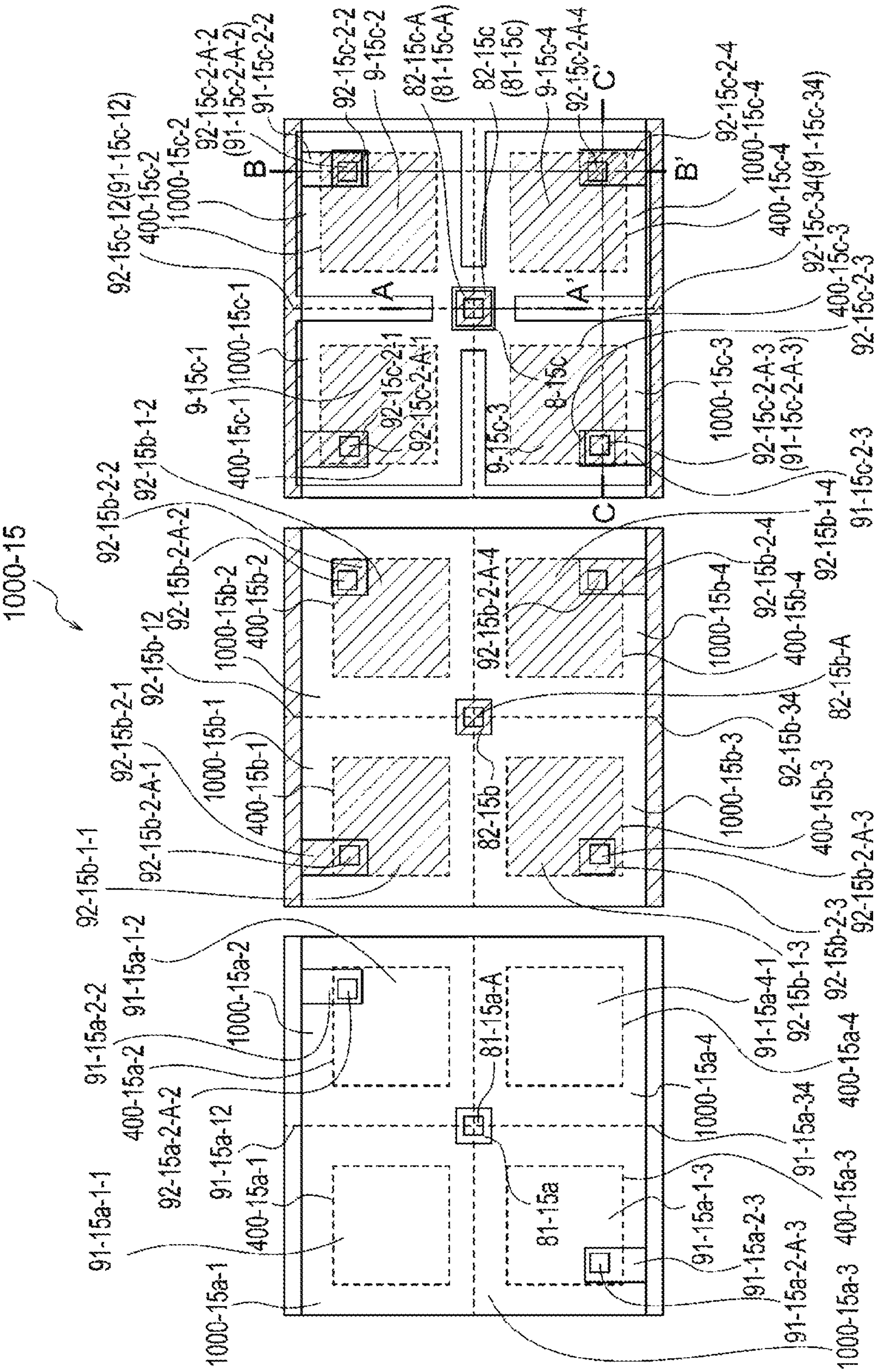
FIGS. 15A, 15B, and 15C illustrate plan diagrams depicting a configuration example of the solid-state imaging element of the fifth embodiment to which the present technology has been applied.

A solid-state imaging element 1000-15 according to the fifth embodiment of the present technology will be described with reference to FIGS. 15A 15B, and 15C. FIG. 15A is a diagram depicting a planar layout of a first pedestal 81-16*a*, a via 81-16*a*-A, a first wire 91-16*b*-1, a contact hole 91-16*b*-A-1 and the like constituted by an identical layer in four pixels of the solid-state imaging element 1000-15 depicted in FIGS. 16A, 16B, and 16C. FIG. 15B is a diagram depicting a planar layout of a second pedestal 82-16*a*, a via 82-16*a*-A, a second wire 92-16*b*-1, a contact hole 92-16*b*-A-1 and the like constituted by an identical layer in four pixels of the solid-state imaging element 1000-15 depicted in FIGS. 16A, 16B, and 16C. FIG. 15C is a diagram depicting a planar layout of a first electrode 8-16*a*, a shield 10-16*a*-1, a third electrode 9-16*b*-1 and the like constituted by an identical layer in four pixels of the solid-state imaging element 1000-15 depicted in FIGS. 16A, 16B, and 16C.

FIG. 15A will be referred to herein. FIG. 15A depicts four pixels 1000-15*a*-1 to 1000-15*a*-4 of the solid-state imaging element 1000-15. Note that FIG. 15A depicts optical waveguides 400-15*a*-1 to 400-15*a*-4 for convenience.

A first transparent wire 91-15*a*-12 is provided on upper parts of the pixel 1000-15*a*-1 and the pixel 1000-15*a*-2 (the upper side in FIG. 15A). The first transparent wire 91-15*a*-12 and a first transparent wire 91-15*a*-2-2 are connected to each other in the pixel 1000-15*a*-2. A contact hole 91-15*a*-2-A-2 is connected to the first transparent wire 91-15*a*-2-2.

A first transparent wire 91-15*a*-34 is provided on lower parts of the pixel 1000-15*a*-3 and the pixel 1000-15*a*-4 (the lower side in FIG. 15A). The first transparent wire 91-15*a*-34 and a first transparent wire 91-15*a*-2-3 are connected to each other in the pixel 1000-15*a*-3. A contact hole 91-15*a*-2-A-3 is connected to the first transparent wire 91-15*a*-2-3.

In addition, first transparent wire 91-15*a*-1-1 to the first transparent wire 91-15*a*-1-4 are provided for each of the four pixels 1000-15*a*-1 to 1000-15*a*-4. The first transparent wire 91-15*a*-1-2 is connected to the first transparent wire 91-15*a*-2-2, while the second transparent wire 91-15*a*-1-3 is connected to the first transparent wire 91-15*a*-2-3.

The transparent wire does not shield light. Accordingly, the transparent wire 91-15*a*-1-1 to the transparent wire 91-15*a*-1-4 can be routed throughout the pixel for each of the four pixels 1000-15*a*-1 to 1000-15*a*-4.

In this manner, the pixel 1000-15*a*-2 can be driven by the first transparent wire 91-15*a*-12 and the first transparent wire 91-15*a*-1-2, while the pixel 1000-15*a*-3 can be driven by the first transparent wire 91-15*a*-34 and the first transparent wire 91-15*a*-2-3. Accordingly, the two pixels (pixel 1000-15*a*-2 and pixel 1000-15*a*-3) can be individually and independently driven.

A first pedestal 81-15*a* and a via 81-15*a*-A connected to the first pedestal 81-15*a* are provided as common components for the four pixels (1000-15*a*-1 to 1000-15*a*-4).

FIG. 15B will be referred to herein. FIG. 15B depicts four pixels 1000-15*b*-1 to 1000-15*b*-4 of the solid-state imaging element 1000-15. Note that FIG. 15B depicts optical waveguides 400-15*b*-1 to 400-15*b*-4 for convenience.

A second transparent wire 92-15*b*-12 is provided on upper parts of the pixel 1000-15*b*-1 and the pixel 1000-15*b*-2 (the upper side in FIG. 15B). The second transparent wire 92-15*b*-12 and a second transparent wire 92-15*b*-2-1 are connected to each other in the pixel 1000-15*b*-1. A contact hole 92-15*b*-2-A-1 is connected to the second transparent wire 92-15*b*-2-1.

A second transparent wire 92-15*b*-34 is provided on lower parts of the pixel 1000-15*b*-3 and the pixel 1000-15*b*-4 (the lower side in FIG. 15B). The second transparent wire 92-15*b*-34 and a second transparent wire 92-15*b*-2-4 are connected to each other in the pixel 1000-15*b*-4. A contact hole 92-15*b*-2-A-4 is connected to the second transparent wire 92-15*b*-2-4.

In addition, the second transparent wire 92-15*b*-1-1 to the second transparent wire 92-15*b*-1-4 are provided for each of the four pixels 1000-15*b*-1 to 1000-15*b*-4. The second transparent wire 91-15*b*-1-1 is connected to the second transparent wire 92-15*b*-2-1, while the second transparent wire 91-15*b*-1-4 is connected to the second transparent wire 92-15*b*-2-4. The transparent wire does not shield light. Accordingly, the transparent wire 91-13*b*-1-1 to the transparent wire 91-13*b*-1-4 can be routed throughout the pixel for each of the four pixels 1000-13*b*-1 to 1000-13*b*-4.

In this manner, the pixel 1000-15*b*-1 can be driven by the second transparent wire 92-15*b*-12 and the second transparent wire 92-15*b*-2-1, while the pixel 1000-15*b*-4 can be driven by the second transparent wire 92-15*b*-34 and the second transparent wire 92-15*b*-2-4. Accordingly, the two pixels (pixel 1000-15*b*-1 and pixel 1000-15*b*-4) can be individually and independently driven.

A second pedestal 82-13*b* and a via 82-13*b*-A connected to the second pedestal 82-13*b* are provided as common components for the four pixels (1000-13*b*-1 to 1000-13*b*-4).

FIG. 15C will be referred to herein. FIG. 15C depicts four pixels 1000-15*c*-1 to 1000-15*c*-4 of the solid-state imaging element 1000-15. Note that FIG. 15C depicts optical waveguides 400-15*c*-1 to 400-15*c*-4 for convenience.

A third electrode 9-15*c*-1 and a second transparent wire 92-15*c*-2-1 are provided in the pixel 1000-15*c*-1. The third electrode 9-15*c*-1 and the second transparent wire 92-15*c*-2-1 are connected to each other through a contact hole 92-15*c*-2-A-1. A third electrode 9-15*c*-2, a first transparent wire 91-15*c*-2-2, and a second transparent wire 92-15*c*-2-2 are provided in the pixel 1000-15*c*-2. The first transparent wire 91-15*c*-2-2 and the second transparent wire 92-15*c*-2-2 are connected to each other through a contact hole 91-15*c*-2-A-2. The third electrode 9-15*c*-2 and the second transparent wire 92-15*c*-2-2 are connected to each other through a contact hole 92-15*c*-2-A-2. A third electrode 9-15*c*-3, a first transparent wire 91-15*c*-2-3, and a second transparent wire 92-15*c*-2-3 are provided in the pixel 1000-15*c*-3. The first transparent wire 91-15*c*-2-3 and the second transparent wire 92-15*c*-2-3 are connected to each other through a contact hole 91-15*c*-2-A-3. The third electrode 9-15*c*-3 and the second transparent wire 92-15*c*-2-3 are connected to each other through a contact hole 92-15*c*-2-A-3. A third electrode 9-15*c*-4 and a second transparent wire 92-15*c*-2-4 are provided in the pixel 1000-15*c*-4. The third electrode 9-15*c*-4 and the second transparent wire 92-15*c*-2-4 are connected to each other through a contact hole 92-15*c*-2-A-4.

A second transparent wire 92-15*c*-12 (first transparent wire 91-15*c*-12) is sequentially provided from the light entrance side in upper parts of the pixel 1000-15*c*-1 and the pixel 1000-15*c*-2 (the upper side in FIG. 15C). The second transparent wire 92-15*c*-12 and the second transparent wire 92-15*c*-2-1 are connected to each other in the pixel 1000-15*c*-1. The first transparent wire 91-15*c*-12 and the first transparent wire 91-15*c*-2-2 are connected to each other in the pixel 1000-15*c*-2.

A second transparent wire 92-15*c*-34 (first transparent wire 91-15*c*-34) is sequentially provided from the light entrance side in lower parts of the pixel 1000-15*c*-3 and the pixel 1000-15*c*-4 (the lower side in FIG. 15C). The first transparent wire 91-15*c*-34 and the first transparent wire 91-15*c*-3 are connected to each other in the pixel 1000-15*c*-3. The second transparent wire 92-15*c*-34 and the second transparent wire 92-15*c*-4 are connected to each other in the pixel 1000-15*c*-4.

In this manner, the pixel 1000-15*c*-2 can be driven by the first transparent wire 91-15*c*-12 and the first transparent wire 91-15*c*-2-2, while the pixel 1000-15*c*-3 can be driven by the first transparent wire 91-15*c*-34 and the first transparent wire 91-15*c*-2-3. In addition, the pixel 1000-15*c*-1 can be driven by the second transparent wire 92-15*c*-12 and the second transparent wire 92-15*c*-2-1, while the pixel 1000-3-4 can be driven by the second transparent wire 92-15*c*-34 and the second transparent wire 92-15*c*-2-4. Accordingly, the four pixels (pixel 1000-15*c*-1 to pixel 1000-15*c*-4) can be individually and independently driven.

A first electrode 8-15*c* is provided as a common component for the four pixels (1000-15*c*-1 to 1000-15*c*-4). The first electrode is connected to a second pedestal 82-15*c* through a via 82-15*c*-A, and the second pedestal 82-15*c* is connected to a first pedestal 81-15*c* through a via 81-15*c*-A in the order from the light entrance side.

Figures 16A, 16B, 16C:
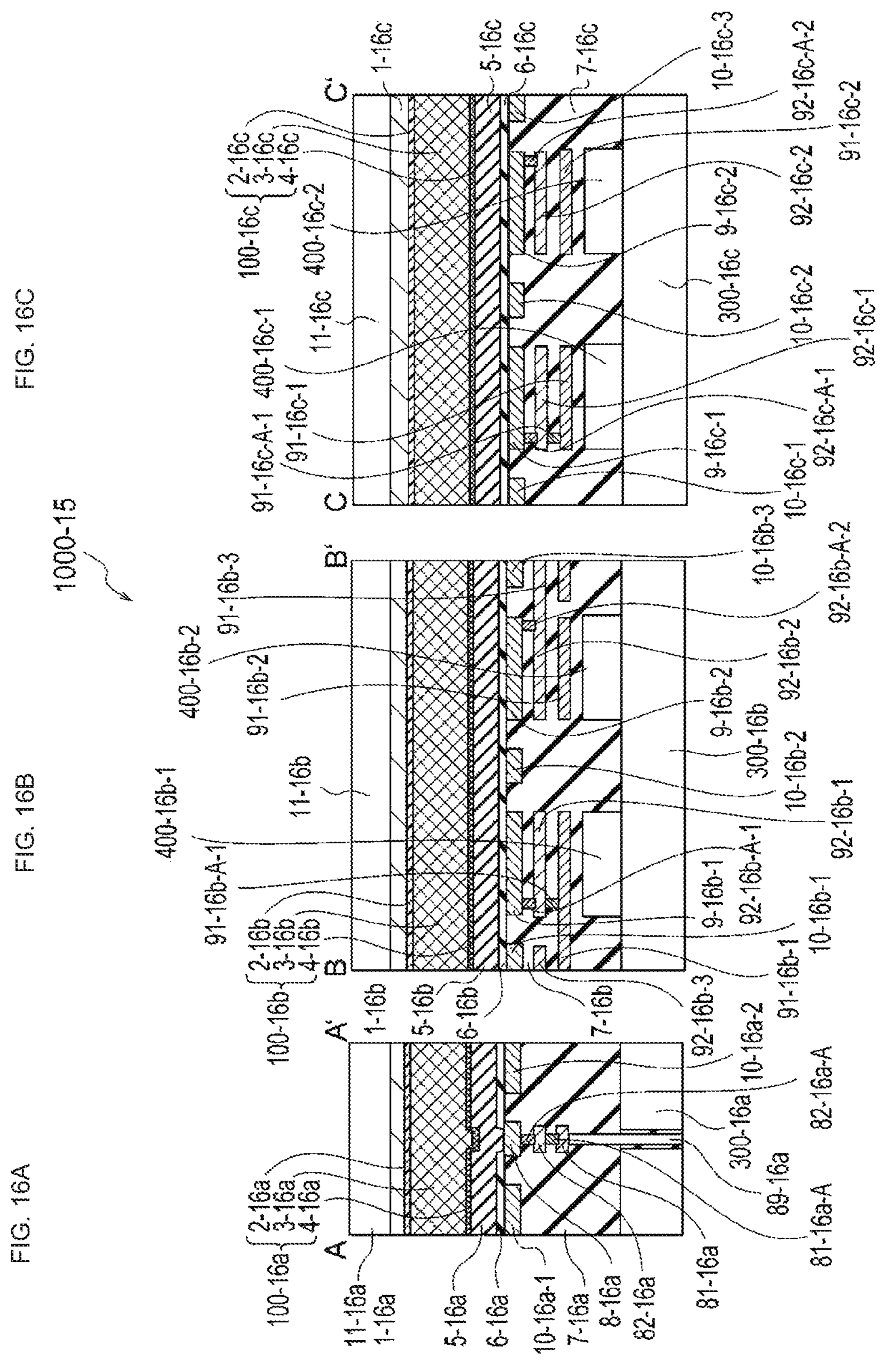
FIGS. 16A, 16B, and 16C illustrate cross-sectional diagrams depicting a configuration example of the solid-state imaging element of the fifth embodiment to which the present technology has been applied.

The solid-state imaging element 1000-15 according to the fifth embodiment of the present technology will be described with reference to FIGS. 16A 16B, and 16C. FIG. 16A is a cross-sectional diagram of the solid-state imaging element 1000-15 taken along a line A-A' in FIG. 15C, FIG. 16B is a cross-sectional diagram of the solid-state imaging element 1000-15 taken along a line B-B' in FIG. 15C, and FIG. 16C is a cross-sectional diagram of the solid-state imaging element 1000-15 taken along a line C-C' in FIG. 15C.

FIG. 16A will be referred to herein. In FIG. 16A, the solid-state imaging element 1000-15 includes at least a first electrode 8-16*a*, a second electrode 1-16*a*, a first photoelectric conversion unit 100-16*a*, a semiconductor layer 5-16*a*, a first insulation layer 6-16*a*, and a second insulation layer 7-16*a*. The first electrode 8-16*a* may be constituted by a transparent electrode.

The solid-state imaging element 1000-15 includes a protection layer 11-16*a*, the second electrode 1-16*a*, the first photoelectric conversion unit 100-16*a*, the semiconductor layer 5-16*a*, and the first electrode 8-16*a* disposed in this order from the light entrance side (the upper side in FIG. 16A). The first electrode 8-16*a* and two shields 10-16*a*-1 and 10-16*a*-2 are constituted by an identical layer.

In FIG. 16A, the first electrode 8-16*a* is connected to the second pedestal 82-16*a* through the via 82-16*a*-A. The second pedestal 82-16*a* is connected to the first pedestal 81-16*a* through the via 81-16*a*-A. Furthermore, the first pedestal 81-16*a* is connected to a through electrode 89-16*a*.

The first photoelectric conversion unit 100-16*a* is constituted by a second carrier blocking layer 2-16*a*, a photoelectric conversion layer (e.g., organic photoelectric conversion layer) 3-16*a*, and a first carrier blocking layer 4-16*a*.

The first photoelectric conversion unit 100-16*a* is provided on one surface side of a semiconductor substrate 300-16*a* (the light entrance side, the upper side in FIG. 16A).

FIG. 16B will be referred to herein. In FIG. 16B, the solid-state imaging element 1000-15 includes at least shields 10-16*b*-1 to 10-16*b*-3, a second electrode 1-16*b*, third electrodes 9-16*b*-1 and 9-16*b*-2, a first photoelectric conversion unit 100-16*b*, a semiconductor layer 5-16*b*, a first insulation layer 6-16*b*, a second insulation layer 7-16*b*, and optical waveguides 400-16*b*-1 and 400-16*b*-2. Each of the third electrodes 9-16*b*-1 and 9-16*b*-2 may be constituted by a transparent electrode.

The solid-state imaging element 1000-15 includes a protection layer 11-16*b*, the second electrode 1-16*b*, the first photoelectric conversion unit 100-16*b*, the semiconductor layer 5-16*b*, the shields 10-16*b*-1 to 10-16*b*-3, and the optical waveguides 400-16*b*-1 and 400-16*b*-2 disposed in this order from the light entrance side (the upper side in FIG. 16B).

The third electrodes 9-16*b*-1 and 9-16*b*-2 are provided away from a first electrode (not depicted), and faces the first photoelectric conversion unit 100-16*b* through the first insulation layer 6-16*b*. Each of the third electrodes 9-16*b*-1 and 9-16*b*-2 is a charge accumulation electrode similarly to the third electrodes 9-1-1 and 9-1-2 in FIG. 1. The third electrodes 9-16*b*-1 and 9-16*b*-2, and the shields 10-16*b*-1, 10-16*b*-2, and 10-16*b*-3 are constituted by an identical layer.

In FIG. 16B, the third electrode 9-16*b*-1 is connected to the second wire 92-16*b*-1 through the contact hole 92-16*b*-A-1, while the second wire 92-16*b*-1 is connected to the first wire 91-16*b*-1 through the contact hole 91-16*b*-A-1. The third electrode 9-16*b*-2 is connected to the second wire 92-16*b*-2 through a contact hole 92-16*b*-A-2. The first wire 91-16*b*-3 and the second wire 92-16*b*-3 correspond to the first wire 91-6*b* and the second wire 92-6*b* depicted in FIG. 6B, respectively, and are wires provided between two pixels adjacent to each other in the column direction (the P direction in FIG. 6B). In addition, the second wire 92-16*b*-1, the second wire 92-16*b*-2, and the second wire 92-16*b*-3 are constituted by an identical layer, while the first wire 91-16*b*-1, the first wire 91-16*b*-2, and the first wire 91-16*b*-3 are constituted by an identical layer. Each of the second wire 92-16*b*-1 and the second wire 92-16*b*-2, and the first wire 91-16*b*-1 and the first wire 91-16*b*-2 may be a transparent wire and does not shield light. Accordingly, the wire area can be enlarged by providing the wires throughout the pixels, for example.

The second insulation layer 7-16*b* is provided between the third electrodes 9-16*b*-1 and 9-16*b*-2 and a semiconductor substrate 300-16*b*.

In FIG. 16B, the optical waveguides 400-16*b*-1 and 400-16*b*-2 are provided between the second wire 92-16*b*-1 and the second wire 92-16*b*-2 and the first wire 91-16*b*-1 and the first wire 91-16*b*-2 and the semiconductor substrate 300-16*b*.

Each of the second wire 92-16*b*-1 and the second wire 92-16*b*-2, and the first wire 91-16*b*-1 and the first wire 91-16*b*-2 is a transparent wire and does not shield light. Accordingly, the optical waveguides 400-16*b*-1 and 400-16*b*-2 can be provided below the second wire 92-16*b*-1 and the second wire 92-16*b*-2 and the first wire 91-16*b*-1 and the first wire 91-16*b*-2 (the lower side in FIG. 16B).

The first photoelectric conversion unit 100-16*b* is constituted by a second carrier blocking layer 2-16*b*, a photoelectric conversion layer (e.g., organic photoelectric conversion layer) 3-16*b*, and a first carrier blocking layer 4-16*b*.

The first photoelectric conversion unit 100-16*b* is provided on one surface side of the semiconductor substrate 300-16*b* (the light entrance side, the upper side in FIG. 16B).

FIG. 16C will be referred to herein. In FIG. 16C, the solid-state imaging element 1000-15 includes at least shields 10-16*c*-1 to 10-16*c*-3, a second electrode 1-16*c*, third electrodes 9-16*c*-1 and 9-16*c*-2, a first photoelectric conversion unit 100-16*c*, a semiconductor layer 5-16*c*, a first insulation layer 6-16*c*, a second insulation layer 7-16*c*, and optical waveguides 400-16*c*-1 and 400-16*c*-2. Each of the third electrodes 9-16*c*-1 and 9-16*c*-2 may be constituted by a transparent electrode.

The solid-state imaging element 1000-15 includes a protection layer 11-16*c*, the second electrode 1-16*c*, the first photoelectric conversion unit 100-16*c*, the semiconductor layer 5-16*c*, the shields 10-16*c*-1 to 10-16*c*-3, and the optical waveguides 400-16*c*-1 and 400-16*c*-2 disposed in this order from the light entrance side (upper side in FIG. 16C).

The third electrodes 9-16*c*-1 and 9-16*c*-2 are provided away from a first electrode (not depicted), and faces the first photoelectric conversion unit 100-16*c* through the first insulation layer 6-16*c*. Each of the third electrodes 9-16*c*-1 and 9-16*c*-2 is a charge accumulation electrode similarly to the third electrodes 9-1-1 and 9-1-2 in FIG. 1. The third electrodes 9-16*c*-1 and 9-16*c*-2, and the shields 10-16*c*-1, 10-16*c*-2, and 10-16*c*-3 are constituted by an identical layer.

In FIG. 16C, the third electrode 9-16*c*-1 is connected to the second wire 92-16*c*-1 through a contact hole 92-16*c*-A-1, while the second wire 92-16*c*-1 is connected to the first wire 91-16*c*-1 through a contact hole 91-16*c*-A-1. The third electrode 9-16*c*-2 is connected to the second wire 92-16*c*-2 through a contact hole 92-16*c*-A-2. In addition, the second wire 92-16*c*-1 and the second wire 92-16*c*-2 are constituted by an identical layer, while the first wire 91-16*c*-1 and the first wire 91-16*c*-2 are constituted by an identical layer. Each of the second wire 92-16*c*-1 and the second wire 92-16*c*-2, and the first wire 91-16*c*-1 and the first wire 91-16*c*-2 is a transparent wire and does not shield light. Accordingly, the wire area can be enlarged by providing the wires throughout the pixels, for example.

The second insulation layer 7-16*c* is provided between the third electrodes 9-16*c*-1 and 9-16*c*-2 and a semiconductor substrate 300-16*c*.

In FIG. 16C, the optical waveguides 400-16*c*-1 and 400-16*c*-2 are provided between the second wire 92-16*c*-1 and the second wire 92-16*c*-2 and the first wire 91-16*c*-1 and the first wire 91-16*c*-2 and the semiconductor substrate 300-16*c*. Each of the second wire 92-16*c*-1 and the second wire 92-16*c*-2, and the first wire 91-16*c*-1 and the first wire 91-16*c*-2 is a transparent wire and does not shield light. Accordingly, the optical waveguides 400-16*c*-1 and 400-16*c*-2 can be provided below the second wire 92-16*c*-1 and the second wire 92-16*c*-2 and the first wire 91-16*c*-1 and the first wire 91-16*c*-2 (the lower side in FIG. 16C).

The first photoelectric conversion unit 100-16*c* is constituted by a second carrier blocking layer 2-16*c*, a photoelectric conversion layer (e.g., organic photoelectric conversion layer) 3-16*c*, and a first carrier blocking layer 4-16*c*.

The first photoelectric conversion unit 100-16*c* is provided on one surface side of a semiconductor substrate 300-16*a* (the light entrance side, the upper side in FIG. 16C).

6. Sixth Embodiment (Example 6 of Solid-State Imaging Element)

A solid-state imaging element according to a sixth embodiment of the present technology is a solid-state imaging element which includes at least a first electrode, a second electrode, a third electrode, a first photoelectric conversion unit, a second photoelectric conversion unit, a first insulation layer, a second insulation layer, an optical waveguide, at least one pedestal connected to the first electrode and provided between the first electrode and the second optical waveguide, a via connecting the first electrode and the at least one pedestal, at least one wire connected to the third electrode and provided between the third electrode and the second photoelectric conversion unit, and a contact hole connecting the third electrode and at least one wire. According to the solid-state imaging element of the sixth embodiment of the present technology, the second electrode, the first photoelectric conversion unit, and the first electrode are disposed in this order. The third electrode is provided away from the first electrode and faces the first photoelectric conversion unit through the first insulation layer. The second insulation layer is provided between the third electrode and the second photoelectric conversion unit. In addition, the optical waveguide is provided between the third electrode and the second photoelectric conversion unit. Furthermore, according to the solid-state imaging element of the sixth embodiment of the present technology, a first distance between the center of the second photoelectric conversion unit and the center of the via at the center of the angle of view is different from a second distance between the center of the second photoelectric conversion unit and the center of the via at an end of the angle of view. A third distance between the center of the second photoelectric conversion unit and the center of the contact hole at the center of the angle of view is different from a fourth distance between the center of the second photoelectric conversion unit and the center of the contact hole at an end of the angle of view.

Accordingly, the solid-state imaging element of the sixth embodiment of the present technology is a solid-state imaging element which includes the at least one pedestal connected to the first electrode and provided between the first electrode and the second photoelectric conversion unit, the via connecting the first electrode and the at least one pedestal, the at least one wire connected to the third electrode and provided between the third electrode and the second photoelectric conversion unit, and the contact hole connecting the third electrode and the at least one wire. The first distance between the center of the second photoelectric conversion unit and the center of the via at the center of the angle of view is different from the second distance between the center of the second photoelectric conversion unit and the center of the via at the end of the angle of view. The third distance between the center of the second photoelectric conversion unit and the contact hole at the center of the angle of view is different from the fourth distance between the center of the second photoelectric conversion unit and the center of the contact hole at the end of the angle of view.

A solid-state imaging element 1000-17 has a structure considering pupil correction. Light enters an imaging surface of the on-chip lens at various angles. Accordingly, when a similar structure is provided for both pixels at the center of the angle of view and pixels at an end of the angle of view, light is difficult to efficiently condense. In this case, a sensitivity difference may be produced between the pixels at the center of the angle of view and the pixels at the end of the angle of view.

Incident light enters the second photoelectric conversion unit (e.g., photodiode) substantially perpendicularly at pixels arranged at a central portion of the angle of view. However, incident light enters the second photoelectric conversion unit in an oblique direction at pixels arranged at an end portion of the angle of view.

Accordingly, pupil correction is performed for the on-chip lens to efficiently condense even oblique light. The amount of the pupil correction increases toward the end of the angle of view from the center of the angle of view described above (e.g., the center of a pixel unit). In other words, pupil correction need not be performed for the pixels at the center of the angle of view.

The solid-state imaging element 1000-17 including the optical waveguide is capable of guiding traveling of light downward, i.e., toward the second photoelectric conversion unit. Accordingly, the amount of pupil correction can be reduced more than that amount of a solid-state imaging element not including the optical waveguide.

Figures 17A, 17B, 17C:
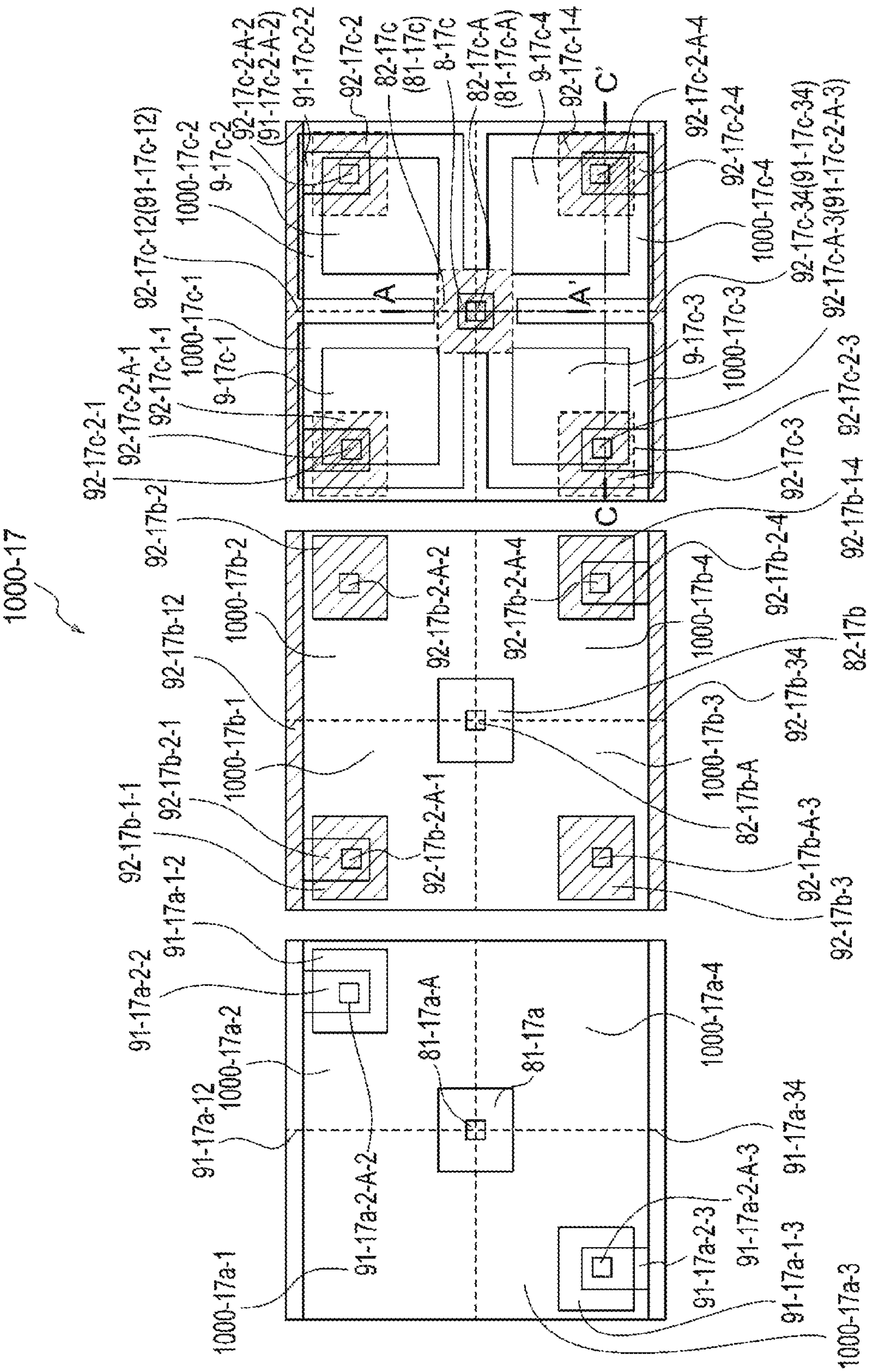
FIGS. 17A, 17B, and 17C illustrate plan diagrams depicting a configuration example of a solid-state imaging element of a sixth embodiment to which the present technology has been applied.

A solid-state imaging element 1000-17 according to the sixth embodiment of the present technology will be described with reference to FIGS. 17A 17B, and 17C. FIG. 17A is a diagram depicting a planar layout of a first pedestal 81-18*a*, a via 81-18*a*-A, a first wire 91-19*b*-1, a contact hole 91-19*a*-A-1 and the like constituted by an identical layer in four pixels of the solid-state imaging element 1000-17 depicted in FIGS. 18A, 18B, 19A, and 19B. FIG. 17B is a diagram depicting a planar layout of a second pedestal 82-18*a*, a via 82-18*a*-A, a second wire 92-19*b*-1, a contact hole 92-19*a*-A-1 and the like constituted by an identical layer in four pixels of the solid-state imaging element 1000-17 depicted in FIGS. 18A, 18B, 19A, and 19B. FIG. 17C is a diagram depicting a planar layout of a first electrode 8-18*a*, a shield 10-18*a*-1, a third electrode 9-19*a*-1 and the like constituted by an identical layer in four pixels of the solid-state imaging element 1000-17 depicted in FIGS. 18A, 18B, 19A, and 19B.

FIG. 17A will be referred to herein. FIG. 17A depicts four pixels 1000-17*a*-1 to 1000-17*a*-4 of the solid-state imaging element 1000-17.

A first wire 91-17*a*-12 is provided on upper parts of the pixel 1000-17*a*-1 and the pixel 1000-17*a*-2 (the upper side in FIG. 17A). The first wire 91-17*a*-12, a first wire 91-17*a*-2-2, and a first wire 91-17*a*-1-2 are connected to each other in the pixel 1000-17*a*-2. A contact hole 91-17*a*-2-A-2 is connected to the first wire 91-17*a*-2-2. For considering pupil correction, the first wire 91-17*a*-1-2 may have a structure which increases a wire area to prevent protrusion of the contact hole 91-17*a*-2-A-2.

A first wire 91-17*a*-34 is provided on lower parts of the pixel 1000-17*a*-3 and the pixel 1000-17*a*-4 (the lower side in FIG. 17A). The first wire 91-17*a*-34, a first wire 91-17*a*-2-3, and a first wire 91-17*a*-1-3 are connected to each other in the pixel 1000-17*a*-3. A contact hole 91-17*a*-2-A-3 is connected to the first wire 91-17*a*-2-3. For considering pupil correction, the first wire 91-17*a*-1-3 may have a structure which increases a wire area to prevent protrusion of the contact hole 91-17*a*-2-A-3.

In this manner, the pixel 1000-17*a*-2 can be driven by the first wire 91-17*a*-12 and the first wire 91-17*a*-2-2, while the pixel 1000-17*a*-3 can be driven by the first wire 91-17*a*-34 and the first wire 91-17*a*-2-3. Accordingly, the two pixels (pixel 1000-17*a*-2 and pixel 1000-17*a*-3) can be individually and independently driven.

A first pedestal 81-17*a* and a via 81-17*a*-A connected to the first pedestal 81-17*a* are provided as common components for the four pixels (1000-17*a*-1 to 1000-17*a*-4). For considering pupil correction, the pedestal 81-17*a* may have a structure which increases a wire area to prevent protrusion of the via 81-17*a*-A.

FIG. 17B will be referred to herein. FIG. 17B depicts four pixels 1000-17*b*-1 to 1000-17*b*-4 of the solid-state imaging element 1000-17.

A second wire 92-17*b*-12 is provided on upper parts of the pixel 1000-17*b*-1 and the pixel 1000-17*b*-2 (the upper side in FIG. 15B). The second wire 92-17*b*-12, a second wire 92-17*b*-2-1, and a second wire 92-17*b*-1-1 are connected to each other in the pixel 1000-17*b*-1. A contact hole 92-17*b*-2-A-1 is connected to the second wire 92-17*b*-2-1. In addition, a second wire 92-17*b*-2 is connected to a first wire (not depicted) through a contact hole 92-17*b*-A-2 in the pixel 1000-17*b*-2. For considering pupil correction, the second wire 92-17*b*-1-1 may have a structure which increases a wire area to prevent protrusion of the contact hole 91-17*b*-2-A-1. In addition, for considering pupil correction, the second wire 92-17*b*-2 may have a structure which increases a wire area to prevent protrusion of the contact hole 91-17*b*-2-A-2.

A second wire 92-17*b*-34 is provided on lower parts of the pixel 1000-17*b*-3 and the pixel 1000-17*b*-4 (the lower side in FIG. 17B). The second wire 92-17*b*-34, a second wire 92-17*b*-2-4, and a second wire 92-17*b*-1-4 are connected to each other in the pixel 1000-17*b*-4. A contact hole 92-17*b*-2-A-4 is connected to the second wire 92-17*b*-2-4. In addition, a second wire 92-17*b*-3 is connected to a first wire (not depicted) through a contact hole 92-17*b*-A-3 in the pixel 1000-17*b*-3. For considering pupil correction, the second wire 92-17*b*-1-4 may have a structure which increases a wire area to prevent protrusion of the contact hole 91-17*b*-2-A-4. In addition, for considering pupil correction, the second wire 92-17*b*-3 may have a structure which increases a wire area to prevent protrusion of the contact hole 91-17*b*-A-3.

In this manner, the pixel 1000-17*b*-1 can be driven by the second wire 92-17*b*-12 and the second wire 92-17*b*-2-1, while the pixel 1000-17*b*-4 can be driven by the second wire 92-17*b*-34 and the second wire 92-17*b*-2-4. Accordingly, the two pixels (pixel 1000-17*b*-1 and pixel 1000-17*b*-4) can be individually and independently driven.

A second pedestal 82-17*b* and a via 82-17*b*-A connected to the second pedestal 82-17*a* are provided as common components for the four pixels (1000-17*b*-1 to 1000-17*b*-4). For considering pupil correction, the second pedestal 81-17*b* may have a structure which increases a wire area to prevent protrusion of the via 81-17*b*-A.

FIG. 17C will be referred to herein. FIG. 17C depicts four pixels 1000-17*c*-1 to 1000-17*c*-4 of the solid-state imaging element 1000-17.

A third electrode 9-17*c*-1 and a second wire 92-17*c*-2-1 (second wire 92-17*c*-1-1) are provided in the pixel 1000-17*c*-1. The third electrode 9-17*c*-1 and the second wire 92-17*c*-2-1 (second wire 92-17*c*-1-1) are connected to each other through a contact hole 92-17*c*-2-A-1. A third electrode 9-17*c*-2, a first wire 91-17*c*-2-2, and a second wire 92-17*c*-2 are provided in the pixel 1000-17*c*-2. The first wire 91-17*c*-2-2 and the second wire 92-17*c*-2 are connected to each other through a contact hole 91-17*c*-2-A-2. The third electrode 9-17*c*-2 and the second wire 92-17*c*-2 are connected to each other through a contact hole 92-17*c*-2-A-2. A third electrode 9-17*c*-3, a first wire 91-17*c*-2-3, and a second wire 92-17*c*-3 are provided in the pixel 1000-17*c*-3. The first wire 91-17*c*-2-3 and the second wire 92-17*c*-3 are connected to each other through a contact hole 91-17*c*-2-A-3. The third electrode 9-17*c*-3 and the second wire 92-17*c*-3 are connected to each other through a contact hole 92-17*c*-2-A-3. A third electrode 9-17*c*-4 and a second wire 92-17*c*-2-4 (second wire 92-17*c*-1-4) are provided in the pixel 1000-17*c*-4. The third electrode 9-17*c*-4 and the second wire 92-17*c*-2-4 (second wire 92-17*c*-1-4) are connected to each other through a contact hole 92-17*c*-2-A-4.

A second wire 92-17*c*-12 (first wire 91-17*c*-12) is sequentially provided from the light entrance side in upper parts of the pixel 1000-17*c*-1 and the pixel 1000-17*c*-2 (the upper side in FIG. 17C). The second wire 92-17*c*-12 and the second wire 92-17*c*-1 are connected to each other in the pixel 1000-17*c*-1. The first wire 91-17*c*-12 and the first wire 91-17*c*-2 are connected to each other in the pixel 1000-17*c*-2.

A second wire 92-17*c*-34 (first wire 91-17*c*-34) is sequentially provided from the light entrance side in lower parts of the pixel 1000-17*c*-3 and the pixel 1000-17*c*-4 (the lower side in FIG. 17C). The first wire 91-17*c*-34 and the first wire 91-17*c*-3 are connected to each other in the pixel 1000-17*c*-3. The second wire 92-17*c*-34 and the second wire 92-17*c*-4 are connected to each other in the pixel 1000-17*c*-4.

In this manner, the pixel 1000-17*c*-2 can be driven by the first wire 91-17*c*-12 and the first wire 91-17*c*-2-2, while the pixel 1000-17*c*-3 can be driven by the first wire 91-17*c*-34 and the first wire 91-17*c*-2-3. In addition, the pixel 1000-17*c*-1 can be driven by the second wires 92-17*c*-12 and 92-17*c*-2-1, while the pixel 1000-3-4 can be driven by the second wire 92-17*c*-34 and the second wire 92-17*c*-2-4. Accordingly, the four pixels (pixel 1000-17*c*-1 to pixel 1000-17*c*-4) can be individually and independently driven.

A first electrode 8-17*c* is provided as a common component for the four pixels (1000-17*c*-1 to 1000-17*c*-4). The first electrode is connected to a second pedestal 82-17*c* through a via 82-17*c*-A, and the second pedestal 82-17*c* is connected to a first pedestal 81-17*c* through a via 81-17*c*-A in the order from the light entrance side.

Figures 18A, 18B:
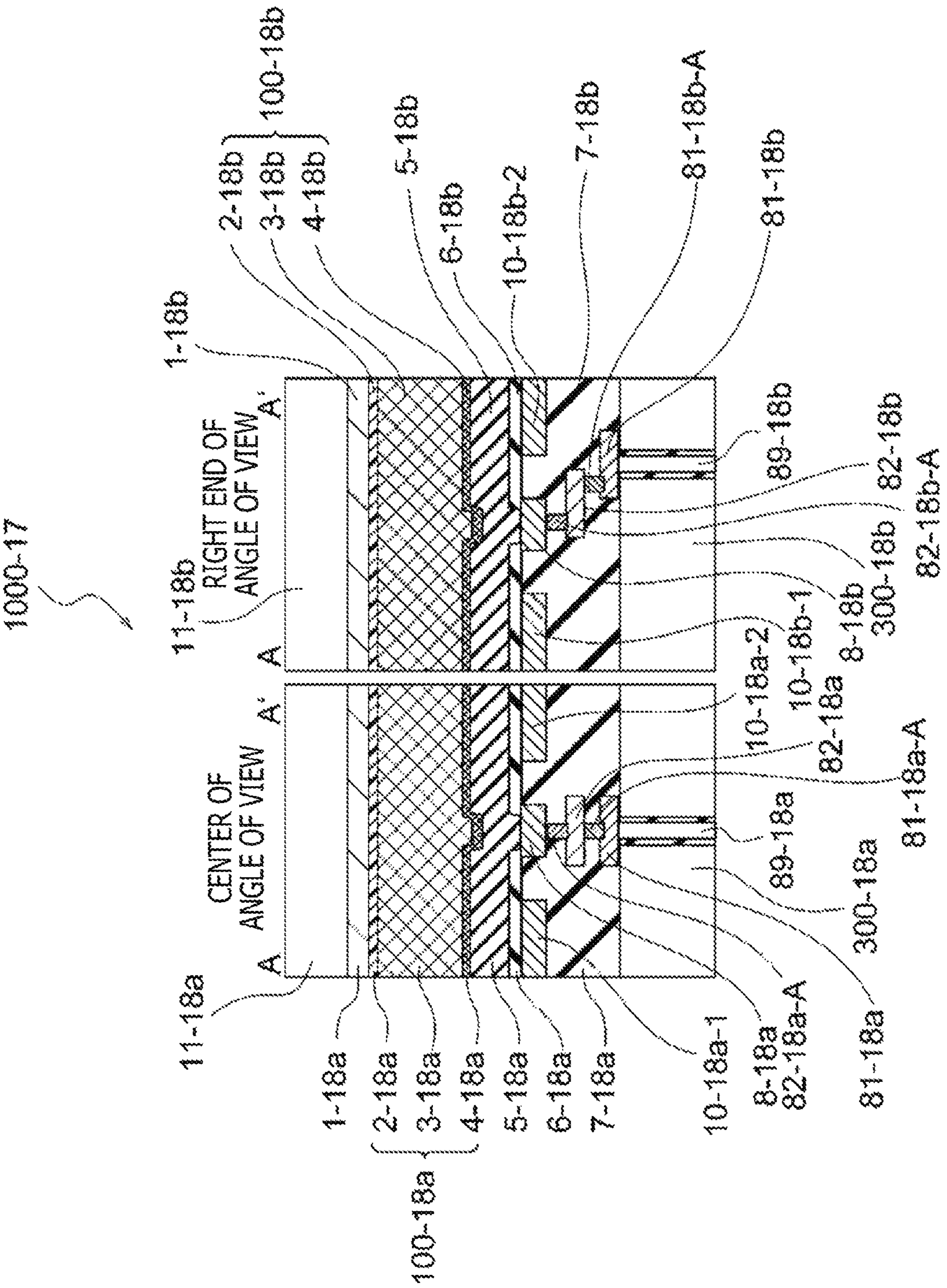
FIGS. 18A and 18B illustrate cross-sectional diagrams depicting a configuration example of the solid-state imaging element of the sixth embodiment to which the present technology has been applied.

The solid-state imaging element 1000-17 according to the sixth embodiment of the present technology will be described with reference to FIGS. 18A and 18B. FIG. 18A is a cross-sectional diagram of the solid-state imaging element 1000-17 taken along a line A-A' in FIG. 17C in a portion at the center of the angle of view, while FIG. 18B is a cross-sectional diagram of the solid-state imaging element 1000-17 taken along the line A-A' in FIG. 17C in a portion at a right end of the angle of view.

FIG. 18A will be referred to herein. In FIG. 18A, the solid-state imaging element 1000-17 includes at least a first electrode 8-18*a*, a second electrode 1-18*a*, a first photoelectric conversion unit 100-18*a*, a semiconductor layer 5-18*a*, a first insulation layer 6-18*a*, and a second insulation layer 7-18*a*. The first electrode 8-18*a* may be constituted by a transparent electrode.

The solid-state imaging element 1000-17 includes a protection layer 11-18*a*, the second electrode 1-18*a*, the first photoelectric conversion unit 100-18*a*, the semiconductor layer 5-18*a*, and the first electrode 8-18*a* disposed in this order from the light entrance side (the upper side in FIG. 18A). The first electrode 8-18*a* and two shields 10-18*a*-1 and 10-18*a*-2 are constituted by an identical layer.

In FIG. 18A, the first electrode 8-18*a* is connected to the second pedestal 82-18*a* through the via 82-18*a*-A. The second pedestal 82-18*a* is connected to the first pedestal 81-18*a* through the via 81-18*a*-A. Furthermore, the first pedestal 81-18*a* is connected to a through electrode 89-18*a*.

The first photoelectric conversion unit 100-18*a* is constituted by a second carrier blocking layer 2-18*a*, a photoelectric conversion layer (e.g., organic photoelectric conversion layer) 3-18*a*, and a first carrier blocking layer 4-18*a*.

The first photoelectric conversion unit 100-18*a* is provided on one surface side of a semiconductor substrate 300-18*a* (the light entrance side, the upper side in FIG. 18B).

FIG. 18B will be referred to herein. In FIG. 18B, the solid-state imaging element 1000-17 includes at least a first electrode 8-18*b*, a second electrode 1-18*b*, a first photoelectric conversion unit 100-18*b*, a semiconductor layer 5-18*b*, a first insulation layer 6-18*b*, and a second insulation layer 7-18*b*. The first electrode 8-18*b* may be constituted by a transparent electrode.

The solid-state imaging element 1000-17 includes a protection layer 11-18*b*, the second electrode 1-18*b*, the first photoelectric conversion unit 100-18*b*, the semiconductor layer 5-18*b*, and the first electrode 8-18*b* disposed in this order from the light entrance side (the upper side in FIG. 18B). The first electrode 8-18*b* and two shields 10-18*b*-1 and 10-18*b*-2 are constituted by an identical layer.

In FIG. 18B, the first electrode 8-18*b* is connected to a second pedestal 82-18*b* through a via 82-18*b*-A. The second pedestal 82-18*b* is connected to a first pedestal 81-18*b* through a via 81-18*b*-A. Furthermore, the first pedestal 81-18*b* is connected to a through electrode 89-18*b*.

The first photoelectric conversion unit 100-18*b* is constituted by a second carrier blocking layer 2-18*b*, a photoelectric conversion layer (e.g., organic photoelectric conversion layer) 3-18*b*, and a first carrier blocking layer 4-18*b*.

The first photoelectric conversion unit 100-18*b* is provided on one surface side of a semiconductor substrate 300-18*b* (the light entrance side, the upper side in FIG. 18B).

As depicted in FIG. 18A and FIG. 18B, according to the solid-state imaging element 1000-17 of the sixth embodiment of the present technology, a first distance between the center of the second photoelectric conversion unit (not depicted) and the center of the via 82-18*a*-A at a central portion of the angle of view (the center of the angle of view) (FIG. 18A) is different from a second distance between the center of the second photoelectric conversion unit (not depicted) and the center of the via 82-18*b*-A at the right end of the angle of view (the end of the angle of view) (FIG. 18B). At least the via 82-18*a*-A and the via 82-18*b*-A are movable for a positional change in accordance with pupil correction. The via 81-18*a*-A, the via 81-18*b*-A, the second pedestal 82-18*a*, the second pedestal 82-18*b*, the first pedestal 81-18*a*, or the first pedestal 81-18*b* may be movable for a positional change in accordance with pupil correction. Note that the second photoelectric conversion unit not depicted in FIG. 18A and FIG. 18B are embedded in the semiconductor substrate 300-18*a* or 300-18*b* and unmovable as described above.

Figures 19A, 19B:
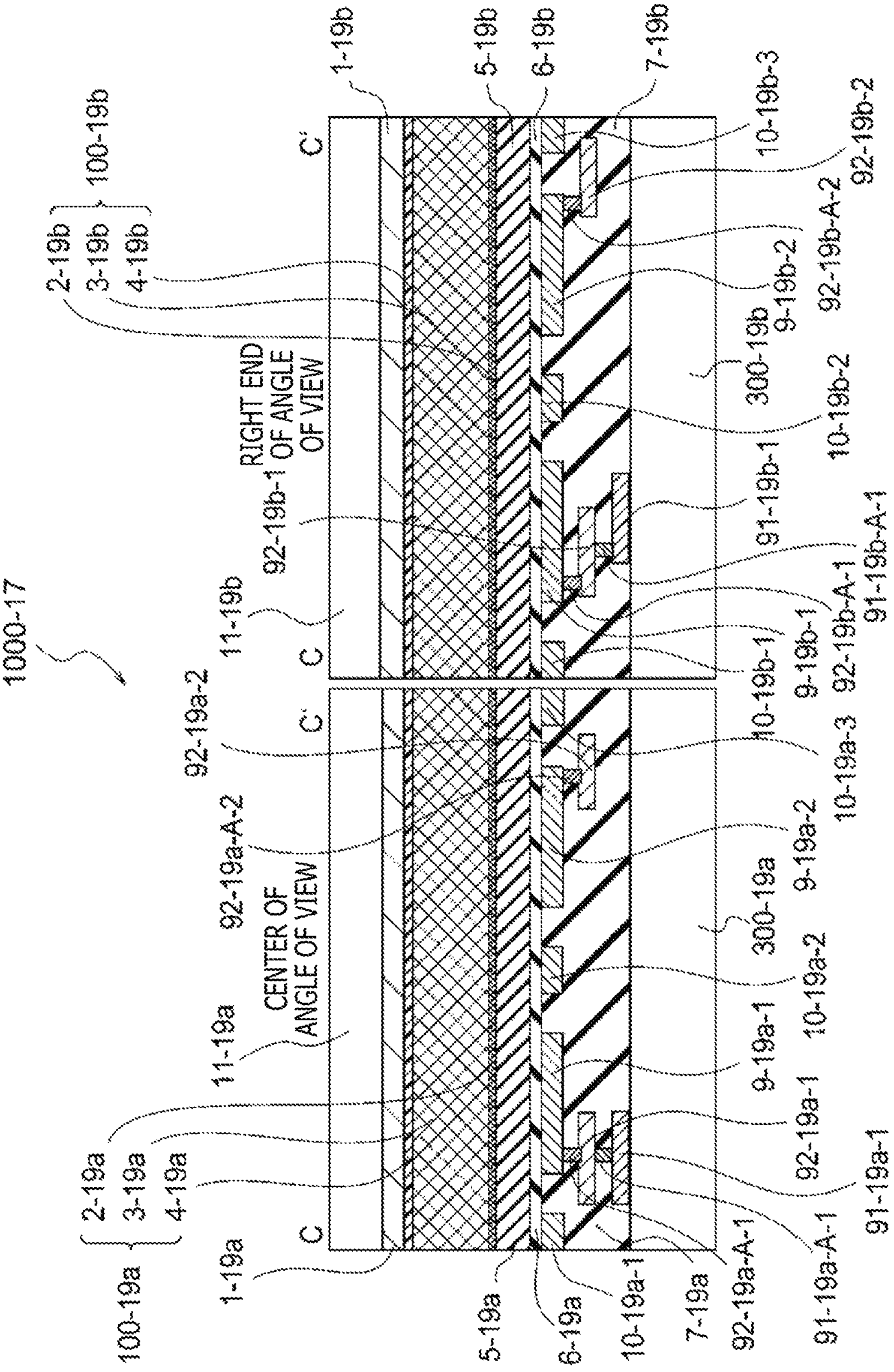
FIGS. 19A and 19B illustrate cross-sectional diagrams depicting a configuration example of the solid-state imaging element of the sixth embodiment to which the present technology has been applied.

The solid-state imaging element 1000-17 according to the sixth embodiment of the present technology will be described with reference to FIGS. 19A and 19B. FIG. 19A is a cross-sectional diagram of the solid-state imaging element 1000-17 taken along a line C-C' in FIG. 17C in a portion at the center of the angle of view, while FIG. 19B is a cross-sectional diagram of the solid-state imaging element 1000-17 taken along the line C-C' in FIG. 17C in a portion at the right end of the angle of view.

FIG. 19A will be referred to herein. In FIG. 19A, the solid-state imaging element 1000-17 includes at least shields 10-19*a*-1 to 10-19*a*-3, a second electrode 1-19*a*, third electrodes 9-19*a*-1 and 9-19*a*-2, a first photoelectric conversion unit 100-19*a*, a semiconductor layer 5-19*a*, a first insulation layer 6-19*a*, a second insulation layer 7-19*a*, and an optical waveguide (not depicted in FIG. 19A). Each of the third electrode 9-19*a*-1 and 9-19*a*-2 may be constituted by a transparent electrode.

The solid-state imaging element 1000-17 includes a protection layer 11-19*a*, the second electrode 1-19*a*, the first photoelectric conversion unit 100-19*a*, the semiconductor layer 5-19*a*, and the shields 10-19*a*-1 to 10-19*a*-3 disposed in this order from the light entrance side (the upper side in FIG. 19A).

The third electrodes 9-19*a*-1 and 9-19*a*-2 are provided away from the first electrode (not depicted), and faces the first photoelectric conversion unit 100-19*a* through the first insulation layer 6-19*a*. Each of the third electrodes 9-19*a*-1 and 9-19*a*-2 is a charge accumulation electrode similarly to the third electrodes 9-1-1 and 9-1-2 in FIG. 1. The third electrodes 9-19*a*-1 and 9-19*a*-2, and the shields 10-19*a*-1, 10-19*a*-2, and 10-19*a*-3 are constituted by an identical layer.

In FIG. 19A, the third electrode 9-19*a*-1 is connected to the second wire 92-19*a*-1 through the contact hole 92-19*a*-A-1, while the second wire 92-19*a*-1 is connected to the first wire 91-19*a*-1 through the contact hole 91-19*a*-A-1. The third electrode 9-19*a*-2 is connected to the second wire 92-19*a*-2 through a contact hole 92-19*a*-A-2. In addition, the second wire 92-19*a*-1 and the second wire 92-19*a*-2 are constituted by an identical layer.

The second insulation layer 7-19*a* is provided between the third electrodes 9-19*a*-1 and 9-19*a*-2 and a semiconductor substrate 300-19*a*.

While the optical waveguide is not depicted in FIG. 19A, the optical waveguide may be provided between the third electrodes 9-19*a*-1 and 9-19*a*-2 and the semiconductor substrate 300-19*a*.

The first photoelectric conversion unit 100-19*a* is constituted by a second carrier blocking layer 2-19*a*, a photoelectric conversion layer (e.g., organic photoelectric conversion layer) 3-19*a*, and a first carrier blocking layer 4-19*a*.

The first photoelectric conversion unit 100-19*a* is provided on one surface side of the semiconductor substrate 300-19*a* (the light entrance side, the upper side in FIG. 19A).

FIG. 19B will be referred to herein. In FIG. 19B, the solid-state imaging element 1000-17 includes at least shields 10-19*b*-1 to 10-19*b*-3, a second electrode 1-19*b*, third electrodes 9-19*b*-1 and 9-19*b*-2, a first photoelectric conversion unit 100-19*b*, a semiconductor layer 5-19*b*, a first insulation layer 6-19*b*, a second insulation layer 7-19*b*, and an optical waveguide (not depicted in FIG. 19B). Each of the third electrodes 9-19_b_-1 and 9-19_b_-2 may be constituted by a transparent electrode.

The solid-state imaging element 1000-17 includes a protection layer 11-19_b_, the second electrode 1-19_b_, the first photoelectric conversion unit 100-19_b_, the semiconductor layer 5-19_b_, and the shields 10-19_b_-1 to 10-19_b_-3 disposed in this order from the light entrance side (the upper side in FIG. 19B).

The third electrodes 9-19_b_-1 and 9-19_b_-2 are provided away from a first electrode (not depicted), and faces the first photoelectric conversion unit 100-19_b_ through the first insulation layer 6-19_b_. Each of the third electrodes 9-19_b_-1 and 9-19_b_-2 is a charge accumulation electrode similarly to the third electrodes 9-1-1 and 9-1-2 in FIG. 1. The third electrodes 9-19_b_-1 and 9-19_b_-2, and the shields 10-19_b_-1, 10-19_b_-2, and 10-19_b_-3 are constituted by an identical layer.

In FIG. 19B, the third electrode 9-19_b_-1 is connected to the second wire 92-19_b_-1 through a contact hole 92-19_b_-A-1, while the second wire 92-19_b_-1 is connected to the first wire 91-19_b_-1 through a contact hole 91-19_b_-A-1. The third electrode 9-19_b_-2 is connected to the second wire 92-19_b_-2 through a contact hole 92-19_b_-A-2. In addition, the second wire 92-19_b_-1 and the second wire 92-19_b_-2 are constituted by an identical layer.

The second insulation layer 7-19_b_ is provided between the third electrodes 9-19_b_-1 and 9-19_b_-2 and a semiconductor substrate 300-19_b_.

While the optical waveguide is not depicted in FIG. 19B), the optical waveguide may be provided between the third electrodes 9-19_b_-1 and 9-19_b_-2 and the semiconductor substrate 300-19_b_.

The first photoelectric conversion unit 100-19_b_ is constituted by a second carrier blocking layer 2-19_b_, a photoelectric conversion layer (e.g., organic photoelectric conversion layer) 3-19_b_, and a first carrier blocking layer 4-19_b_.

The first photoelectric conversion unit 100-19_b_ is provided on one surface side of the semiconductor substrate 300-19_b_ (the light entrance side, the upper side in FIG. 19B).

As depicted in FIG. 19A and FIG. 19B, according to the solid-state imaging element 1000-17 of the sixth embodiment of the present technology, a third distance between the center of the second photoelectric conversion unit (not depicted) and the center of the contact hole 92-19_a_-A-1 at a central portion of the angle of view (the center of the angle of view) (FIG. 19A) is different from a fourth distance between the center of the second photoelectric conversion unit (not depicted) and the center of the contact hole 92-19_b_-A-1 at the right end of the angle of view (the end of the angle of view) (FIG. 19B). At least the contact hole 92-19_a_-A-1 and the contact hole 92-19_b_-A-1 are movable for a positional change in accordance with pupil correction. The contact hole 91-19_a_-A-1, the contact hole 91-19_b_-A-1, the second wire 92-19_a_-1, the second wire 92-19_b_-1, the first wire 91-19_a_-1, or the first wire 91-19_b_-1 may be also movable for a positional change in accordance with pupil correction. Note that the second photoelectric conversion unit not depicted in FIG. 19A and FIG. 19B are embedded in the semiconductor substrate 300-19_a_ or 300-19_b_ and unmovable as described above.

7. Seventh Embodiment (Example of Electronic Device)

An electronic device of a seventh embodiment of the present technology is an electronic device which includes a solid-state imaging element. This solid-state imaging element includes at least a first electrode, a second electrode, a third electrode, a first photoelectric conversion unit, a second photoelectric conversion unit, a first insulation layer, a second insulation layer, and an optical waveguide. The second electrode, the first photoelectric conversion unit, and the first electrode are disposed in this order. The third electrode is provided away from the first electrode and faces the first photoelectric conversion unit through the first insulation layer. The second insulation layer is provided between the third electrode and the second photoelectric conversion unit. The optical waveguide is provided between the third electrode and the second photoelectric conversion unit. In addition, the electronic device according to the seventh embodiment of the present technology may be an electronic device which includes the solid-state imaging element of any one of the first embodiment to sixth embodiment of the present technology.

Figure 20:
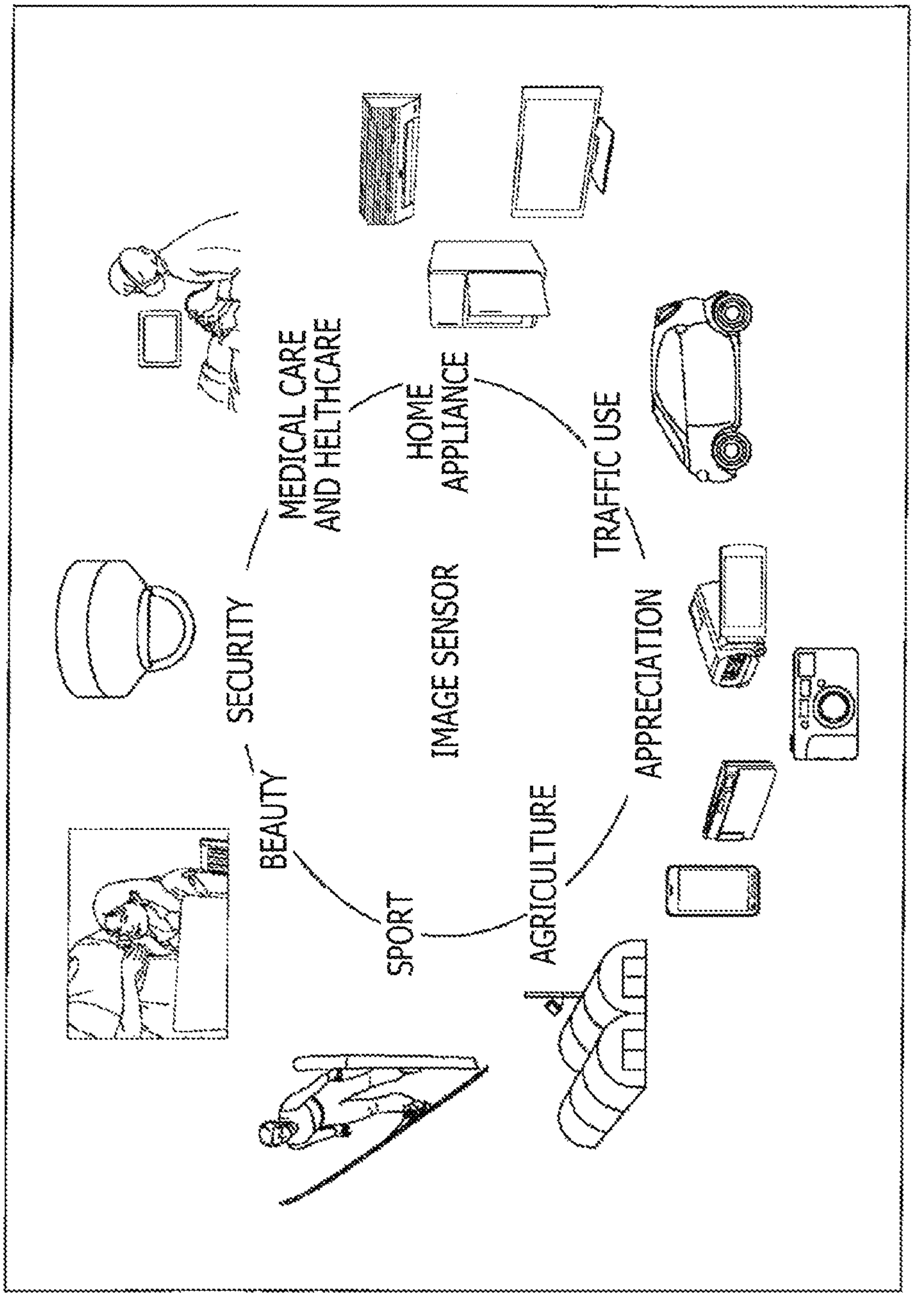
FIG. 20 is a view depicting a use example of the solid-state imaging elements of the first to sixth embodiments to which the present technology has been applied.

8. Use Examples of Solid-State Imaging Element to which Present Technology has been Applied FIG. 20 is a view depicting an image sensor as a use example of the solid-state imaging elements of the first to sixth embodiments according to the present technology.

Each of the solid-state imaging elements of the first to sixth embodiments described above may be used for sensing various types of light, such as visible light, infrared light, ultraviolet light, and X-ray as described below, for example. More specifically, as depicted in FIG. 20, the solid-state imaging element according to any one of the first to sixth embodiments may be applied to a device used in fields such as an appreciation field for capturing images employed for appreciation, a traffic field, a home appliance field, a medical care and healthcare field, a security field, a beauty field, a sport field, and an agricultural field (e.g., the electronic device of the seventh embodiment described above).

In more detail, in the appreciation field, the solid-state imaging element according to any one of the first to sixth embodiments may be applied to a device for capturing images employed for appreciation, such as a digital camera, a smartphone, and a cellular phone equipped with a camera function, for example.

In the traffic field, the solid-state imaging element according to any one of the first to sixth embodiments may be applied to a device for a traffic use, such as an in-vehicle sensor for imaging a front, a rear, surroundings, a vehicle interior or other places of a car, a monitoring camera for monitoring traveling vehicles and roads, and a distance sensor for measuring a distance between vehicles and the like to achieve safe driving such as an automatic stop and recognize a state of a driver, or for other purposes, for example.

In the home appliance field, the solid-state imaging element according to any one of the first to sixth embodiments may be applied to a device used for a home appliance such as a television receiver, a refrigerator, and an air conditioner to image a gesture of a user and perform a device operation corresponding to the gesture, for example.

In the medical care and healthcare field, the solid-state imaging element according to any one of the first to sixth embodiments may be applied to a device used for medical and healthcare purposes, such as an endoscope, and a device for imaging blood vessels by receiving infrared light, for example.

In the security field, the solid-state imaging element according to any one of the first to sixth embodiments may be applied to a device for security such as a monitoring camera for crime prevention, and a camera for personal authentication, for example.

In the beauty field, the solid-state imaging element according to any one of the first to sixth embodiments may be applied to a device used for beauty, such as a skin measuring device for imaging a skin, and a microscope for imaging a scalp, for example.

In the sport field, the solid-state imaging element according to any one of the first to sixth embodiments may be applied to a device used for sports, such as an action camera for sport purposes and a wearable camera, for example.

In the agricultural field, the solid-state imaging element according to any one of the first to sixth embodiments may be applied to a device used for agriculture, such as a camera for monitoring states of farms and crops, for example.

Figure 21:
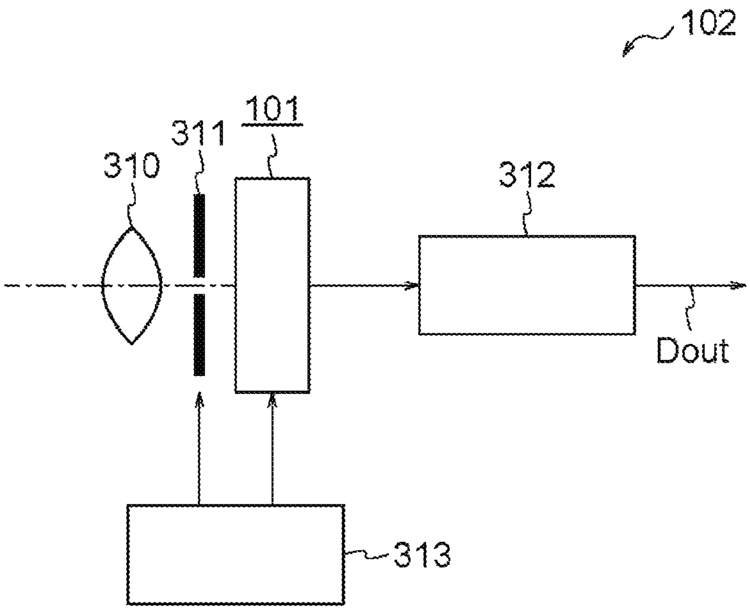
FIG. 21 is a functional block diagram of an example of an electronic device to which the present technology has been applied.

Specific use examples of the solid-state imaging elements according to the first to sixth embodiments of the present technology will be next described. For example, the solid-state imaging element 101 described above is applicable to any types of electronic device having an imaging function, such as a camera system including a digital still camera and a video camera, and a cellular phone having an imaging function. FIG. 21 depicts a schematic configuration of an electronic device 102 (camera) as an example of the solid-state imaging element. The electronic device 102 is a video camera capable of capturing a still image or a moving image, for example, and includes the solid-state imaging element 101, an optical system (optical lens) 310, a shutter device 311, a drive unit 313 which drives the solid-state imaging element 101 and the shutter device 311, and a signal processing unit 312.

The optical system 310 guides image light (incident light) received from an object toward a pixel unit 101*a* of the solid-state imaging element 101. The optical system 310 may be constituted by a plurality of optical lenses. The shutter device 311 controls a period for applying light to the solid-state imaging element 101, and a light shielding period. The drive unit 313 controls a transfer action of the solid-state imaging element 101 and a shutter action of the shutter device 311. The signal processing unit 312 performs various types of signal processing for signals output from the solid-state imaging element 101. An image signal Dout subjected to signal processing is stored in a storage medium such as a memory, or output to a monitor or the like.

Note that embodiments of the present technology are not limited to the embodiments described above. Various modifications may be made without departing from the scope of the present technology.

Moreover, advantageous effects to be produced are not limited to the advantageous effects described in the present description only by way of example. Other advantageous effects may be produced.

Furthermore, the present technology may have following configurations.

[1]

A solid-state imaging element at least including:

a first electrode;

a second electrode;

a third electrode;

a first photoelectric conversion unit;

a second photoelectric conversion unit;

a first insulation layer;

a second insulation layer; and an optical waveguide, in which the second electrode, the first photoelectric conversion unit, and the first electrode are disposed in this order, the third electrode is provided away from the first electrode, and faces the first photoelectric conversion unit through the first insulation layer, the second insulation layer is provided between the third electrode and the second photoelectric conversion unit, and the optical waveguide is provided between the third electrode and the second photoelectric conversion unit.

[2]

The solid-state imaging element according to [1], further including:

at least one semiconductor layer, in which the at least one semiconductor layer is provided between the first photoelectric conversion unit and the first insulation layer.

[3]

The solid-state imaging element according to [1] or [2], in which the optical waveguide and the second insulation layer are separated from each other in a substantially perpendicular direction.

[4]

The solid-state imaging element according to any one of [1] to [3], further including:

a low dielectric constant material containing layer, in which the low dielectric constant material containing layer is disposed below the optical waveguide and above the second photoelectric conversion unit.

[5]

The solid-state imaging element according to any one of [1] to [4], further including:

an inner lens, in which the inner lens is disposed between the first photoelectric conversion unit and the optical waveguide.

[6]

The solid-state imaging element according to any one of [1] to [5], in which a refractive index of the optical waveguide is larger than a refractive index of the second insulation layer.

[7]

The solid-state imaging element according to any one of [1] to [6], in which the optical waveguide includes SiN.

[8]

The solid-state imaging element according to any one of [1] to [6], in which the optical waveguide includes siloxane.

[9]

The solid-state imaging element according to any one of [1] to [6], in which the optical waveguide includes ITO.

[10]

The solid-state imaging element according to any one of [1] to [9], further including:

at least one wire that connects to the third electrode, in which the at least one wire includes a transparent material, and the at least one wire and the optical waveguide are disposed in this order from a light entrance side.

[11]

The solid-state imaging element according to any one of [1] to [9], further including:

at least one wire that connects to the third electrode, in which the at least one wire includes a light shielding material, and the at least one wire and the optical waveguide are separated from each other with the second insulation layer interposed between the at least one wire and the optical waveguide.

[12]

The solid-state imaging element according to any one of [1] to [11], further including:

at least one pedestal connected to the first electrode and provided between the first electrode and the second photoelectric conversion unit; and a via that connects the first electrode and the at least one pedestal, a first distance between a center of the second photoelectric conversion unit and a center of the via at a center of an angle of view being different from a second distance between the center of the second photoelectric conversion unit and the center of the via at an end of the angle of view, the solid-state imaging element, further including:

at least one wire connected to the third electrode and provided between the third electrode and the second photoelectric conversion unit; and a contact hole that connects the third electrode and the at least one wire, a third distance between the center of the second photoelectric conversion unit and a center of the contact hole at the center of the angle of view being different from a fourth distance between the center of the second photoelectric conversion unit and the center of the contact hole at the end of the angle of view.

[13]

An electronic device including:

a solid-state imaging element, in which the solid-state imaging element at least includes a first electrode, a second electrode, a third electrode, a first photoelectric conversion unit, a second photoelectric conversion unit, a first insulation layer, a second insulation layer, and an optical waveguide, the second electrode, the first photoelectric conversion unit, and the first electrode are disposed in this order, the third electrode is provided away from the first electrode, and faces the first photoelectric conversion unit through the first insulation layer, the second insulation layer is provided between the third electrode and the second photoelectric conversion unit, and the optical waveguide is provided between the third electrode and the second photoelectric conversion unit.

[14]

An electronic device including:

the solid-state imaging element according to any one of [2] to [12].

REFERENCE SIGNS LIST

1000 (1000-1 to 1000-17) . . . Solid-state imaging element, 1 . . . Second electrode, 6 . . . First insulation layer, 7 . . . Second insulation layer, 8 . . . First electrode, 9 . . . Third electrode, 100 . . . First photoelectric conversion unit, 200 . . . Second photoelectric conversion unit, 400 . . . Optical waveguide

The invention claimed is:

1. A solid-state imaging element, comprising:

a first electrode;

a second electrode;

a third electrode;

a first photoelectric conversion unit;

a second photoelectric conversion unit;

a first insulation layer;

a second insulation layer; and an optical waveguide, wherein the first photoelectric conversion unit is between the first electrode and the second electrode, the third electrode is spaced apart from the first electrode, the third electrode faces the first photoelectric conversion unit through the first insulation layer, the first photoelectric conversion unit, the first insulation layer, and the third electrode are configured to form a capacitor for accumulation of charges of the first photoelectric conversion unit, the second insulation layer is between the third electrode and the second photoelectric conversion unit, and the optical waveguide is between the third electrode and the second photoelectric conversion unit.

2. The solid-state imaging element according to claim 1, further comprising at least one semiconductor layer, wherein the at least one semiconductor layer is between the first photoelectric conversion unit and the first insulation layer.

3. The solid-state imaging element according to claim 1, wherein the optical waveguide is separated from the second insulation layer in a substantially perpendicular direction.

4. The solid-state imaging element according to claim 1, further comprising a low dielectric constant material containing layer, wherein the low dielectric constant material containing layer is between the optical waveguide and the second photoelectric conversion unit, and a refractive index of the low dielectric constant material containing layer is larger than a refractive index of the second insulation layer.

5. The solid-state imaging element according to claim 4, wherein the low dielectric constant material containing layer includes a SiOC film or a SiOCH film.

6. The solid-state imaging element according to claim 1, further comprising an inner lens, wherein the inner lens is between the first photoelectric conversion unit and the optical waveguide.

7. The solid-state imaging element according to claim 1, wherein a refractive index of the optical waveguide is larger than a refractive index of the second insulation layer.

8. The solid-state imaging element according to claim 1, wherein the optical waveguide further includes silicon nitride (SiN).

9. The solid-state imaging element according to claim 1, wherein the optical waveguide further includes siloxane.

10. The solid-state imaging element according to claim 1, wherein the optical waveguide further includes indium tin oxide (ITO).

11. The solid-state imaging element according to claim 1, further comprising at least one wire, wherein the at least one wire is connected to the third electrode, the at least one wire includes a transparent material, and the at least one wire is positioned above the optical waveguide with respect to a light entrance side.

12. The solid-state imaging element according to claim 1, further comprising at least one wire, wherein the at least one wire is connected to the third electrode, the at least one wire includes a light shielding material, the at least one wire is separated from the optical waveguide, and the second insulation layer is interposed between the at least one wire and the optical waveguide.

13. The solid-state imaging element according to claim 1, further comprising:

at least one pedestal connected to the first electrode, wherein the at least one pedestal is between the first electrode and the second photoelectric conversion unit;

a via that connects the first electrode and the at least one pedestal, wherein a first distance between a center of the second photoelectric conversion unit and a center of the via at a center of an angle of view is different from a second distance between the center of the second photoelectric conversion unit and the center of the via at an end of the angle of view;

at least one wire connected to the third electrode, wherein the at least one wire is between the third electrode and the second photoelectric conversion unit; and a contact hole that connects the third electrode and the at least one wire, wherein a third distance between the center of the second photoelectric conversion unit and a center of the contact hole at the center of the angle of view is different from a fourth distance between the center of the second photoelectric conversion unit and the center of the contact hole at the end of the angle of view.

14. An electronic device, comprising:

a solid-state imaging element, wherein the solid-state imaging element includes:

a first electrode;

a second electrode;

a third electrode;

a first photoelectric conversion unit;

a second photoelectric conversion unit;

a first insulation layer;

a second insulation layer; and an optical waveguide, wherein the first photoelectric conversion unit is between the first electrode and the second electrode, the third electrode is spaced apart from the first electrode, the third electrode faces the first photoelectric conversion unit through the first insulation layer, the first photoelectric conversion unit, the first insulation layer, and the third electrode are configured to form a capacitor for accumulation of charges of the first photoelectric conversion unit, the second insulation layer is between the third electrode and the second photoelectric conversion unit, and the optical waveguide is between the third electrode and the second photoelectric conversion unit.

* * * * *